(12) United States Patent
Toguchi et al.

(10) Patent No.: US 6,746,784 B2
(45) Date of Patent: Jun. 8, 2004

(54) ORGANIC ELECTROLUMINESCENT DEVICE

(75) Inventors: Satoru Toguchi, Tokyo (JP); Hitoshi Ishikawa, Tokyo (JP); Hiroshi Tada, Tokyo (JP); Atsushi Oda, Tokyo (JP)

(73) Assignee: Samsung Electronics Co., Ltd., Suwon (KR)

( * ) Notice: Subject to any disclaimer, the term of this patent is extended or adjusted under 35 U.S.C. 154(b) by 177 days.

(21) Appl. No.: 09/985,657

(22) Filed: Nov. 5, 2001

(65) Prior Publication Data

US 2002/0058156 A1 May 16, 2002

(30) Foreign Application Priority Data

Nov. 7, 2000 (JP) .................... 2000-339603
Nov. 7, 2000 (JP) .................... 2000-339604
Nov. 7, 2000 (JP) .................... 2000-339605

(51) Int. Cl.[7] ............ B32B 19/00; B32B 9/00; H01J 1/62; H01J 63/04; C09K 11/06
(52) U.S. Cl. ............ 428/690; 428/917; 313/504; 313/503; 252/301.16; 548/108
(58) Field of Search ............ 428/690, 917; 313/503, 504; 252/301.16; 548/108

(56) References Cited

U.S. PATENT DOCUMENTS 5,935,721 A * 8/1999 Shi et al. .................... 428/690
6,361,886 B2 * 3/2002 Shi et al. .................... 428/690

FOREIGN PATENT DOCUMENTS

| JP | 3-200889 | 9/1991 |
| JP | 7-138561 | 5/1995 |
| JP | 8-20771 | 1/1996 |
| JP | 8-40995 | 2/1996 |
| JP | 8-40997 | 2/1996 |
| JP | 8-53397 | 2/1996 |
| JP | 8-87122 | 4/1996 |

OTHER PUBLICATIONS

C.W. Tang and S.A. VanSlyke, "Organic electroluminescent diodes", Appl. Phys. Lett. 51 (12), Sep. 21, 1987, 0003–6951/87/380913–03$01.00, 1987 American Institute of Physics; pp. 913–915.

* cited by examiner

*Primary Examiner*—Cynthia H. Kelly
*Assistant Examiner*—Camie S Thompson
(74) *Attorney, Agent, or Firm*—McGuireWoods LLP

(57) ABSTRACT

An organic electroluminescent device comprising one or more organic thin film layers, at least one of the organic thin film layers containing a compound having a cyclohexylidenemethine group. This device has improved light-emitting properties such as luminance and luminous efficiencies, and no limitations on film deposition method in fabrication processes.

19 Claims, 1 Drawing Sheet

ORGANIC ELECTROLUMINESCENT DEVICE

BACKGROUND OF THE INVENTION

The present invention relates to an organic electroluminescent device having an excellent light-emitting property such as high luminance efficiency.

An organic electroluminescent device (which will hereinafter be called "organic EL device") is a light-emitting device which makes use of the principle that when an electric field is applied, a fluorescent material emits light in response to the charge recombination of holes injected from an anode and electrons injected from a cathode. After C. W. Tang et al. of Eastman Kodak Company reported a low-voltage-driven organic EL device using a double layered structure (C. W. Tang, S. A. Vanslyke, Applied Physics Letters, Vol. 51, 913 (1987) and the like), studies on an organic EL device and materials have been briskly carried out. Tang et al. reported a multi-layered organic EL device using tris (8-hydroxyquinolinol aluminum) in a light-emitting layer and a triphenyldiamine derivative in a hole-transporting layer. This stacked structure gives such advantages as an improvement in the injection efficiency of holes into the light-emitting layer; blocking of electrons injected from a cathode; and confinement of the excitons into the light-emitting layer.

A double layered structure composed of a hole-injecting and transporting layer and an electron-transporting and light-emitting layer or a triple layered structure composed of a hole-injecting and transporting layer, a light-emitting layer and an electron-injecting and transporting layer is well known as an organic EL device. In order to increase the recombination efficiency of injected holes and electrons, various improvements in the device structure or fabrication process have been introduced to such multi-layered devices.

As a hole transporting material, triphenyl amine derivatives and aromatic diamine derivatives such as 4',4',4"-tris(3-methylphenylphenylamino)-triphenyl amine which is a star burst molecule and N,N'-diphenyl-N,N'-bis(3-methylphenyl)-[1,1'-biphenyl]-4,4'-diamine are well known (for example, Patent Publications JP-A-8-20771, JP-A-8-40995, JP-A-8-40997, JP-A-8-53397, and JP-A-8-87122). As an electron transporting material, oxadiazole derivatives, triazole derivatives and the like are well known.

Chelate complexes such as tris(8-quinolinolate)aluminum complex, coumarin derivatives, tetraphenylbutadiene derivatives, bisstyrylarylene derivatives, oxadiazole derivatives and the like are known as light emitting materials. Since various color lights in a visible region from blue to red are obtained from these light emitting materials, there is increased expectation for industrialization of a full color organic EL device (refer to, e.g., JP-A-8-239655, JP-A-7-138561, and JP-A-3-200889).

Besides, various materials for the electroluminescent devices have been reported. However, in the case of some compounds, we can not use most method for film fabrication due to excessively strong intermolecular interactions. In addition, for such compounds having a strong intermolecular interaction, concentration quenching is observed when they are used as a light emitting material, which has decreased the luminance and luminous efficiency of the device.

Moreover, the materials used for the organic EL devices are required to have good charge transporting injecting properties. In recent days, organic EL devices with high brightness and long lifetime have been disclosed or reported, but any of them are not enough in these properties. It has been, therefore, desired to develop materials having a high performance.

SUMMARY OF THE INVENTION

In view of the above problems, an objective of this invention is to provide an organic EL device with an improved luminance luminous efficiencies and little limitation on to film fabrication method.

Another object of the present invention is to provide an organic electroluminescent device with improved luminance by using a compound having improved charge injecting properties.

The present inventors have repeated experiments to solve above problem, and found that an organic EL device having superior emission properties is obtained by using a compound having at least one substituted or unsubstituted cyclohexylidenemethine group. The compounds have the intermolecular interactions reduced by the steric hindrance of the cyclohexylidenemethine group. Thus, the concentration quenching is decreased when the compounds are used as a light emitting material, and the film comprising the compounds can be fabricated with ordinary method.

Some conventional compounds with aryl amine moety or styryl moety don't have enough hole injection properties because their energy level of their highest occupied molecular orbital (HOMO) is too low. It has been known that some substituents shift the HOMO level slightly, but it is not enough to improve their hole injection properties. Then, there has been no method to shift the HOMO of such compounds to higher without effects on energy gap between HOMO and lowest unoccupied molecular orbital (LUMO), light emitting properties and carrier transpoting properties. The present inventors also found that the cyclohexylidenemethine group shifts the energy level of HOMO of the compounds to higher, which improves the hole injecting properties, without effect on the energy gap between HOMO and LUMO. Thus, the present invention was achieved.

An organic electroluminescent device according to the present invention comprises an anode, a cathode, and one or more organic thin film layers between the said anode and the said cathode, the organic thin film layer(s) including a light-emitting layer, wherein at least one of the organic thin film layers contains one or more compounds having a cyclohexylidenemethine group, either singly or as a mixture.

The present inventors have found that an organic EL device using bis(diarylamino)arylene compound having a cyclohexylidenemethine group has improved light-emitting properties.

An organic electroluminescent device according to a first aspect of the present invention comprises an anode, a cathode, and one or more organic thin film layers placed between said anode and said cathode, the organic thin film layer(s) having a light-emitting layer, wherein at least one of the organic thin film layers contains one or more compounds represented by the following general formula [A], either singly or as a mixture:

[Chemical Formula A]

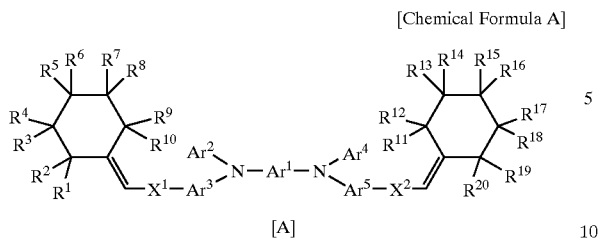

[A]

wherein
- $Ar^1$ represents a substituted or unsubstituted aromatic hydrocarbon group having 5 to 42 carbon atoms, or a substituted or unsubstituted aromatic heterocyclic group having 4 to 42 carbon atoms;
- each of $Ar^2$ to $Ar^5$ independently represents a substituted or unsubstituted aromatic hydrocarbon group having 6 to 20 carbon atoms, or a substituted or unsubstituted aromatic heterocyclic group having 6 to 20 carbon atoms;
- each of $X^1$ and $X^2$ independently represents a divalent linking group; and
- each of $R^1$ to $R^{20}$ independently represents a hydrogen atom, a halogen atom, a substituted or unsubstituted amino group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, or a substituted or unsubstituted alkoxycarbonyl group, provided that two of $R^1$ to $R^1$ or $R^1$ to R may form a ring and that $Ar^2$ and $Ar^3$ or $Ar^4$ and $Ar^5$ may be bonded to each other to form a ring.

In the general formula [A], it is preferable that at least one of the linking groups represented by $X^1$ and $X^2$ is a substituted or unsubstituted styryl group.

An organic electroluminescent device according to a second aspect of the present invention comprises an anode, a cathode, and one or more organic thin film layers placed between said anode and said cathode, the organic thin film layer(s) having a light-emitting layer, wherein at least one of the organic thin film layers contains one or more compounds represented by the following general formula [B], either singly or as a mixture:

[Chemical Formula B]

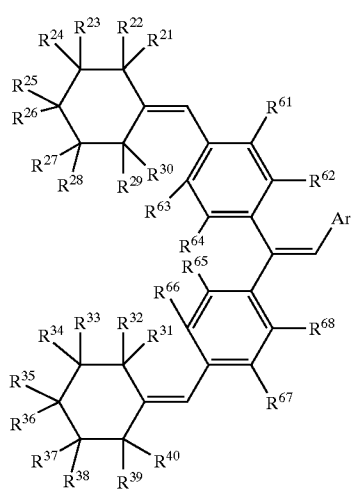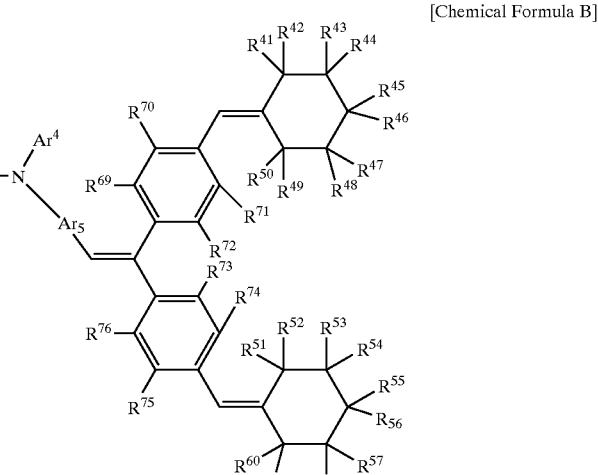

[B]

wherein
- $Ar^1$ represents a substituted or unsubstituted aromatic hydrocarbon group having 5 to 42 carbon atoms, or a substituted or unsubstituted aromatic heterocyclic group having 4 to 42 carbon atoms;
- each of $Ar^2$ to $Ar^5$ independently represents a substituted or unsubstituted aromatic hydrocarbon group having 6 to 20 carbon atoms, or a substituted or unsubstituted aromatic heterocyclic group having 6 to 20 carbon atoms;
- each of $R^{21}$ to $R^{76}$ independently represents a hydrogen atom, a halogen atom, a substituted or unsubstituted amino group, a substituted or unsubstituted alkyl group, a substituted or unsubstituted alkenyl group, a substituted or unsubstituted cycloalkyl group, a substituted or unsubstituted alkoxy group, a substituted orunsubstituted aromatic hydrocarbon group, a substituted or unsubstituted aromatic heterocyclic group, a substituted or unsubstituted aralkyl group, a substituted or unsubstituted aryloxy group, or a substituted or unsubstituted alkoxycarbonyl group, two of $R^{21}$ to $R^{30}$, $R^{31}$ to $R^{40}$, $R^{41}$ to $R^{50}$, $R^{51}$ to $R^{60}$, and $R^{61}$ to $R^{76}$ may form a ring and $Ar^2$ and $Ar\ 3$ or $Ar\ 4$ and $Ar^5$ may be bonded to each other to form a ring.

The present inventors have found that an organic EL device using a compound having two 2,2-bis[4-(cyclohexylidenemethine)phenyl]vinyl groups linked to each other through a linking group has improved light-emittng properties. The diphenyl vinyl group improves the charge injection properties and cyclohexylidenemethine group gives improved charge injection properties. This significantly improves the luminous efficiency.

Therefore, an organic electroluminescent device according to a third aspect of the present invention comprises an anode, a cathode, and one or more organic thin film layers between said anode and said cathode, the organic thin film layer(s) having a light-emitting layer, wherein at least one of the organic thin film layers contains one or more compounds represented by the following general formula [C]; either singly or as a mixture:

each of $R^{117}$ to $R^{132}$ independently represents a hydrogen atom, a halogen atom, a hydroxyl group, a substituted or unsubstituted amino group, nitro group, cyano group, a substituted or unsubstituted alkyl group, a substituted or unsubstituted alkenyl group, a substituted or unsubstituted styryl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, or carboxyl group; any two of $R^{117}$ to $R^{132}$ may form a ring; and $X^3$ represents a divalent linking group.

An organic electroluminescent device according to a fourth aspect of the present invention comprises an anode, a cathode, and one or more organic thin film layers between said anode and said cathode, the organic thin film layer(s) having a light-emitting layer, wherein at least one of the organic thin film layers contains one or more compounds represented by the following general formula [D]; either singly alone or as a mixture:

[Chemical Formula C]

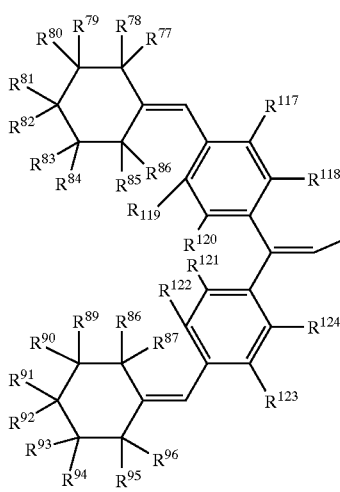
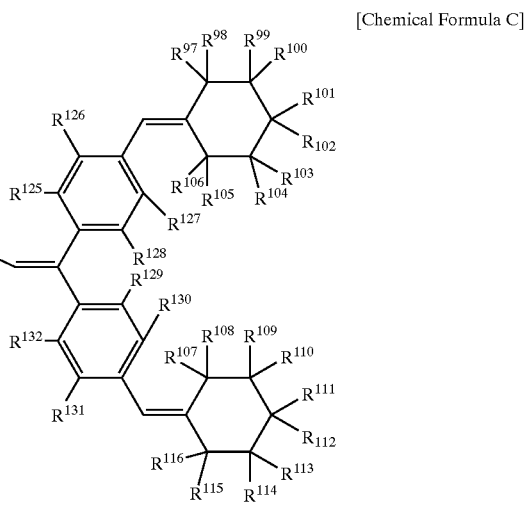

[C]

wherein each of $R^{77}$ to $R^{116}$ independently represents a hydrogen atom, a halogen atom, a substituted or unsubstituted amino group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, or a substituted or unsubstituted alkoxycarbonyl group; any two of $R^{77}$ to $R^{86}$, $R^{87}$ to $R^{96}$, $R^{97}$ to $R^{106}$ and $R^{107}$ to $R^{116}$ may form a ring;

[Chemical Formula D]

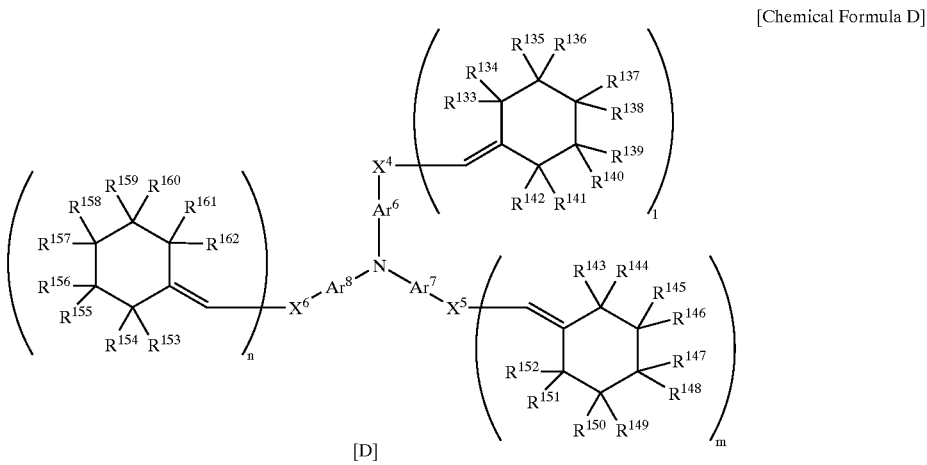

[D]

wherein each of $Ar^6$ to $Ar^8$ independently represents a substituted or unsubstituted aromatic hydrocarbon group having 5 to 42 carbon atoms, or a substituted or unsubstituted aromatic heterocyclic group having 4 to 42 carbon atoms; $Ar^6$ to $Ar^8$ may be bonded to each other to form a ring;

each of $X^4$ and $X^6$ independently represents a divalent linking group;

each of $R^{133}$ to $R^{162}$ independently represents a hydrogen atom, a halogen atom, a substituted or unsubstituted alkyl group, a substituted or unsubstituted alkenyl group, or a substituted or unsubstituted alkoxy group; any two of $R^{133}$ to $R^{142}$, $R^{143}$ to $R^{152}$ and $R^{153}$ to $R^{162}$ may form a ring;

l, m and n are each independently 0 or 1; and l plus m plus n is an integer between 1 and 3, both inclusive.

An organic electroluminescent device according to a fifth aspect of the present invention comprises an anode, a cathode, and one or more organic thin film layers between said anode and said cathode, the organic thin film layer(s) having a light-emitting layer, wherein at least one of the organic thin film layers contains one or more compounds represented by the following general formula [E]; either singly or as a mixture:

[Chemical Formula E]

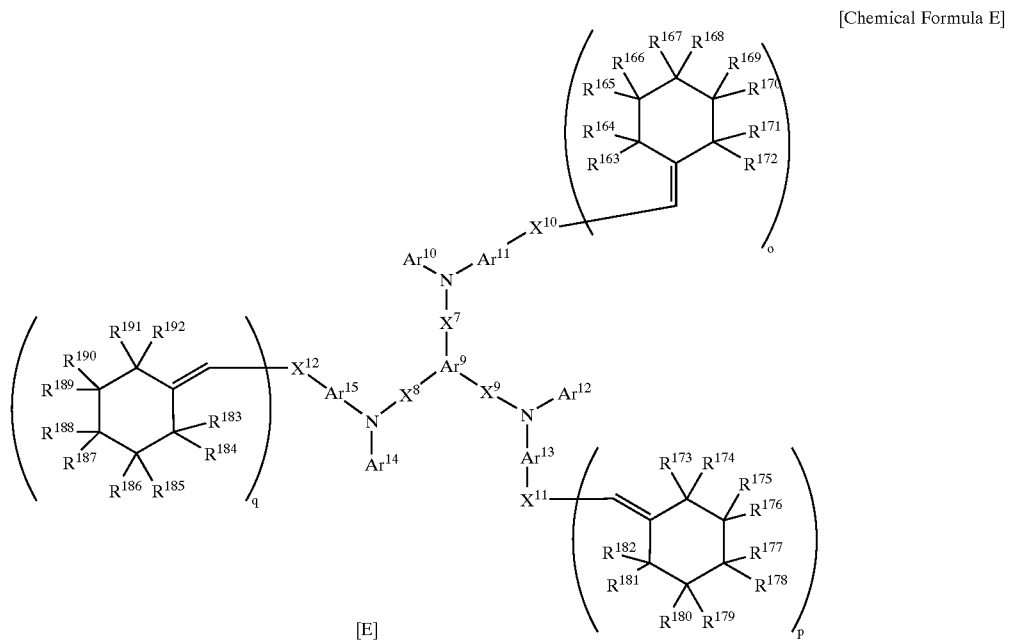

[E]

wherein each of $Ar^9$ to $Ar^{15}$ independently represents a substituted or unsubstituted aromatic hydrocarbon group having 5 to 42 carbon atoms, or a substituted or unsubstituted aromatic heterocyclic group having 4 to 42 carbon atoms; $Ar^{10}$ and $Ar^{11}$, $Ar^{12}$ and $Ar^{13}$, and $Ar^{14}$ and $Ar^{15}$ may be bonded to each other to form a ring;

each of $X^7$ and $X^{12}$ independently represents a divalent linking group;

each of $R^{163}$ to $R^{192}$ independently represents a hydrogen atom, a halogen atom, a substituted or unsubstituted alkyl group, a substituted or unsubstituted alkenyl group, or a substituted or unsubstituted alkoxy group; any two of $R^{163}$ to $R^{172}$, $R^{173}$ to $R^{182}$ and $R^{183}$ to $R^{192}$ may form a ring;

o, p and q are each independently 0 or 1; and o plus p plus q is an integer between 1 and 3, both inclusive.

An organic electroluminescent device according to a sixth aspect of the present invention comprises an anode, a cathode, and one or more organic thin film layers placed between said anode and said cathode, the organic thin film layer(s) having a light-emitting layer, wherein at least one of the organic thin film layers contains one or more compounds represented by the following general formula [F]; either singly or as a mixture:

It has been found that the compounds represented by the compound represented by the general formulae [A] to [F] having a cyclohexylidenemethine group has a good carrier transporting property. It has been also found that an organic EL device prepared by using the compound as a hole- or electron-transporting material, or by using a mixture layer of the above material and another hole- or electron-transporting material, have a higher luminance than a conventional one. The organic electroluminescent device of the present invention thus contains these compounds alone or as a mixture as a light-emitting material and/or an electron transporting material and/or a hole transporting material. More specifically, an organic electroluminescent device according to the present invention may have an electron transporting layer, as one of the organic thin film layers, containing one or more compounds represented by the general formulae [A] to [F] having a cyclohexylidenemethine group. An organic electroluminescent device according to the present invention also may have a hole transporting layer, as one of the orbanic thin film layers, containing one or more compounds repre-

[Chemical Formula F]

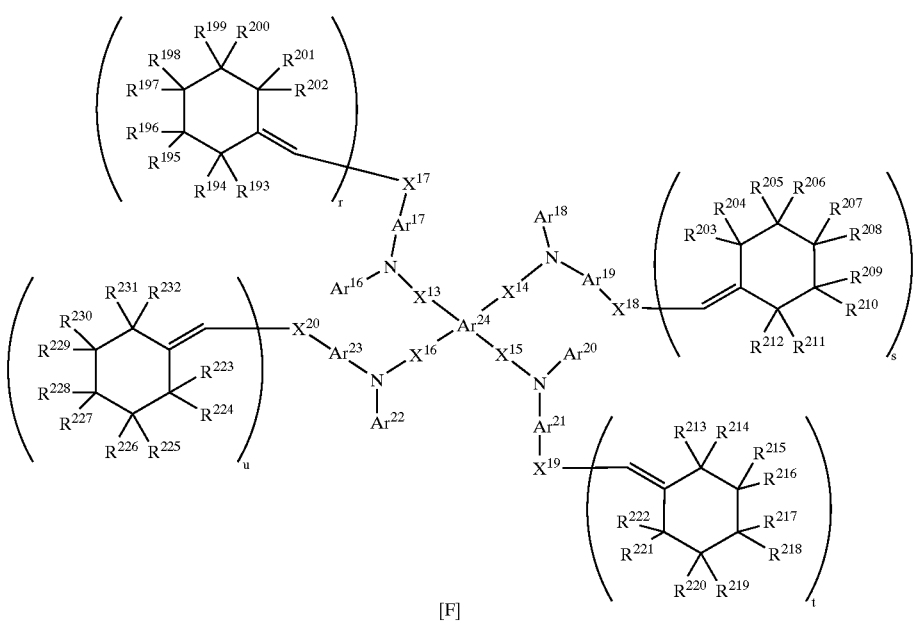

[F]

wherein each of $Ar^{16}$ to $Ar^{24}$ independently represents a substituted or unsubstituted aromatic hydrocarbon group having 5 to 42 carbon atoms, or a substituted or unsubstituted aromatic heterocyclic group having 4 to 42 carbon atoms, provided that $Ar^{16}$ and $Ar^{17}$, $Ar^{18}$ and $Ar^{19}$, $Ar^{20}$ and $Ar^{21}$, and $Ar^{22}$ and $Ar^{23}$ may be bonded to each other to form a ring;

each of $X^{13}$ and $X^{20}$ independently represents a divalent linking group;

each of $R^{193}$ to $R^{232}$ independently represents a hydrogen atom, a halogen atom, a substituted or unsubstituted alkyl group, a substituted or unsubstituted alkenyl group, or a substituted or unsubstituted alkoxy group, provided that two of $R^{193}$ to $R^{202}$, $R^{203}$ to $R^{212}$, $R^{213}$ to $R^{222}$ and $R^{223}$ to $R^{232}$ may form a ring;

r, s, t and u are each independently 0 or 1; and r plus s plus t plus u is an integer between 1 and 4, both inclusive.

sented by the general formulae [A] to [F] having a cyclohexylidenemethine group.

The organic electroluminescent device of the present invention may contain the compound(s) represented by the general formula or the compound(s) having a cyclohexylidenemethine group at least on the terminal thereof in at least one organic thin film layer. The above-mentioned advantages are obtained particularly when the light-emitting layer is adjacent to the anode. An organic EL device of the present invention may have the light-emitting layer adjacent to the anode.

The present inventors have found that an organic EL device using anode which has been exposed to ultraviolet light at a wavelength of lower than 200 nm or oxygen plasma before fabrication of the organic thin film layer(s) in the case of the device having the light-emitting layer adjacent to the anode. Therefore, it is preferable to use such an anode when the light-emitting layer is adjacement to the anode.

It also has been found that an organic EL device with the organic thin film layer adjacent to the cathode containing a metal at the interface with the cathode has much better light emitting properties.

DETAILED DESCRIPTION

Figure 1:
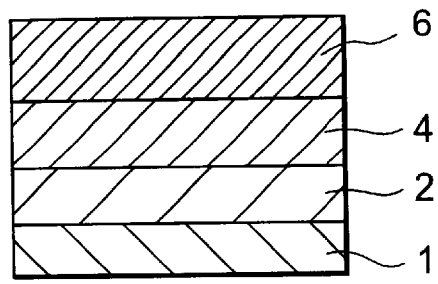
FIG. 1 is a schematic sectional view illustrating one example of an organic electroluminescent device of the present invention.

The present invention will be described in detail below. A compound having at least one cyclohexylidenemethine group, which is one of the compounds of the present invention, is a compound having a substituted or unsubstituted cyclohexylidenemethine group represented by the following general formula [G] as a substituent. The cyclohexy-

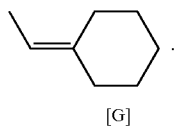
[G]

lidenemethine group may be at any position within the compound.

A compound of the present invention is a compound represented by the following general formula [A]:
[Chemical Formula A]
wherein
Ar$^1$ represents a substituted or unsubstituted aromatic hydrocarbon group having 5 to 42 carbon atoms, or a substituted or unsubstituted aromatic heterocyclic group having 4 to 42 carbon atoms;

each of Ar$^2$ to Ar$^5$ independently represents a substituted or unsubstituted aromatic hydrocarbon group having 6 to 20 carbon atoms, or a substituted or unsubstituted aromatic heterocyclic group having 6 to 20 carbon atoms;

each of X$^1$ and X$^2$ independently represents a divalent linking group; and each of R$^1$ to R$^{20}$ independently represents a hydrogen atom, a halogen atom, a substituted or unsubstituted amino group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, or a substituted or unsubstituted alkoxycarbonyl group, provided that two of R$^1$ to R$^{10}$ or R$^{11}$ to R$^{20}$ may form a ring and that Ar$^2$ and Ar$^3$ or Ar$^4$ and Ar$^5$ may be bonded to each other to form a ring.

Another compound of the present invention is a compound represented by the following general formula [B]:

[Chemical Formula B].

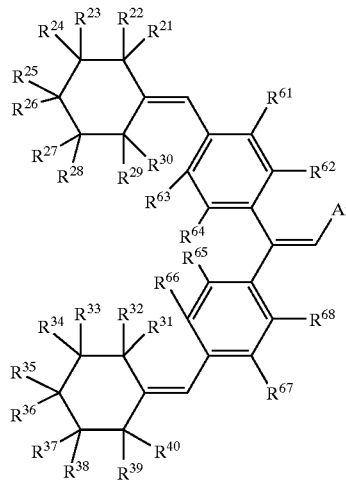
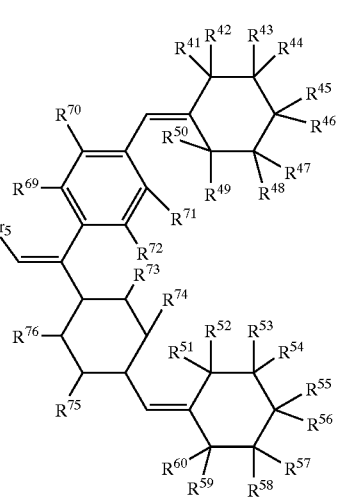
[B]

wherein
Ar$^1$ represents a substituted or unsubstituted aromatic hydrocarbon group having 5 to 42 carbon atoms, or a substituted or unsubstituted aromatic heterocyclic group having 4 to 42 carbon atoms;

each of Ar$^2$ to Ar$^5$ independently represents a substituted or unsubstituted aromatic hydrocarbon group having 6 to 20 carbon atoms, or a substituted or unsubstituted aromatic heterocyclic group having 6 to 20 carbon atoms;

each of R$^{21}$ to R$^{76}$ independently represents a hydrogen atom, a halogen atom, a substituted or unsubstituted amino group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substisubstituted or unsubstituted aralkyl group, a substituted or unsubstituted aryloxy group, or a substituted or unsubstituted alkoxycarbonyl group; two of $R^{21}$ to $R^{30}$, $R^{31}$ to $R^{40}$, $R^{41}$ to $R^{50}$, $R^{51}$ to $R^{60}$, and $R^{61}$ to $R^{76}$ may form a ring; and $Ar^2$ and $Ar^3$ or $Ar^4$ and $Ar^5$ may be bonded to each other to form a ring.

In the above general formulae [A] and [B], $Ar^1$ represents a substituted or unsubstituted aromatic hydrocarbon group having 5 to 42 carbon atoms, or a substituted or unsubstituted aromatic heterocyclic group having 4 to 42 carbon atoms. Examples thereof include a naphthyl group, anthranyl group, perylenylene group, 1,2-benzoperylenylene group, 1,2,7,8-dibenzoperylenylene group, 1,2,11,12-dibenzoperylenylene group, terylenylene group, pentacenylene group, bisanthrenylene group, 10,10 (9,9-bianthryl)ylene group, 4,4'-(1,1'-binaphthyl)ylene group, 4,10'-(1,9'-naphthylanthryl)ylene group, divalent groups represented by —$Ar^6$—$Ar^7$—$Ar^8$ (wherein each of $Ar^6$ to $Ar^8$ independently represents a naphthyl group or anthranyl group), divalent groups obtained by removing two hydrogen atoms from aromatic hydrocarbons or condensed polycyclic hydrocarbons such as phenanthrene, pyrene, biphenyl, and terphenyl, heterocyclic compounds or condensed heterocyclic compounds such as carbazole, pyrrole, thiophene, furan, imidazole, pyrazole, isothiazole, isoxazole, pyridine, pyrazine, pyrimidine, pyridazine, furazan, thianthrene, isobenzofuran, phenoxazine, indolidine, indole, isoindole, 1H-indazole, purine, quinoline, isoquinoline, phthalazine, naphthylidine, quinoxaline, quinazoline, cinnoline, pteridine, carbazole, beta-carbazoline, phenanthridine, acridine, perimidine, phenanthroline, phenazine, phenothiazine, and phenoxazine, and derivatives thereof.

Each of $Ar^2$ to $Ar^5$ independently represents a substituted or unsubstituted aromatic hydrocarbon group having 6 to 20 carbon atoms, or a substituted or unsubstituted aromatic heterocyclic group having 6 to 20 carbon atoms. Examples of the aromatic hydrocarbon group having 6 to 20 carbon atoms include a phenyl group, naphthyl group, anthryl group, phenanthryl group, naphthacenyl group, and pyrenyl group. Examples of the aromatic heterocyclic group having 4 to 20 carbon atoms include a pyrrolyl group, pyrazinyl group, pyridinyl group, indolyl group, isoindolyl group, furyl group, benzofuranyl group, quinolyl group, and phenanthridinyl group.

Examples of the substituent which $Ar^1$ to $Ar^8$ have include a hydrogen atom, a halogen atom, a hydroxyl group, nitro group, cyano group, a substituted or unsubstituted amino group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, and carboxyl group.

In the above general formula [A], $X^1$ and $X^2$ represent a divalent linking group. Examples of the linking group include a single bond and divalent groups obtained by removing one hydrogen atom from a substituted or unsubstituted amino group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, or a substituted or unsubstituted styryl group. In particular, it is preferable that at least one of the linking group represented by $X^1$ and $X^2$ is a substituted or unsubstituted styryl group.

In the above general formula [A], each of $R^1$ to $R^{20}$ and $R^2$ to $R^{76}$ independently represents a hydrogen atom, a halogen atom, a substituted or unsubstituted amino group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, or a substituted or unsubstituted alkoxycarbonyl group; and any two of $R^1$ to $R^{10}$, $R^{11}$ to $R^{20}$, $R^{21}$ to $R^{30}$ $R^{31}$ to $R^{40}$, $R^{41}$ to $R^{50}$, $R^5$ to $R^{60}$, and $R^{61}$ to $R^{76}$ may form a ring.

Examples of the halogen atom include a fluorine atom, a chlorine atom, a bromine atom, and an iodine atom. Examples of the substituted or unsubstituted alkyl group include a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

Examples of the substituted or unsubstituted alkenyl group include a vinyl group, allyl group, 1-butenyl group, 2-butenyl group, 3-butenyl group, 1,3-butanedienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group, and 3-phenyl-1-butenyl group.

Examples of the substituted or unsubstituted cycloalkyl group include a cyclopropyl group, cyclobutyl group, cyclopentyl group, cyclohexyl group, and 4-methylcyclohexyl group.

The substituted or unsubstituted alkoxy group is a group represented by —OY. Examples of Y include a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2- dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

Examples of the substituted or unsubstituted aromatic hydrocarbon group include a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenyly group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, and 4"-t-butyl-p-terphenyl-4-yl group.

Examples of the substituted or unsubstituted aromatic heterocyclic group include a 1-pyrrolyl group, 2-pyrrolyl group, 3-pyrrolyl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, and 4-t-butyl-3-indolyl group.

Examples of the substituted or unsubstituted aralkyl group include a benzyl group, 1-phenylethyl group, 2-phenylethyl group, 1-phenylisopropyl group, 2-phenylisopropyl group, phenyl-t-butyl group, alpha-naphthylmethyl group, 1-alpha-naphthylethyl group, 2-alpha-naphthylethyl group, 1-alpha-naphthylisopropyl group, 2-alpha-naphthylisopropyl group, beta-naphthylmethyl group, 1-beta-naphthylethyl group, 2-beta-naphthylethyl group, 1-beta-naphthylisopropyl group, 2-beta-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro-2-phenylisopropyl group.

The substituted or unsubstituted aryloxy group is represented by —OZ. Examples of Z include a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, and 4-t-butyl-3-indolyl group.

The substituted or unsubstituted alkoxycarbonyl group is represented by —COOY. Examples of Y are as defined above.

Examples of the divalent group that forms a ring include a tetramethylene group, pentamethylene group, hexamethylene group, diphenylmethane-2,2'-diyl group, diphenylethane-3,3'-diyl group, and diphenylpropane-4,4'-diyl group.

The substituted or unsubstituted amino group is represented by —NYY'. Each of Y and Y' independently represents a hydrogen atom, the above-mentioned substituted or unsubstituted alkyl group, the above-mentioned substituted or unsubstituted alkenyl group, a substituted or unsubstituted aralkyl group, a substituted or unsubstituted aromatic hydrocarbon group, or a substituted or unsubstituted aromatic heterocyclic group.

Specific examples of the compounds represented by the general formula [A] and [B] include, but not limited to, the following compounds (1) to (44). Of these, the general formula [B] corresponds to the compounds (4), (5), (9), (13), (17), (21), (25), (29), (33), (37), (41), and (44). The remaining compounds are represented by the general formula [A].

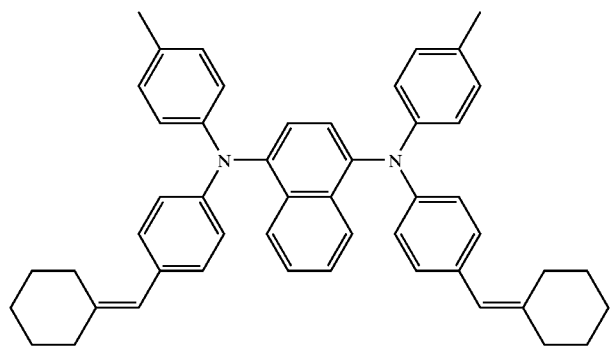
(1)
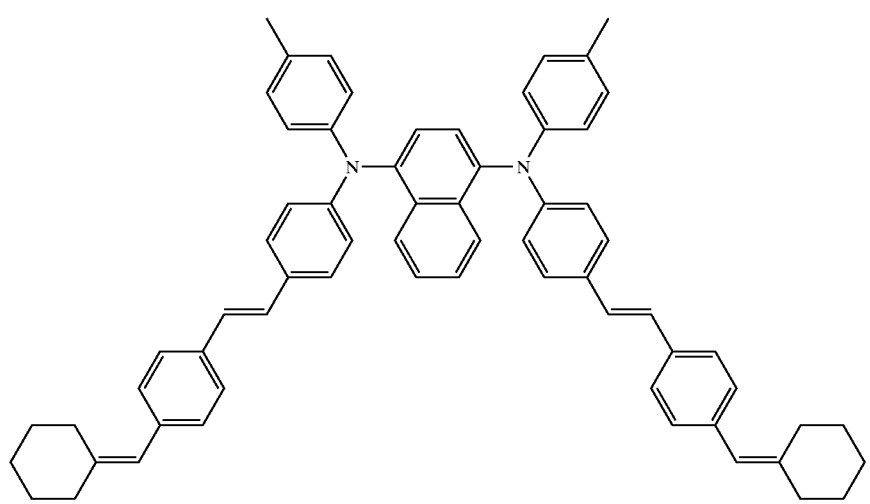
(2)
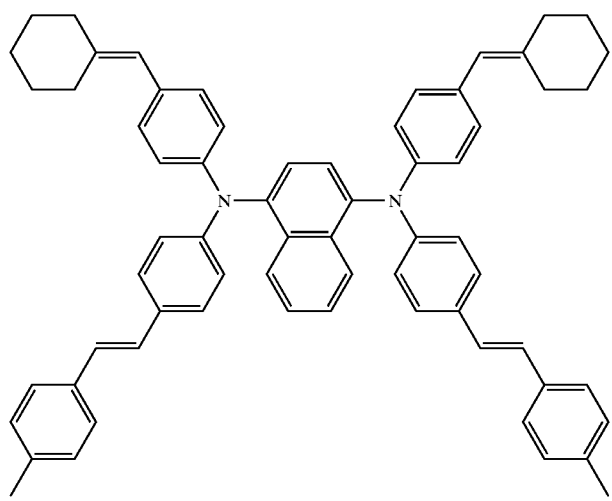
(3)

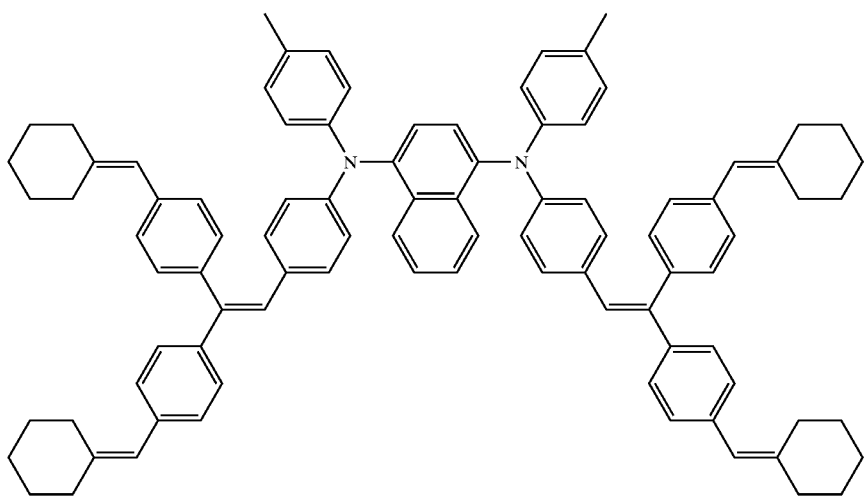
(4)
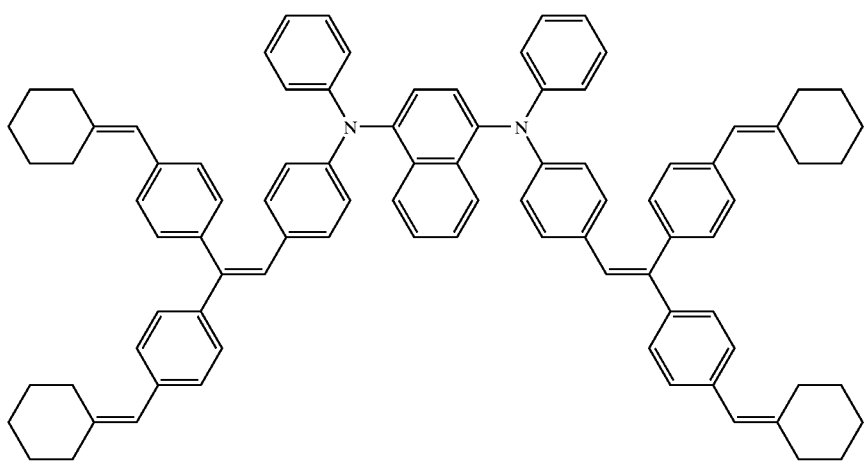
(5)
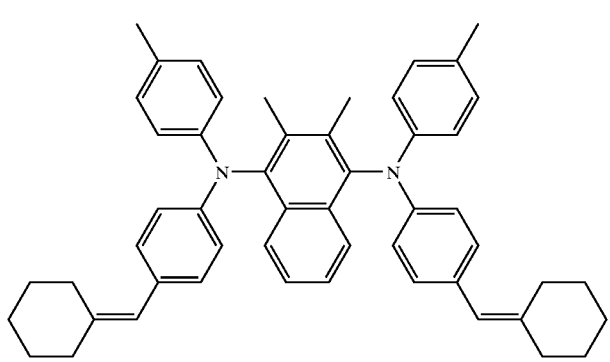
(6)

(7)
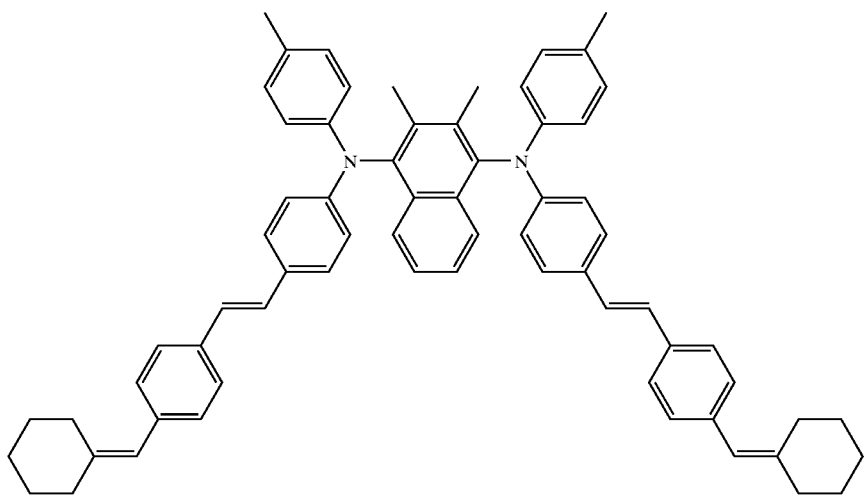
(8)
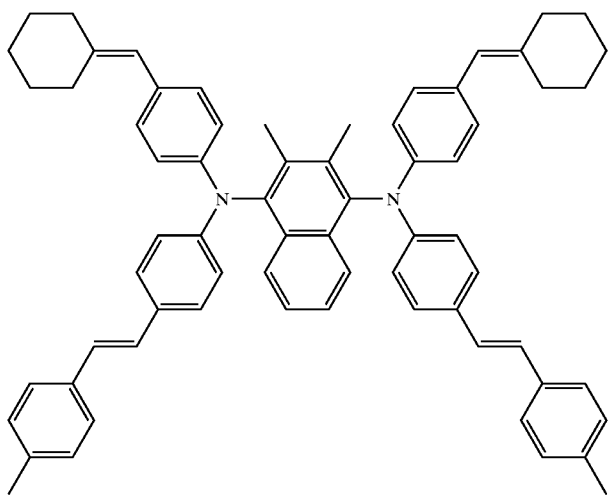
(9)
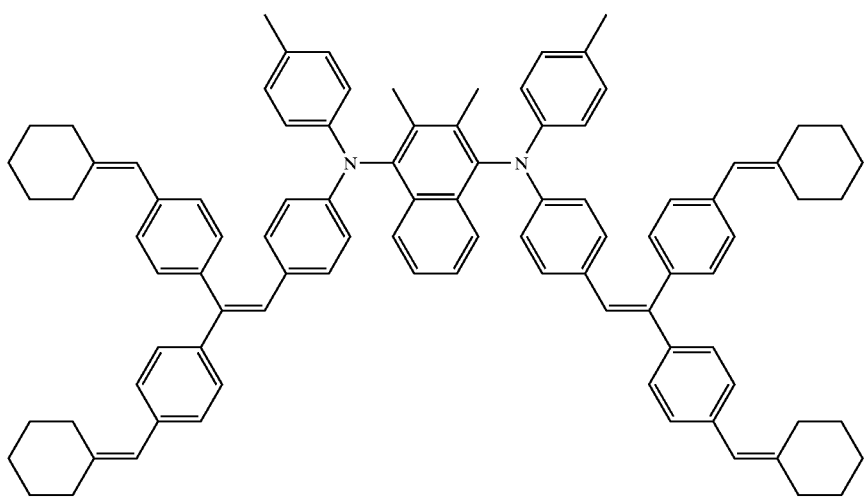

-continued
(10)
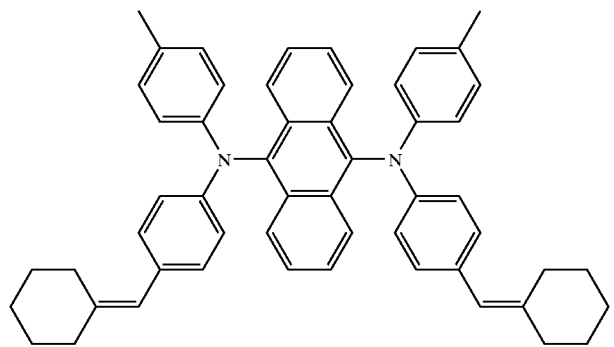
(11)
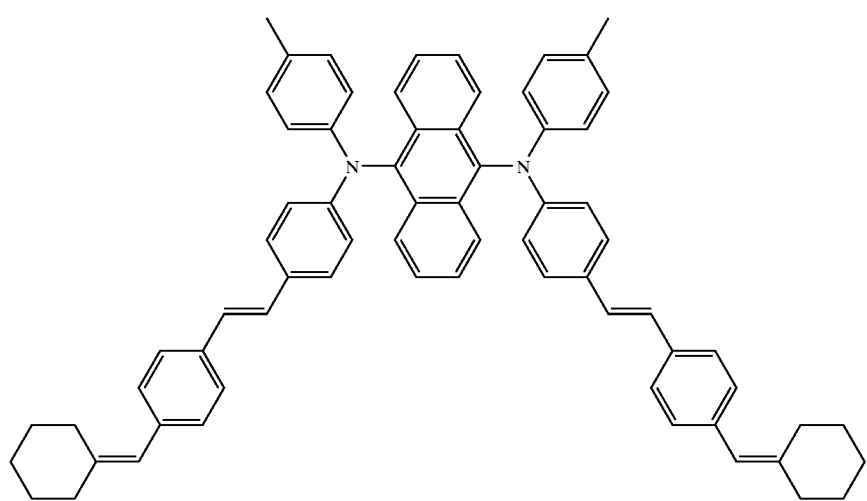
(12)
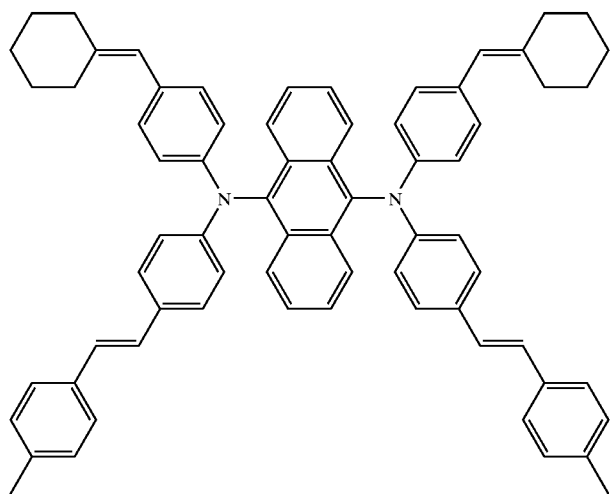

-continued
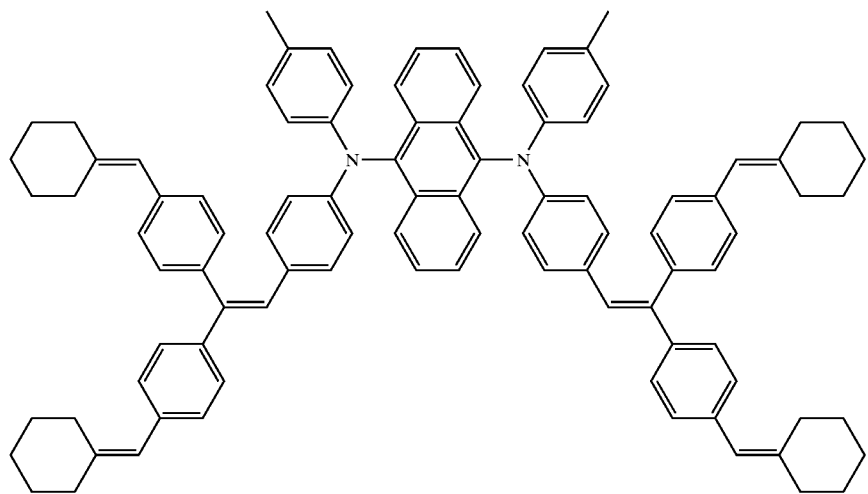
(13)
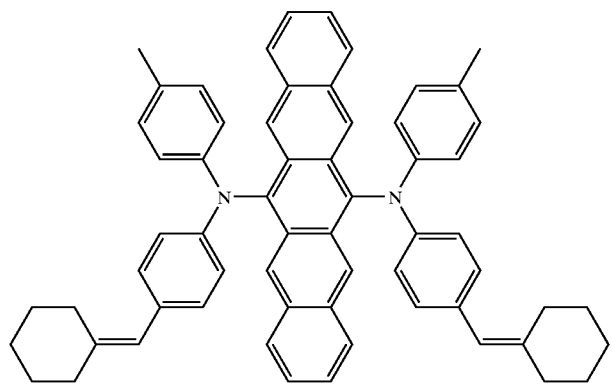
(14)
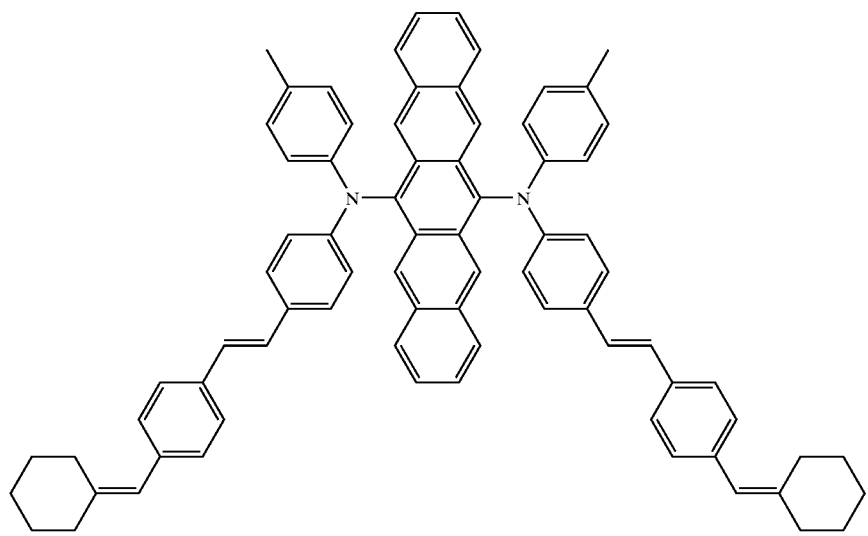
(15)

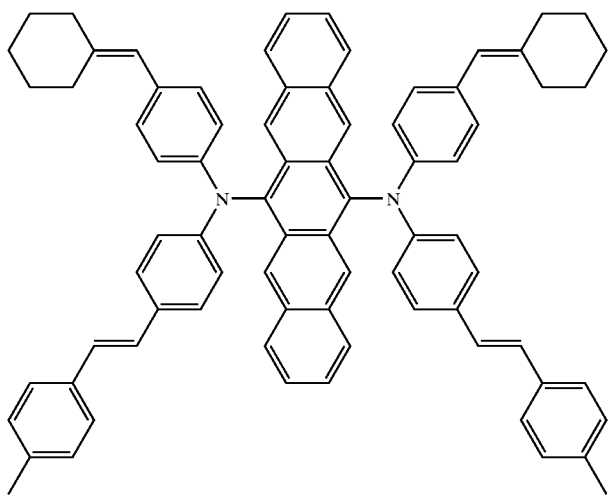
(16)
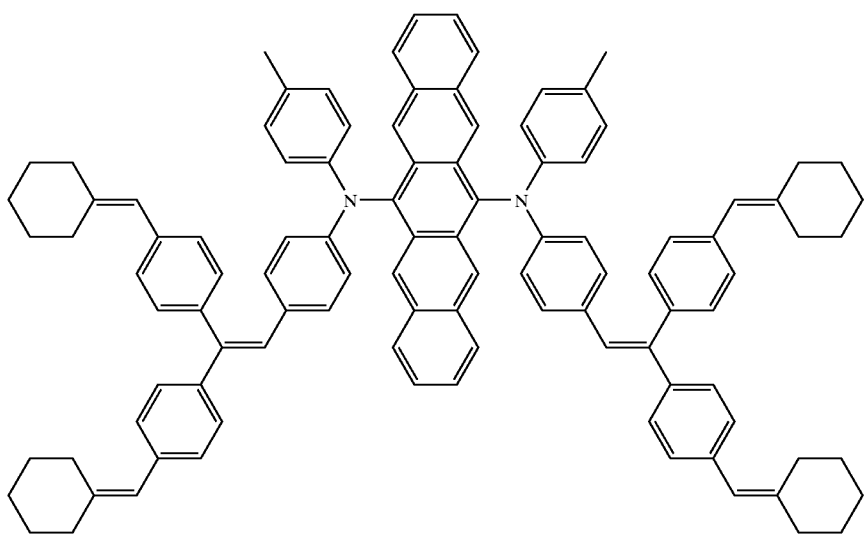
(17)
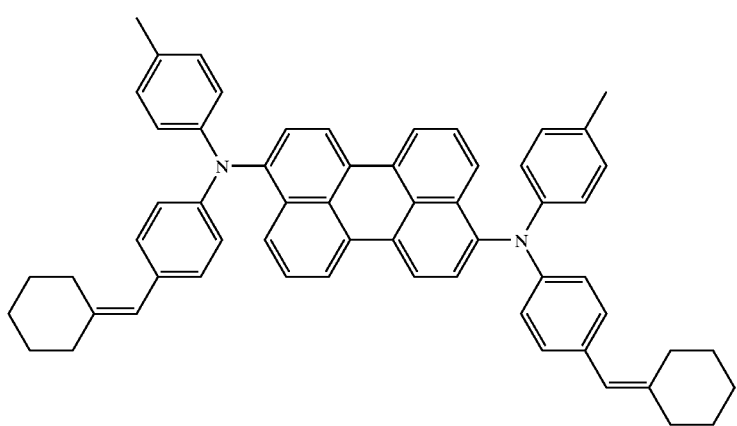
(18)

-continued
(19)
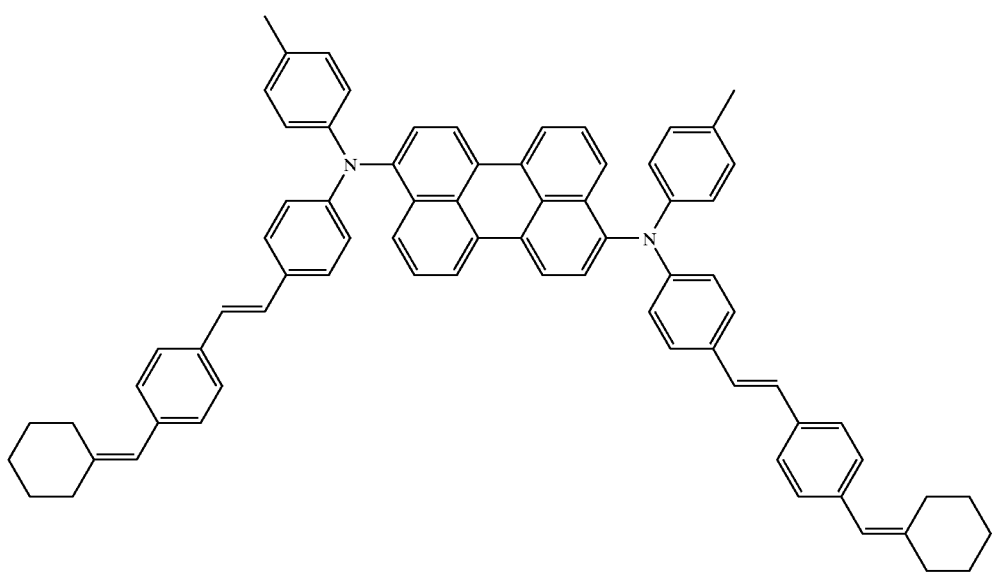
(20)
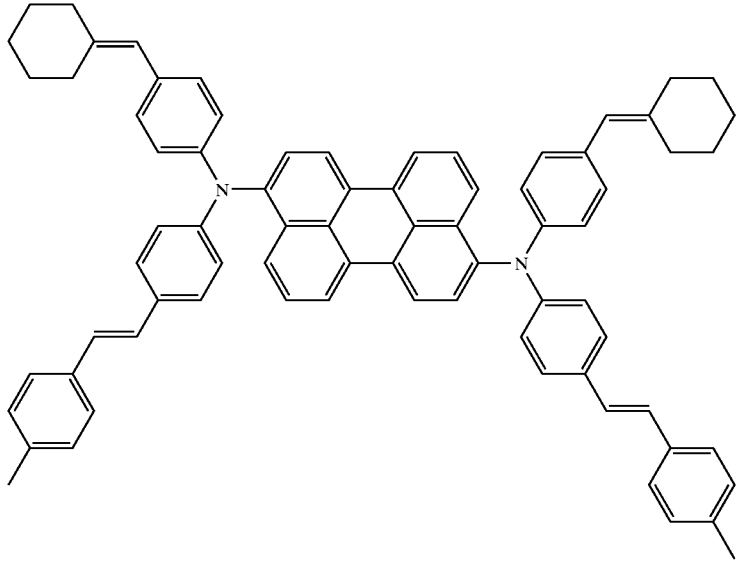
(21)
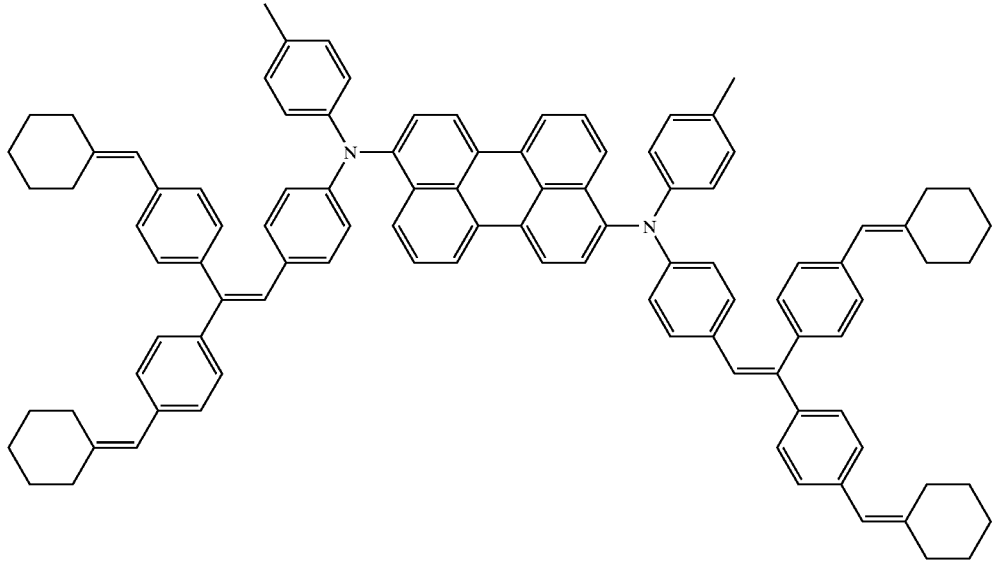

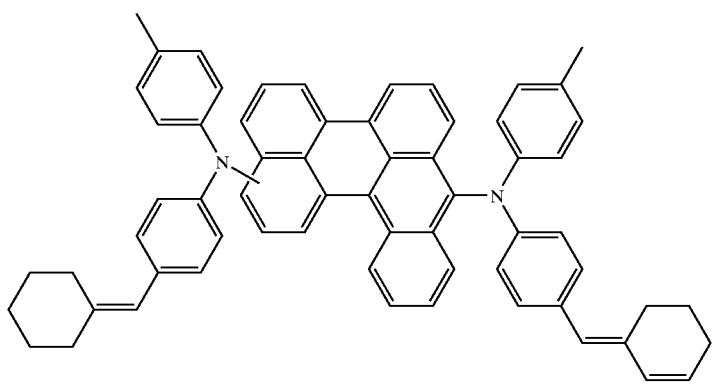
(22)
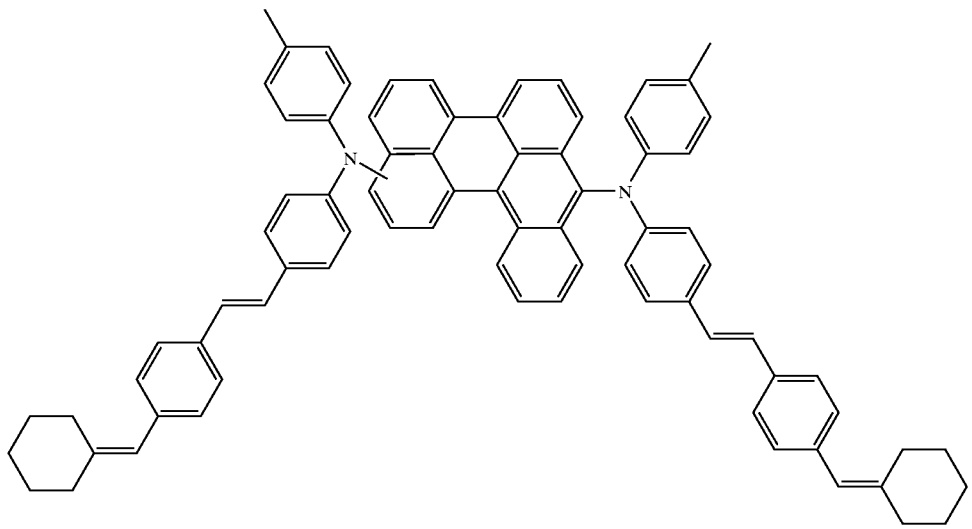
(23)
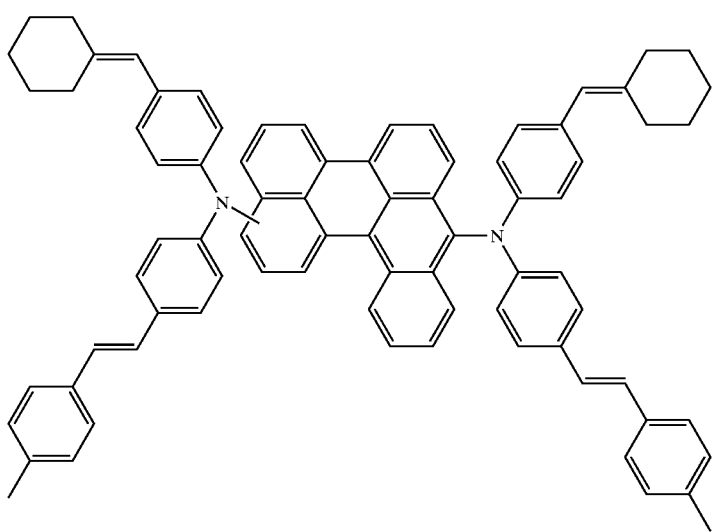
(24)

(25)
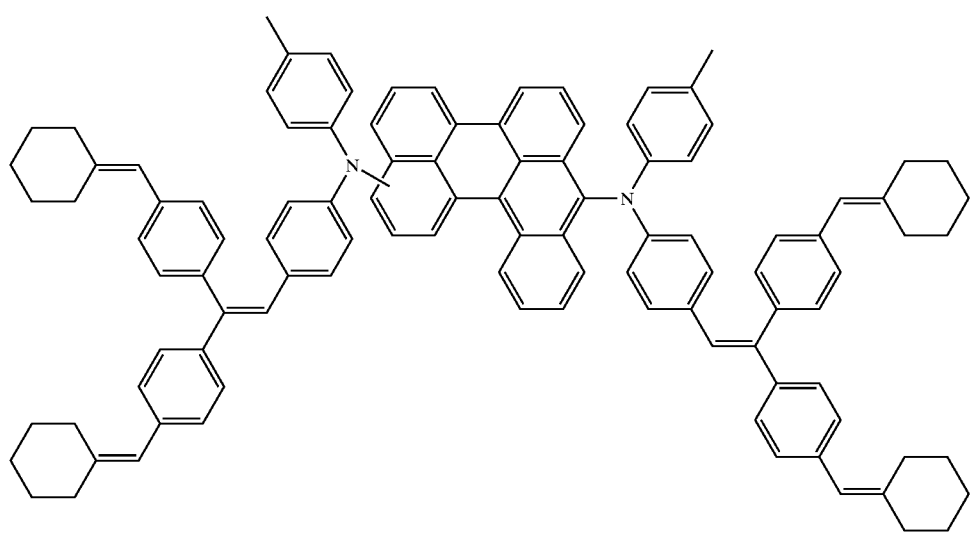
(26)
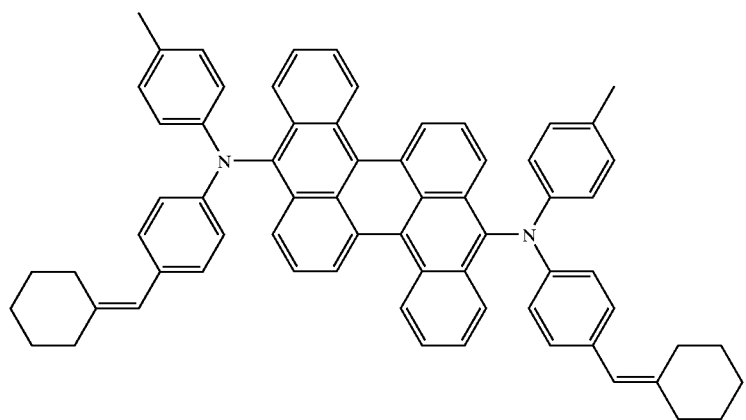
(27)
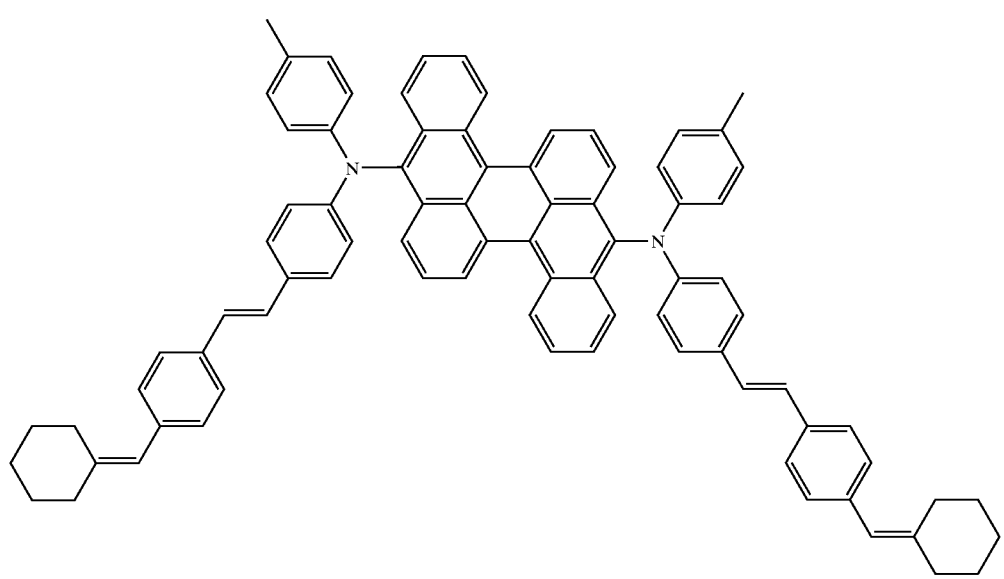

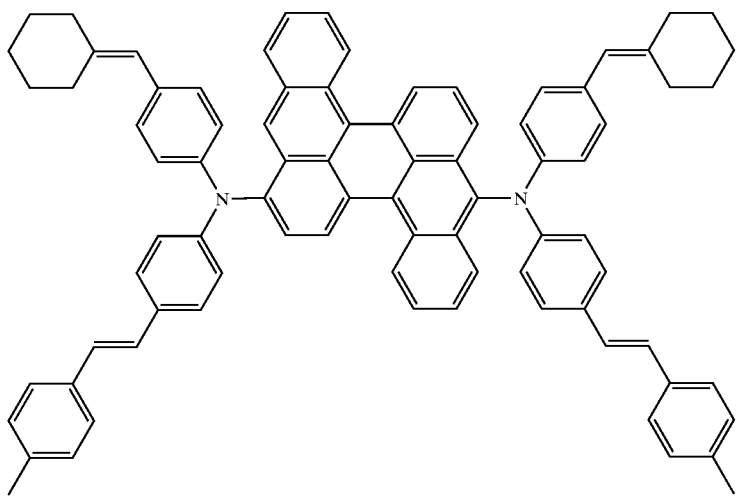
(28)
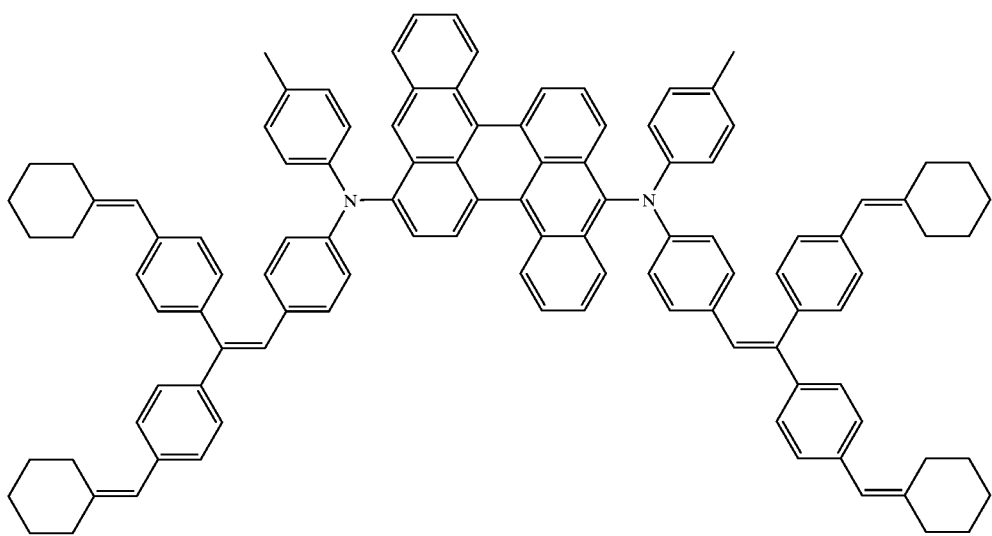
(29)
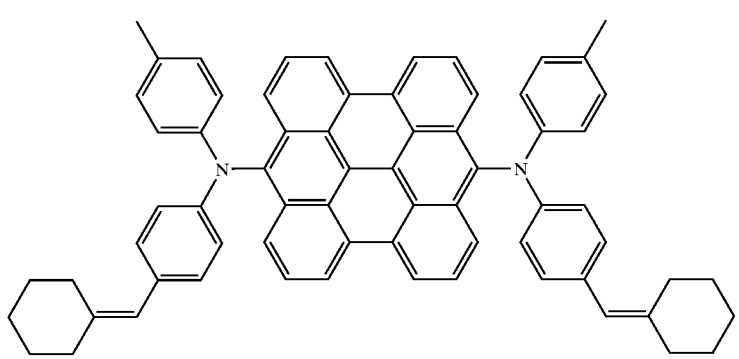
(30)

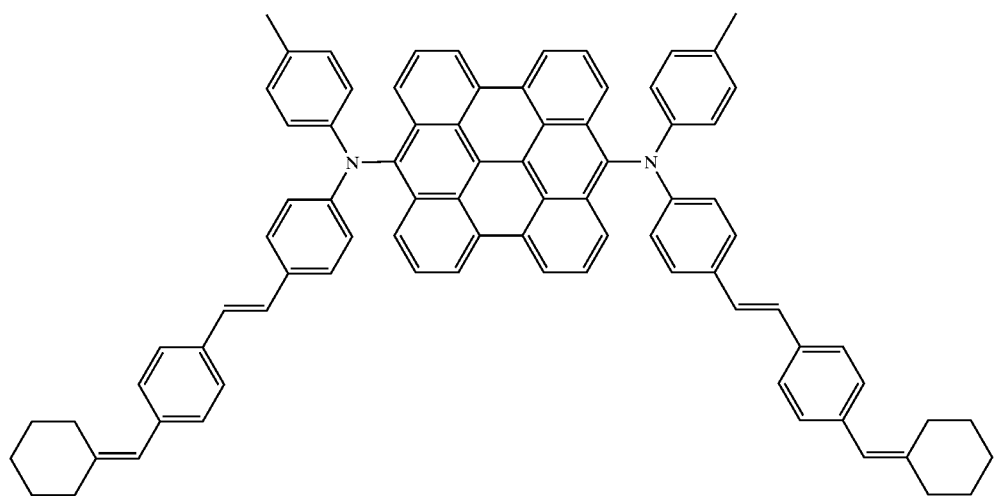
(31)
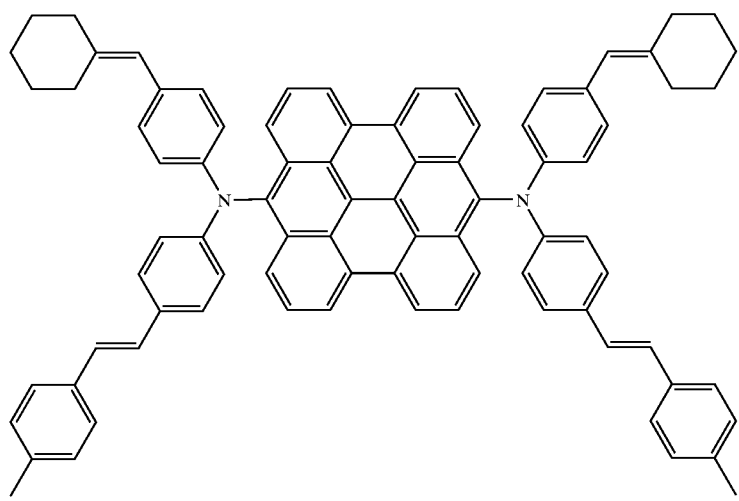
(32)
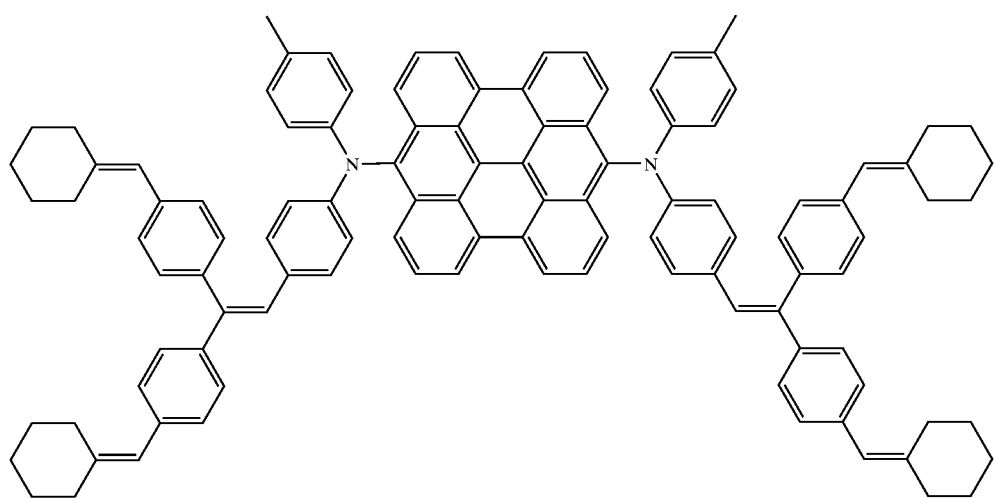
(33)

-continued
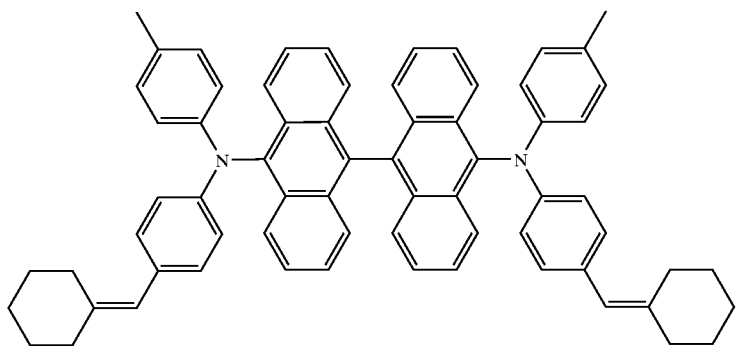
(34)
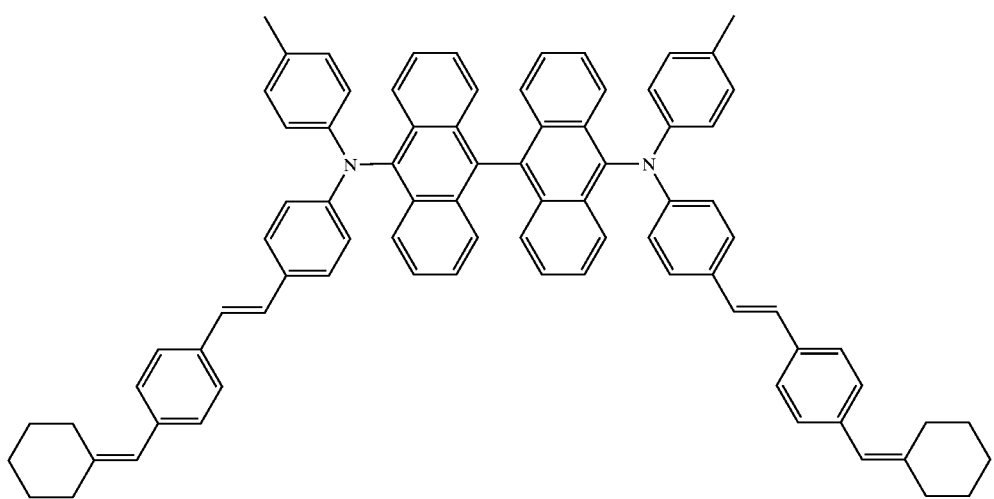
(35)
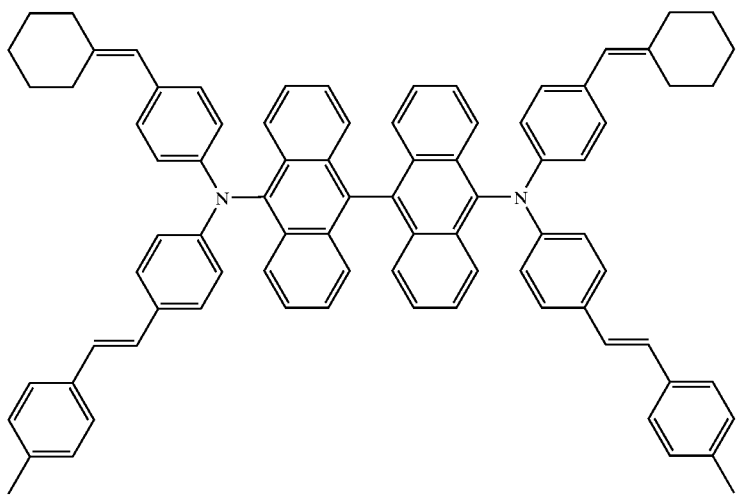
(36)

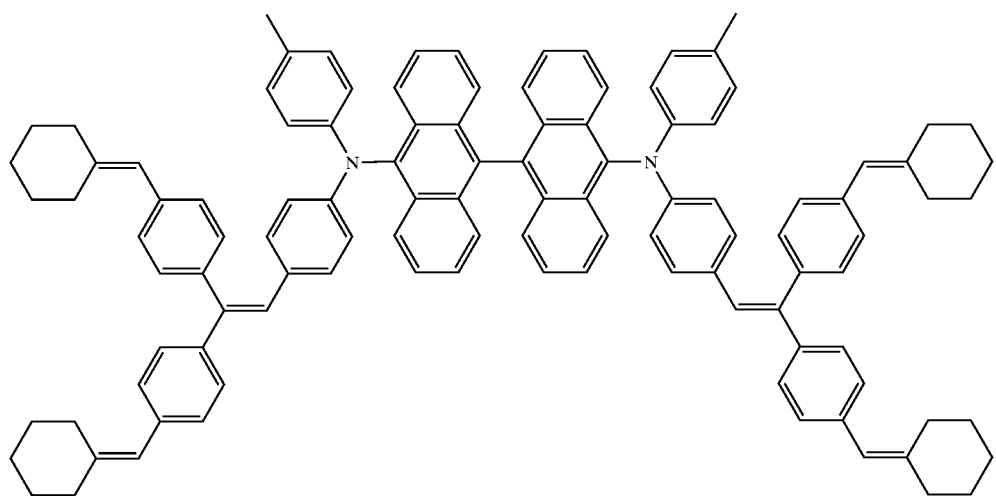
(37)
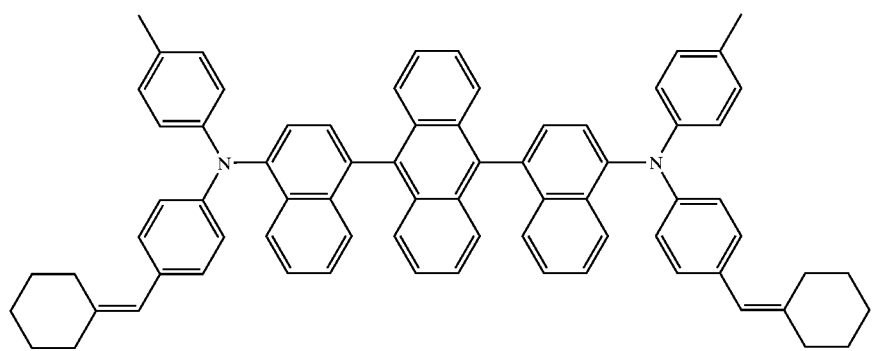
(38)
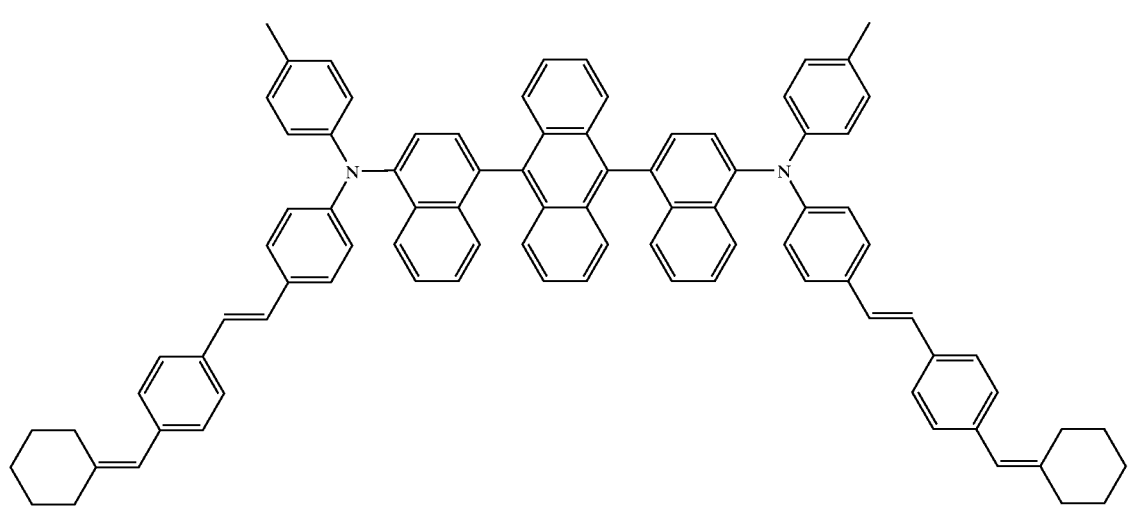
(39)

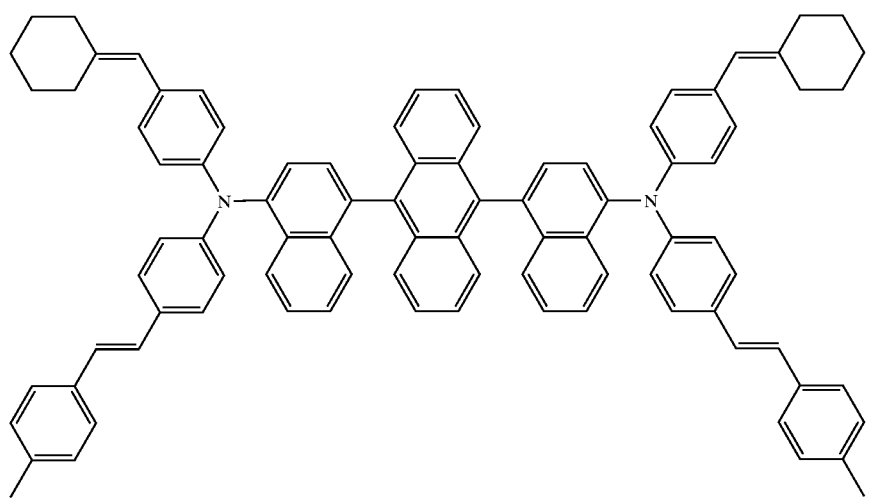
(40)
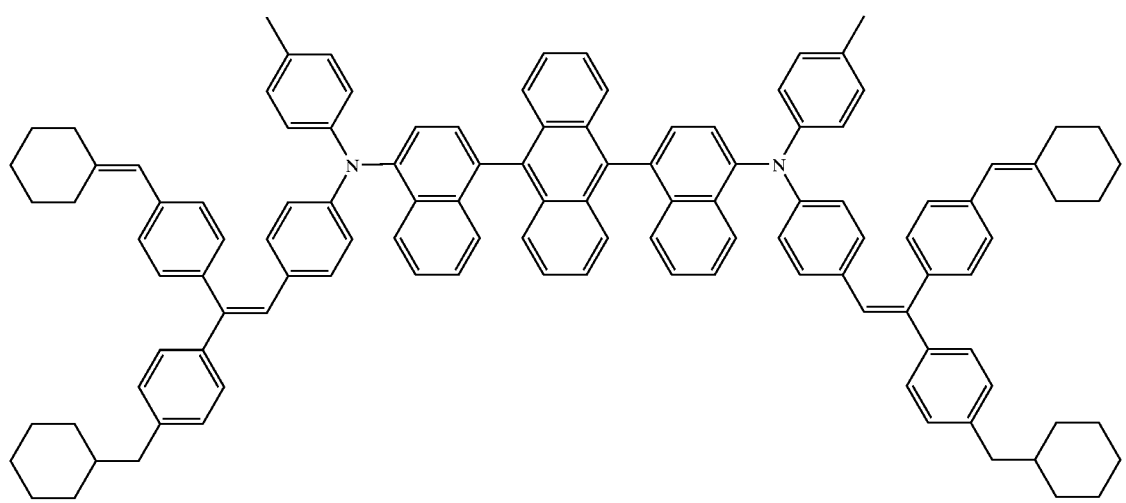
(41)
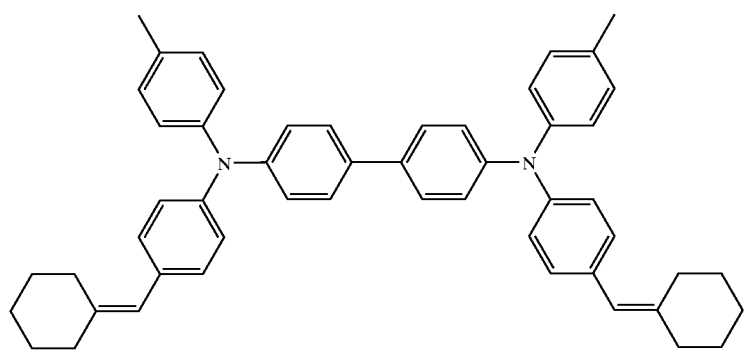
(42)
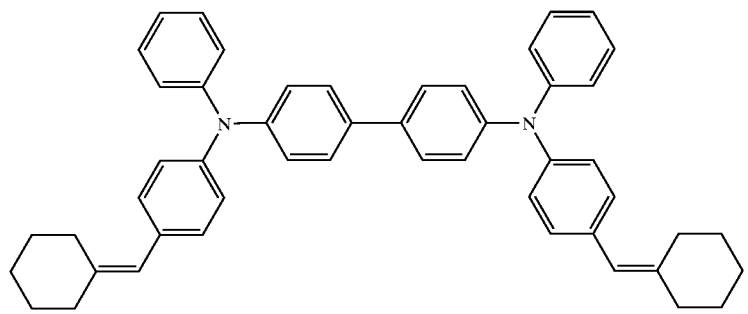
(43)

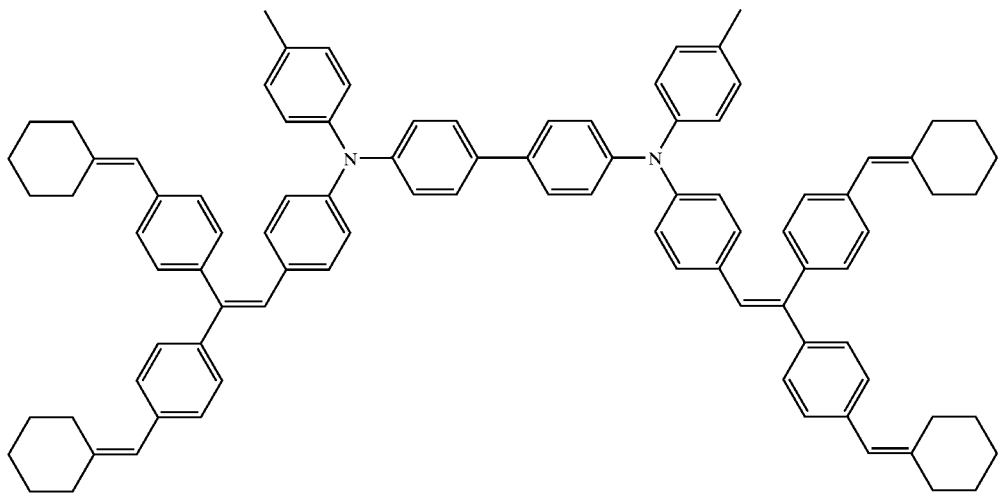

Another compound of the present invention is represented by the following general formula [C]:

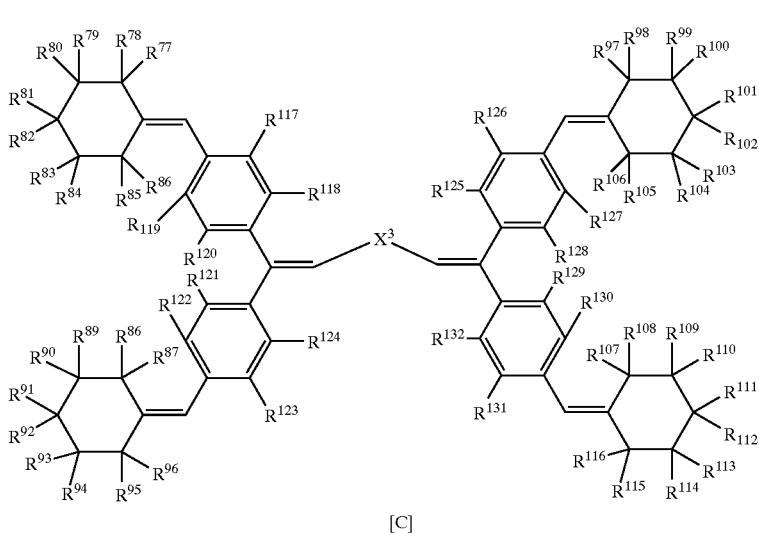

[C]

wherein
each of $R^{77}$ to $R^{116}$ independently represents a hydrogen atom, a halogen atom, a substituted or unsubstituted amino group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, or a substituted or unsubstituted alkoxycarbonyl group; any two of $R^{77}$ to $R^{86}$, $R^{87}$ to $R^{96}$, $R^{97}$ to $R^{106}$ and $R^{107}$ to $R^{116}$ may form a ring;

each of $R^{117}$ to $R^{132}$ independently represents a hydrogen atom, a halogen atom, a hydroxyl group, a substituted or unsubstituted amino group, nitro group, cyano group, a substituted or unsubstituted alkyl group, a substituted or unsubstituted alkenyl group, a substituted or unsubstituted styryl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, or carboxyl group; any two of $R^{117}$ to $R^{132}$ may form a ring; and $X^3$ represents a divalent linking group.

Examples of the halogen atom are as defined above.
Examples of the substituted or unsubstituted alkenyl group are as defined above.
Examples of the substituted or unsubstituted cycloalkyl group are as defined above. The substituted or unsubstituted alkoxy group is a group represented by —OY. Examples of Y are as defined above.
Examples of the substituted or unsubstituted aromatic hydrocarbon group are as defined above.
Examples of the substituted or unsubstituted aromatic heterocyclic group are as defined above.

Examples of the substituted or unsubstituted aralkyl group are as defined above.

The substituted or unsubstituted aryloxy group is represented by —OZ. Examples of Z are as defined above.

The substituted or unsubstituted alkoxycarbonyl group is represented by —COOY. Examples of Y are as defined above.

Examples of the divalent group that forms a ring include a tetramethylene group, pentamethylene group, hexamethylene group, diphenylmethane-2,2'-diyl group, diphenylethane-3,3'-diyl group, and diphenylpropane-4,4'-diyl group.

The substituted or unsubstituted amino group is represented by —$NZ^3Z^4$. Each of $Z^3$ and $Z^4$ independently represents a hydrogen atom, the substituted or unsubstituted alkyl group as defined above, the substituted or unsubstituted alkenyl group as defined above, the substituted or unsubstituted aralkyl group as defined above, the substituted or unsubstituted aromatic hydrocarbon group as defined above or the substituted or unsubstituted aromatic heterocyclic group as defined above.

Examples of the substituted or unsubstituted styryl group include an unsubstituted styryl group, an unsubstituted 2,2-diphenylvinyl group, an unsubstituted 1,2,2-triphenylvinyl group, and substituted styryl, 2,2-diphenylvinyl and 1,2,2-triphenylvinyl groups each containing, on the terminal phenyl or vinyl carbon, at least one substituent selected from the group consisting of a halogen atom, a hydroxyl group, the substituted or unsubstituted amino group as defined above, a nitro group, a cyano group, the substituted and unsubstituted alkyl groups as defined above, the substituted and unsubstituted alkenyl groups as defined above, the substituted and unsubstituted cycloalkyl groups as defined above, the substituted and unsubstituted alkoxy groups as defined above, the substituted and unsubstituted aromatic hydrocarbon groups as defined above, the substituted and unsubstituted aromatic heterocyclic groups as defined above, the substituted and unsubstituted aralkyl groups as defined above, the substituted and unsubstituted aryloxy groups as defined above, the substituted and unsubstituted alkoxycarbonyl groups as defined above, and the carboxyl group.

In the above-mentioned general formula [C], $X^3$ represents a divalent linking group. Examples of the linking group include a single bond, divalent groups obtained by removing one hydrogen atom from the substituted or unsubstituted alkenyl group as defined above, divalent groups obtained by removing two hydrogen atoms from a substituted or unsubstituted ether, divalent groups obtained by removing one hydrogen atom from the substituted or unsubstituted aromatic hydrocarbon group as defined above, and divalent groups obtained by removing one hydrogen atom from the substituted or unsubstituted aromatic heterocyclic group as defined above. Examples thereof include, but not limited to, a vinylene group, divalent groups obtained by removing two hydrogen atoms from diphenylether, naphthylene group, anthranylene group, perylenylene group, 1,2-benzoperylenylene group, 1,2,7,8-dibenzoperylenylene group, 1,2,11,12-dibenzoperylenylene group, terylenylene group, pentacenylene group, bisanthrenylene group, 4,41-biphenylene group, 10,10'-(9,9'-bianthryl)ylene group, 4,4'-(1,1'-binaphthyl)ylene group, 4,101-(1,9'-naphthylanthryl)ylene group, divalent groups represented by —$Ar^6$—$Ar^7$—$Ar^8$ (wherein each of $Ar^6$ to $Ar^8$ independently represents a naphthyl group or anthranyl group), divalent groups obtained by removing two hydrogen atoms from aromatic hydrocarbons or condensed polycyclic hydrocarbons such as phenanthrene, pyrene, biphenyl, and terphenyl, heterocyclic compounds or condensed heterocyclic compounds such as carbazole, pyrrole, thiophene, furan, imidazole, pyrazole, isothiazole, isoxazole, pyridine, pyrazine, pyrimidine, pyridazine, furazan, thianthrene, isobenzofuran, phenoxazine, indolidine, indole, isoindole, 1H-indazole, purine, quinoline, isoquinoline, phthalazine, naphthylidine, quinoxaline, quinazoline, cinnoline, pteridine, carbazole, beta-carbazoline, phenanthridine, acridine, perimidine, phenanthroline, phenazine, phenothiazine, and phenoxazine, and derivatives thereof.

Specific examples of the compounds represented by general formula [C] include, but not limited to, the following compounds (45) to (75).

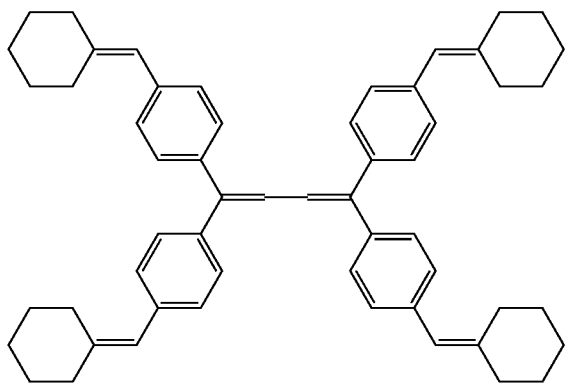

(45)

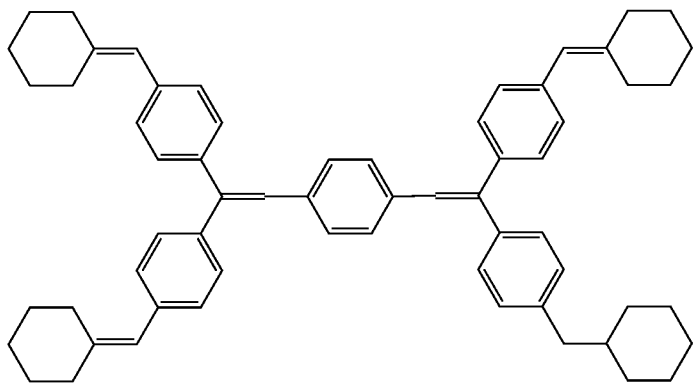
(46)
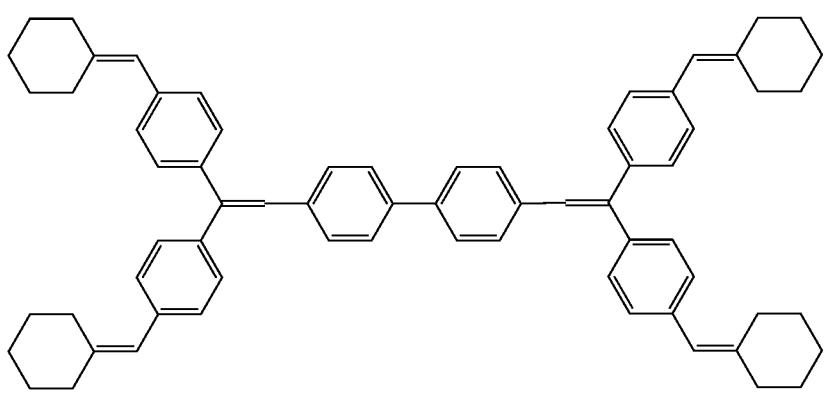
(47)
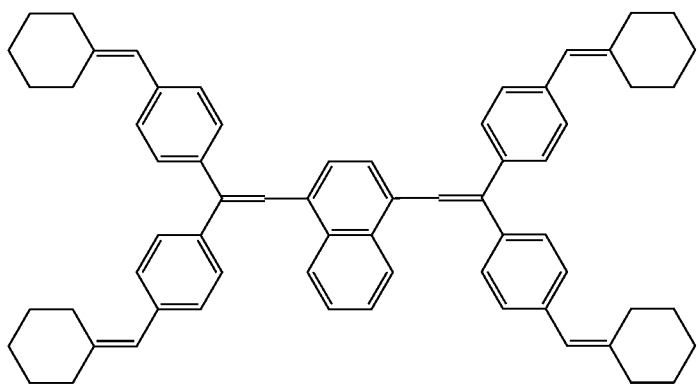
(48)
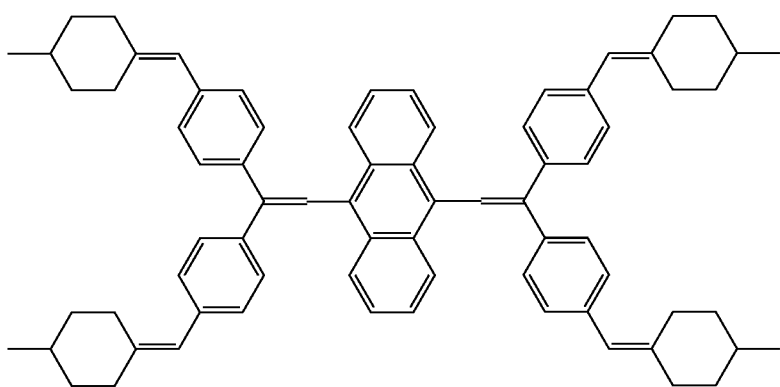
(49)

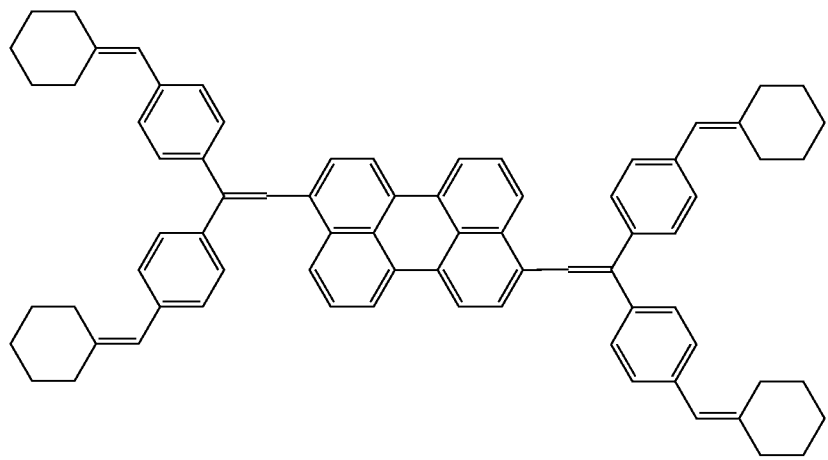
(50)
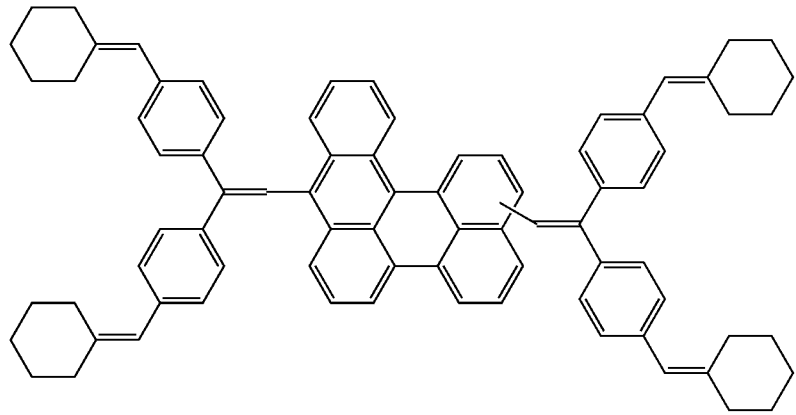
(51)
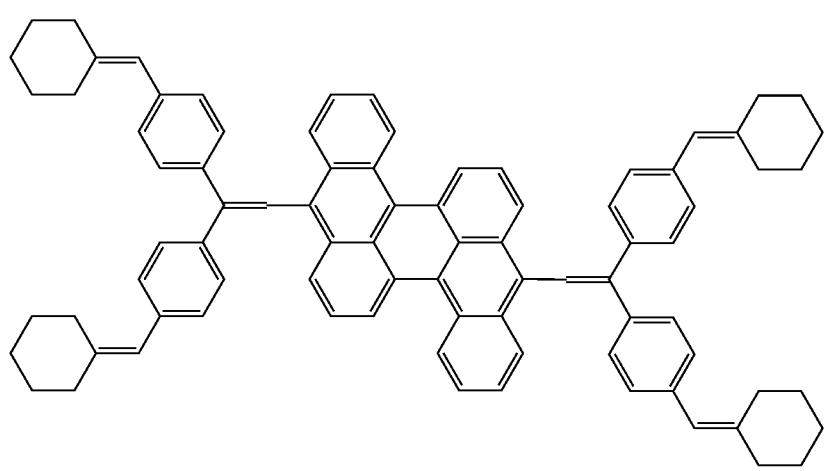
(52)

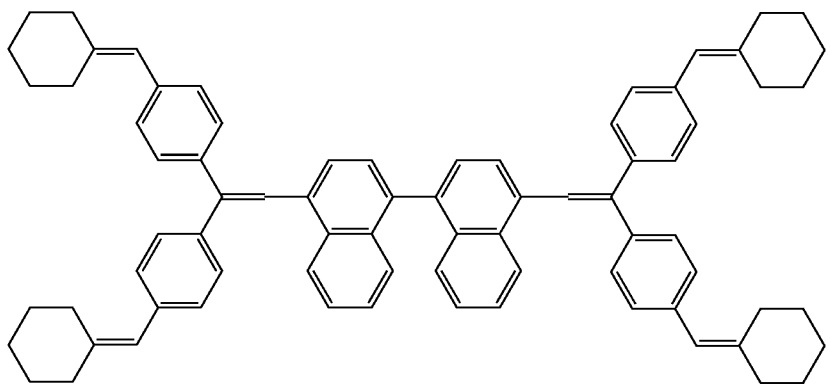
(53)
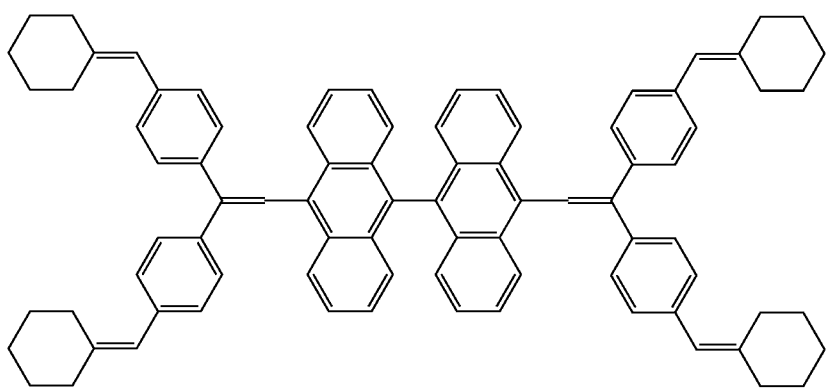
(54)
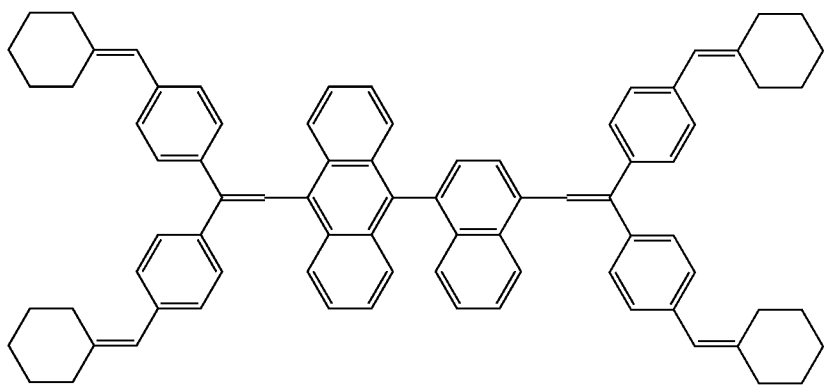
(55)
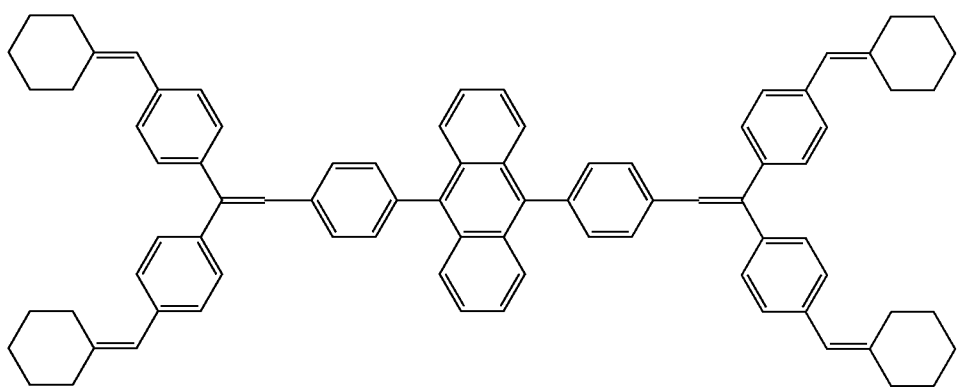
(56)

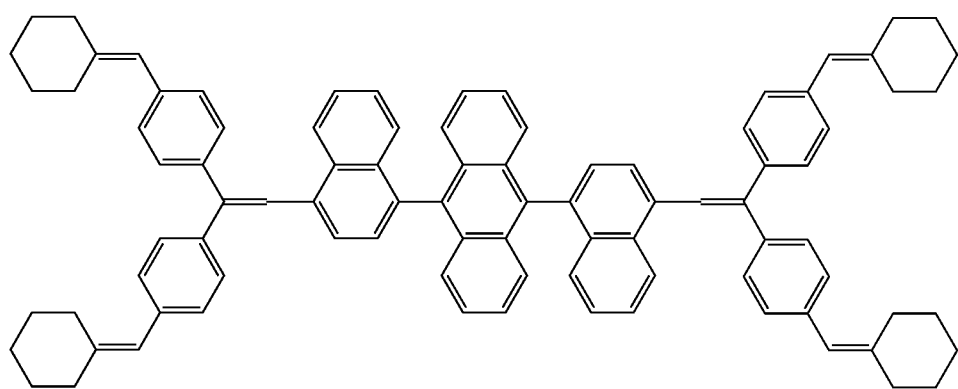
(57)
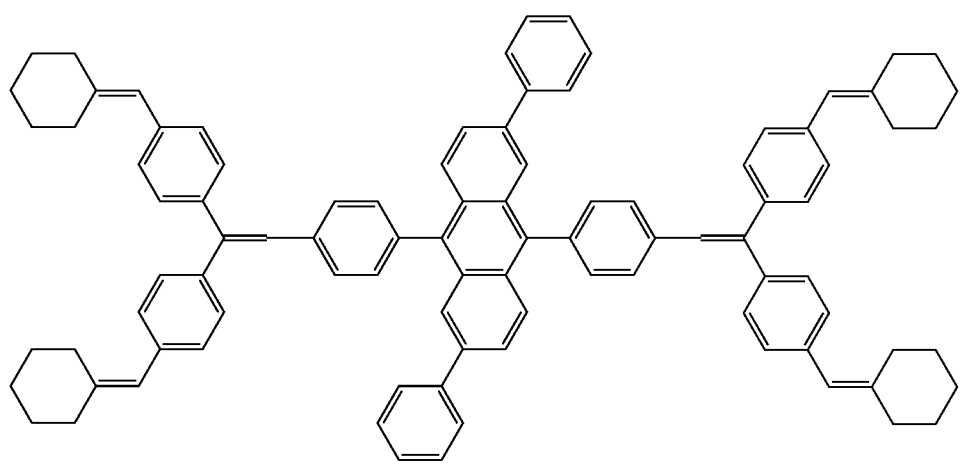
(58)
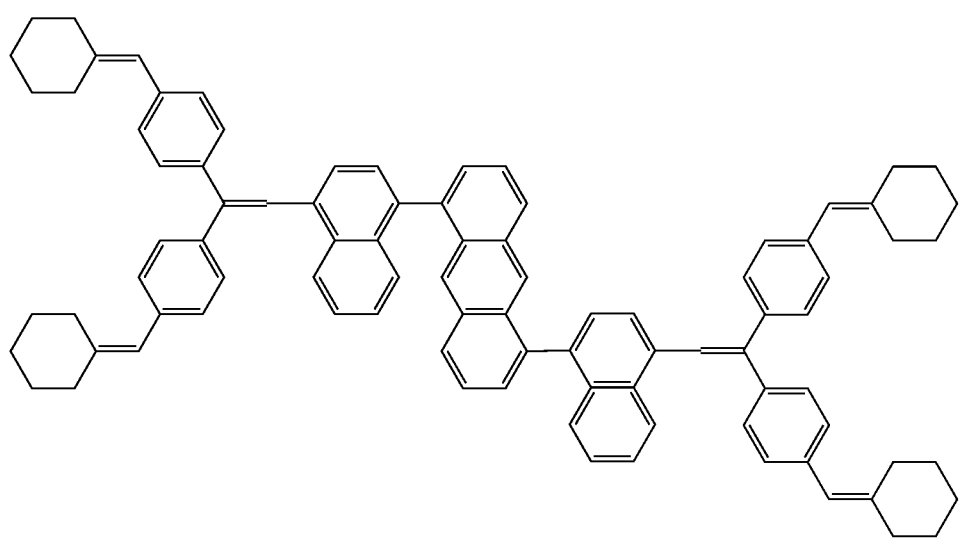
(59)

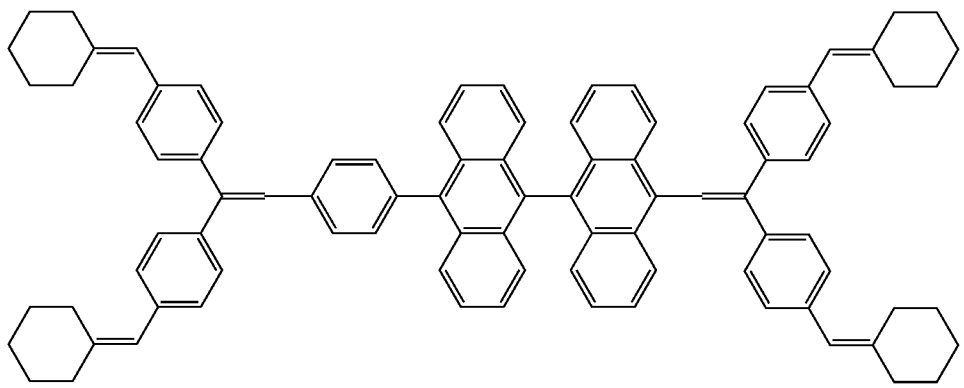
(60)
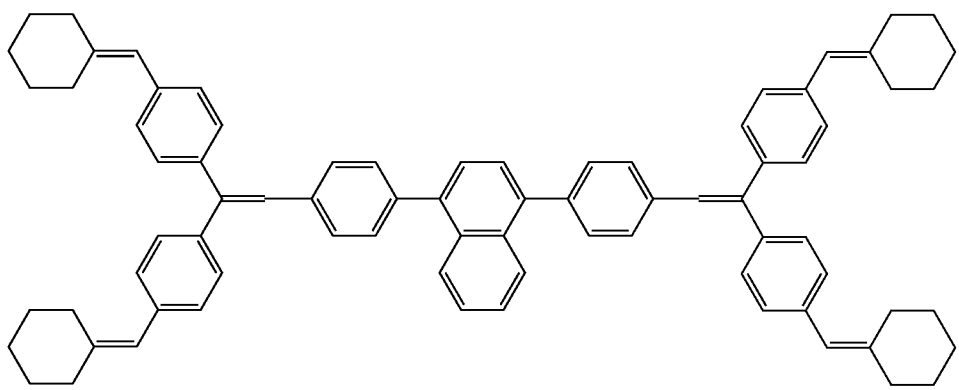
(61)
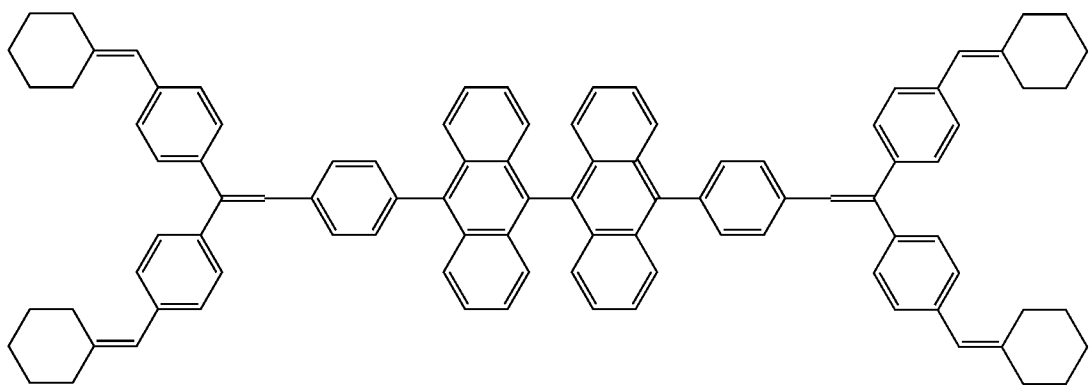
(62)
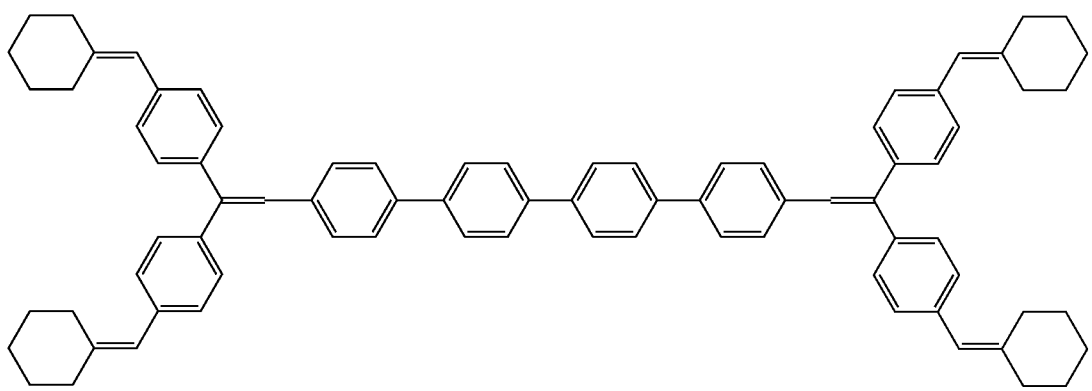
(63)

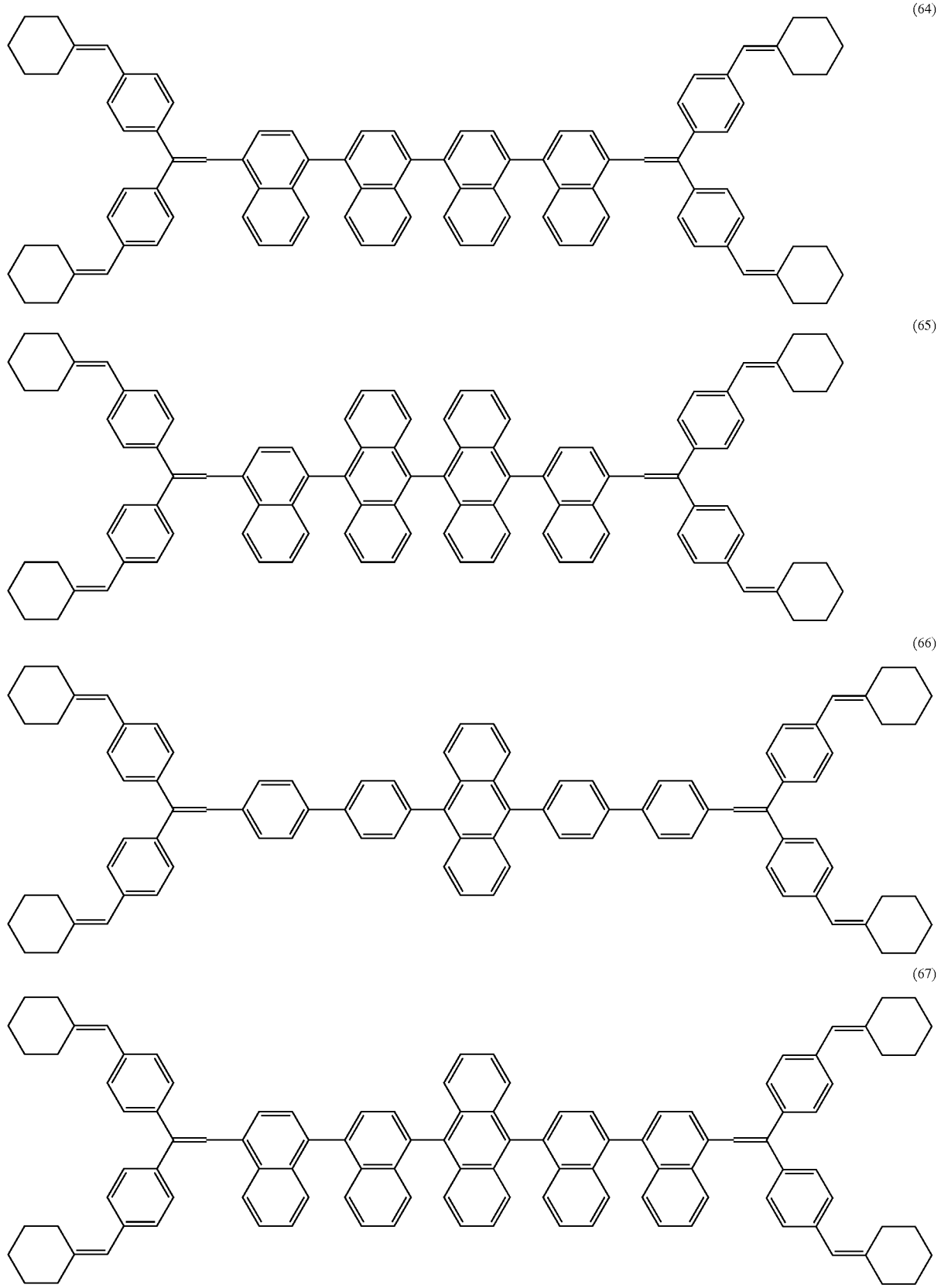

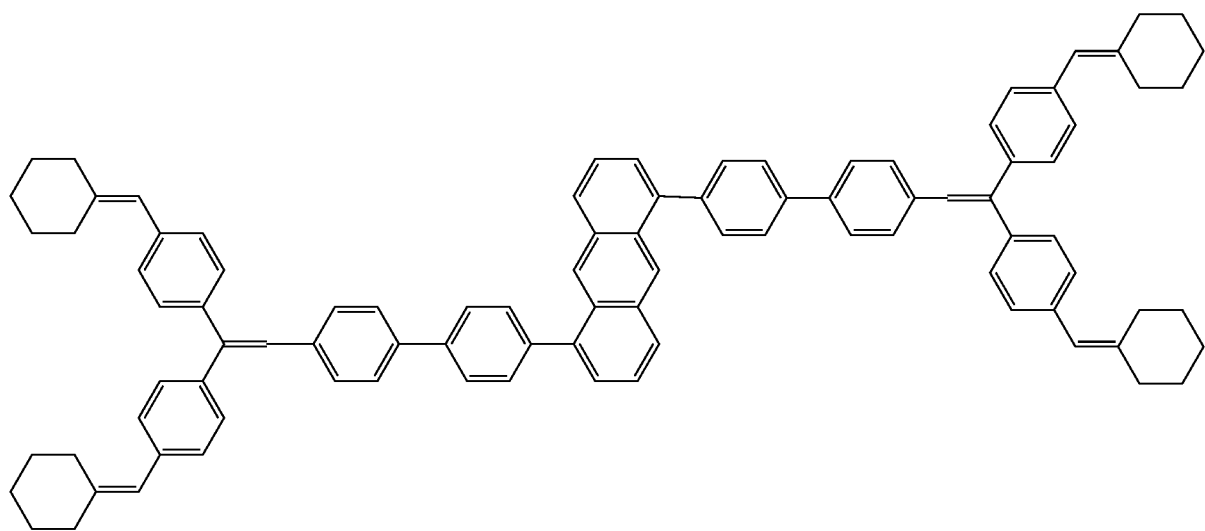
(68)
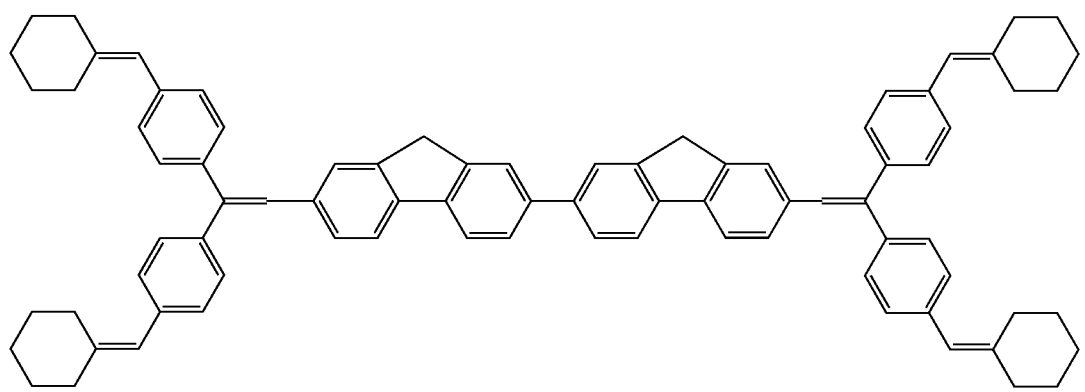
(69)
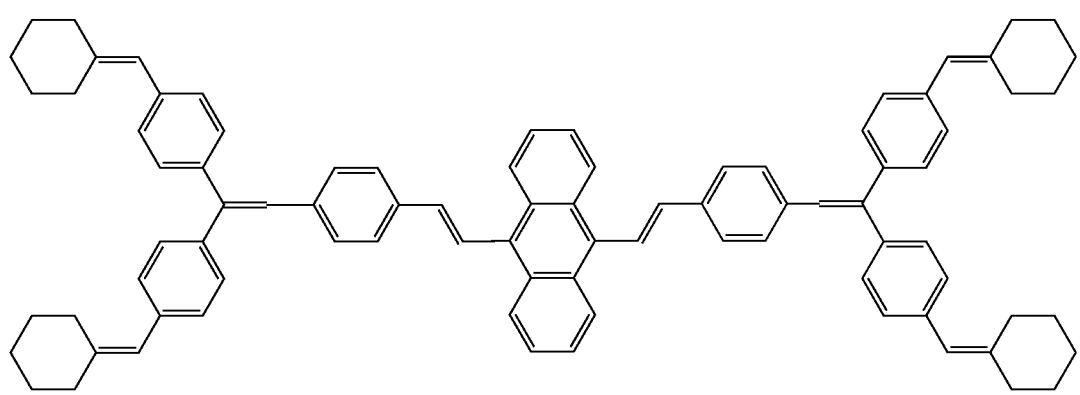
(70)

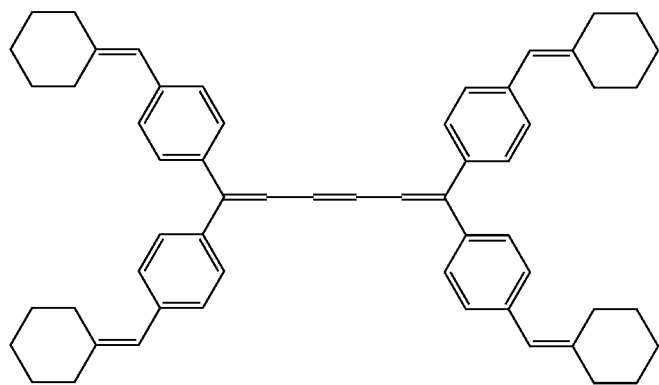
(71)
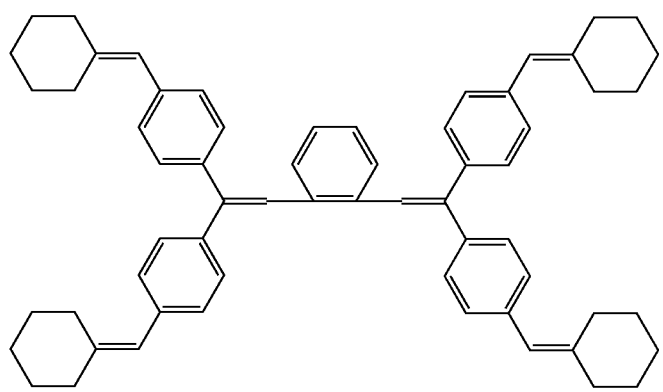
(72)
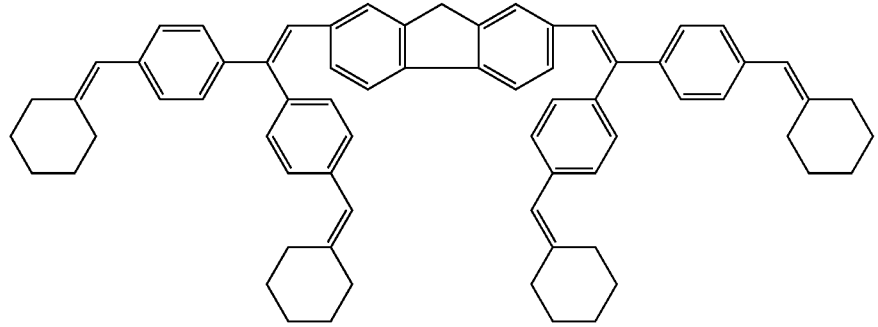
(73)

-continued
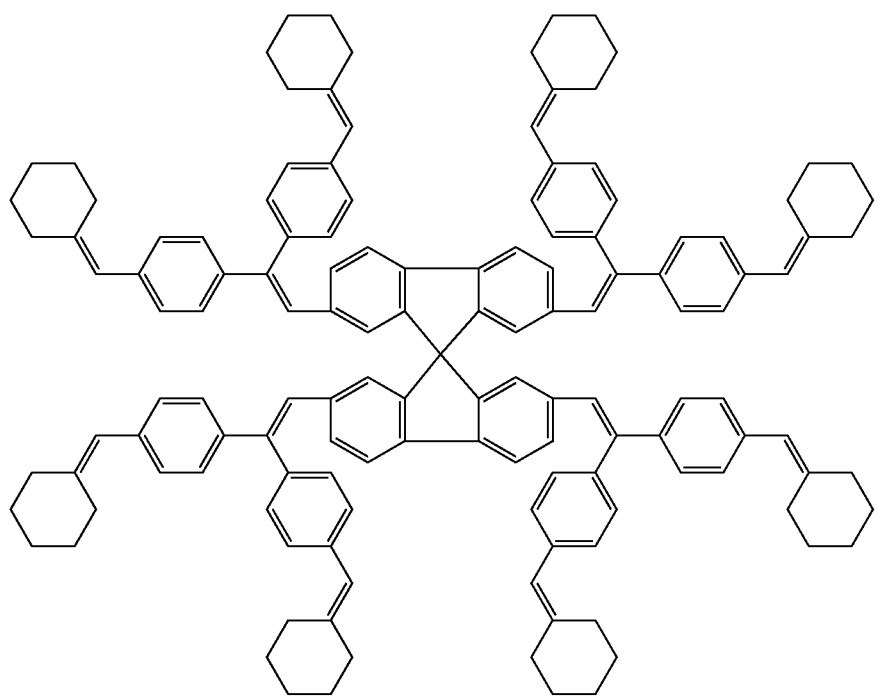
(74)
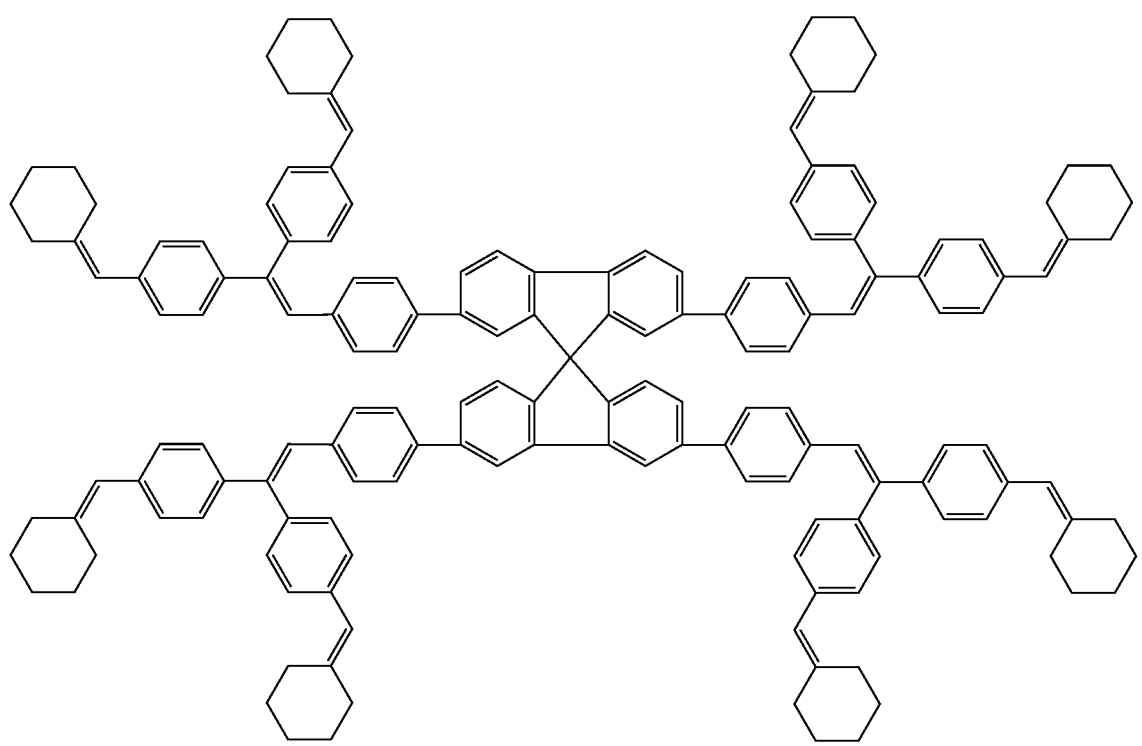
(75)

Other compound of the present invention is represented by the following general formulae [D], [E], and [F]:

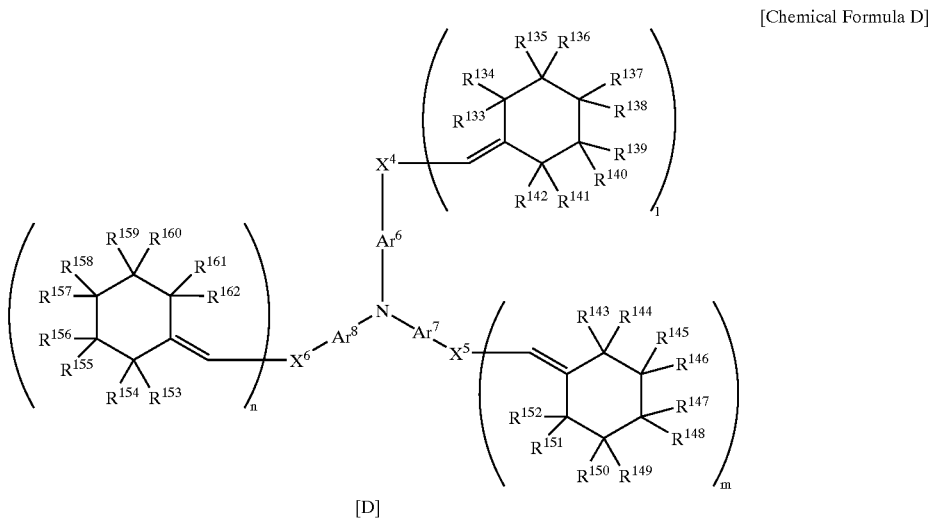

[D]

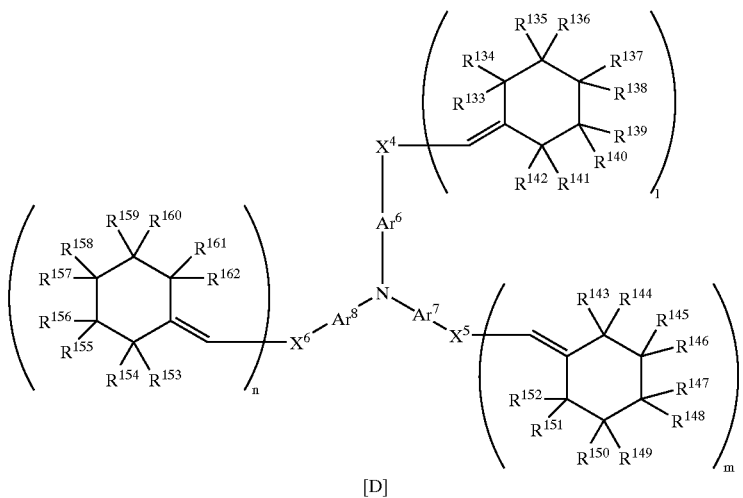

[D]

wherein each of $Ar^6$ to $Ar^8$ independently represents a substituted or unsubstituted aromatic hydrocarbon group having 5 to 42 carbon atoms, or a substituted or unsubstituted aromatic heterocyclic group having 4 to 42 carbon atoms; $Ar^6$ to $Ar^8$ may be bonded to each other to form a ring;

each of $X^4$ and $X^6$ independently represents a divalent linking group;

each of $R^{133}$ to $R^{162}$ independently represents a hydrogen atom, a halogen atom, a substituted or unsubstituted alkyl group, a substituted or unsubstituted alkenyl group, or a substituted or unsubstituted alkoxy group; any two of $R^{133}$ to $R^{142}$, $R^{143}$ to $R^{152}$ and $R^{153}$ to $R^{162}$ may form a ring;

l, m and n are each independently 0 or 1; and l plus m plus n is an integer between 1 and 3, both inclusive.

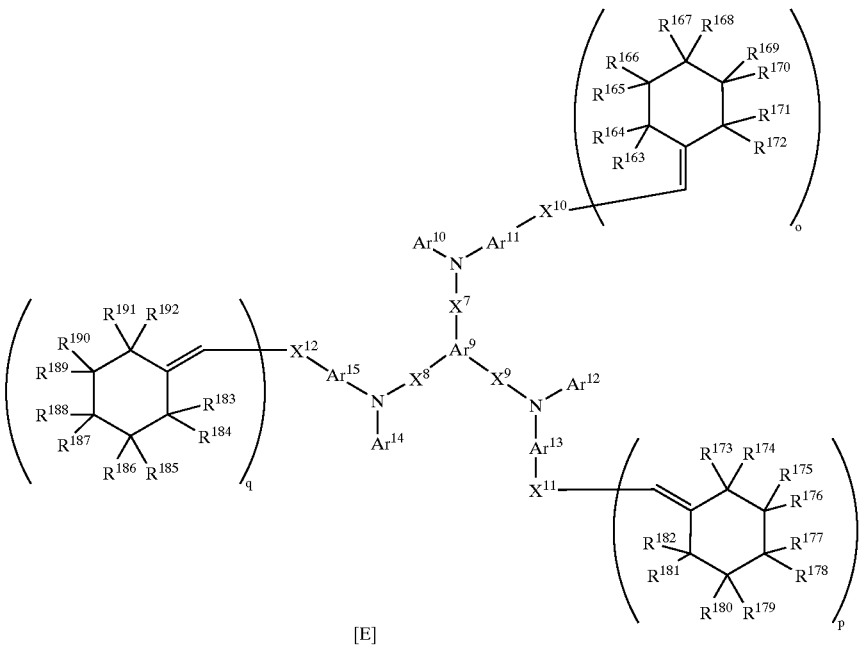

[E]

wherein each of $Ar^9$ to $Ar^{15}$ independently represents a substituted or unsubstituted aromatic hydrocarbon group having 5 to 42 carbon atoms, or a substituted or unsubstituted aromatic heterocyclic group having 4 to 42 carbon atoms; $Ar^{10}$ and $Ar^{11}$, $Ar^{12}$ and $Ar^{13}$, and $Ar^{14}$ and $Ar^{15}$ may be bonded to each other to form a ring;

each of $X^7$ and $X^{12}$ independently represents a divalent linking group;

each of $R^{163}$ to $R^{192}$ independently represents a hydrogen atom, a halogen atom, a substituted or unsubstituted alkyl group, a substituted or unsubstituted alkenyl group, or a substituted or unsubstituted alkoxy group; any two of $R^{163}$ to $R^{172}$, $R^{173}$ to $R^{182}$ and $R^{183}$ to $R^{192}$ may form a ring;

o, p and q are each independently 0 or 1; and o plus p plus q is an integer between 1 and 3, both inclusive.

[Chemical Formula F]

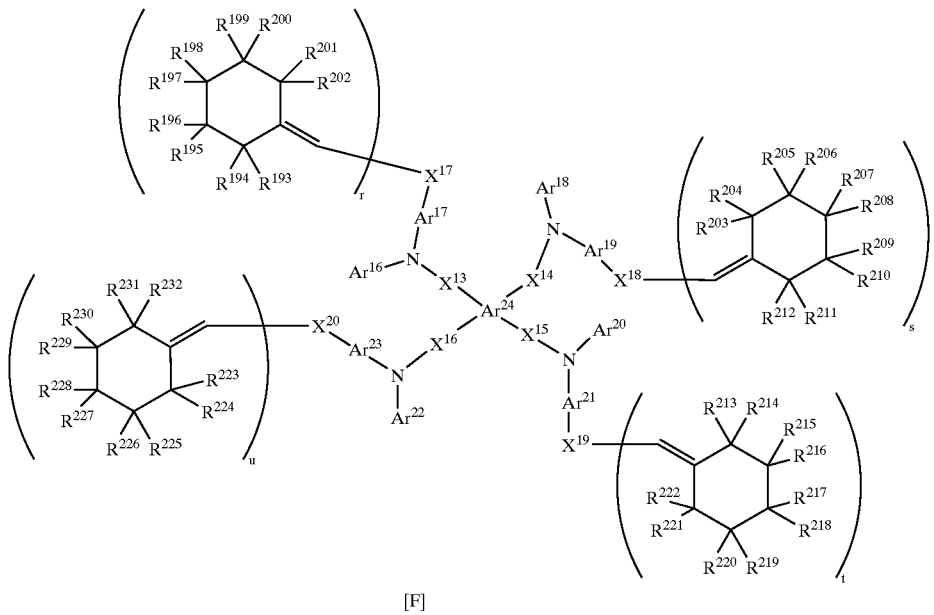

[F]

wherein
each of $Ar^{16}$ to $Ar^{24}$ independently represents a substituted or unsubstituted aromatic hydrocarbon group having 5 to 42 carbon atoms, or a substituted or unsubstituted aromatic heterocyclic group having 4 to 42 carbon atoms, provided that $Ar^{16}$ and $Ar^{17}$, $Ar^{18}$ and $Ar^{19}$, $Ar^{20}$ and $Ar^{21}{}_1$ and $Ar^{22}$ and $Ar^{23}$ may be bonded to each other to form a ring;

each of $X^{13}$ and $X^{20}$ independently represents a divalent linking group;

each of $R^{193}$ to $R^{232}$ independently represents a hydrogen atom, a halogen atom, a substituted or unsubstituted alkyl group, a substituted or unsubstituted alkenyl group, or a substituted or unsubstituted alkoxy group, provided that two of $R^{193}$ to $R^{202}$, $R^{203}$ to $R^{212}$, $R^{213}$ to $R^{222}$ and $R^{223}$ to $R^{232}$ may form a ring;

r, s, t and u are each independently 0 or 1; and r plus s plus t plus u is an integer between 1 and 4, both inclusive.

Examples of the halogen atom are as defined above.

Examples of the substituted or unsubstituted alkenyl group are as defined above.

The substituted or unsubstituted alkoxy group is a group represented by —OY. Examples of Y include a methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitrobutyl group, and 1,2,3-trinitropropyl group.

Examples of the divalent group that forms a ring include a tetramethylene group, pentamethylene group, hexamethylene group, diphenylmethane-2,2'-diyl group, diphenylethane-3,3'-diyl group, and diphenylpropane-4,4$^1$-diyl group.

In the general formulae [D], [E], and [F], each of l, m, n, o, p, q, r, s, t, and u independently represents 0 or 1, in which l+m+n and o+p+q are each between 1 and 3, both inclusive, while r+s+t+u are each between 1 and 4, both inclusive.

$X^4$ to $X^2$ each represents a divalent linking group. Examples of the linking group include a single bond, divalent groups obtained by removing one hydrogen atom from the substituted or unsubstituted alkyl group as defined above, divalent groups obtained by removing one hydrogen atom from the substituted or unsubstituted alkenyl group as defined above, divalent groups obtained by removing two hydrogen atoms from a substituted or unsubstituted ether, divalent groups obtained by removing one hydrogen atom from the substituted or unsubstituted amino group as defined above, divalent groups obtained by removing one hydrogen atom from the substituted or unsubstituted aromatic hydrocarbon group as defined above, and divalent groups obtained by removing one hydrogen atoms from the substituted or unsubstituted aromatic heterocyclic group as defined above. $X^4$ to $X^6$, $X^{10}$ to $X^{12}$, and $X^{17}$ to $X^{20}$ are bonded to the hydrogen atoms as the terminals when any one of l, m, n, o, p, q, r, s, t, and u is 0 and the compound has no cyclohexylidenemethine group.

Examples of the substituted or unsubstituted aromatic hydrocarbon group include a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4 '-t-butyl-p-terphenyl-4-yl group, 9,9'-spirobifluorenyl, and 1,3,5-triphenylbenzene.

Examples of the substituted or unsubstituted aromatic heterocyclic group are as defined above.

The substituted or unsubstituted ether is represented by Z—O—Z' in which each of Z and Z' is independently the substituted or unsubstituted alkyl group as defined above, the substituted or unsubstituted alkenyl group as defined above, the substituted or unsubstituted aromatic hydrocarbon group as defined above, or the substituted or unsubstituted aromatic heterocyclic group as defined above.

The substituted or unsubstituted amino group is represented by —NX'X" in which each of X' and X" is independently a hydrogen atom, the substituted or unsubstituted alkyl group as defined above, the substituted or unsubstituted alkenyl group as defined above, the substituted or unsubstituted aralkyl group as defined above, the substituted or unsubstituted aromatic hydrocarbon group as defined above, or the substituted or unsubstituted aromatic heterocyclic group as defined above.

Examples of the substituted or unsubstituted aralkyl, styryl, and cycloalkyl groups are as defined above. The substituted or unsubstituted aryloxy group is represented by —OZ. Examples of Z are as defined above.

The substituted or unsubstituted alkoxycarbonyl group is represented by —COOY. Examples of Y include a methyl group, ethyl group, propyl group, isopropyl group, n-butyl group, 3-butyl group, isobutyl group, t-butyl group, n-pentyl group, n-hexyl group, n-heptyl group, n-octyl group, hydroxymethyl group, 1-hydroxyethyl group, 2 hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3- diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

Of these, suitable examples for $X^1$ to $X^{20}$ include, but not limited to, a vinylene group, divalent groups obtained by removing two hydrogen atoms from diphenylether, phenylene group, naphthylene group, anthranylene group, perylenylene group, 4,4'-biphenylene group, 10,10'-(9,9'-bianthryl)ylene group, 4,4'-(1,1'-binaphthyl)ylene group, 4,10'-(1,9'-naphthylanthryl)ylene group, divalent groups obtained by removing two hydrogen atoms from 1,3,5-triphenylbenzene, divalent groups obtained by removing one hydrogen atom from a styryl or 2,2-diphenylvinyl group, divalent groups obtained by removing one hydrogen atom from a diphenylamino group, divalent groups represented by —Ar—Ar'—Ar"— (wherein each of Ar, Ar' and Ar" is either a naphthyl group or anthranyl group), divalent groups obtained by removing two hydrogen atoms from phenanthridine, and derivatives thereof.

Each of $Ar^6$ to $Ar^{24}$ represents a group obtained by removing zero to three hydrogen atoms from a substituted or unsubstituted aromatic hydrocarbon group having 5 to 42 carbon atoms, or from a substituted or unsubstituted aromatic heterocyclic group having 4 to 42 carbon atoms. Examples of the substituted or unsubstituted aromatic hydrocarbon group having 5 to 42 carbon atoms include the above-mentioned substituted or unsubstituted aromatic hydrocarbon groups, 9,9'-bianthryl, 1,1'-binaphthyl, 1,9'-naphthylanthryl, a backbone represented by —Ar—Ar'—Ar"— (wherein each of Ar, Ar' and Ar" is either a naphthyl group or anthranyl group), phenanthrene, pyrene, biphenyl, and terphenyl. Examples of the substituted or unsubstituted aromatic heterocyclic group having 4 to 42 carbon atoms include the above-mentioned substituted or unsubstituted aromatic heterocyclic groups and derivatiges thereof.

Specific examples of the compounds represented by general formula [D][E][F] invention include, but not limited to, the following compounds (76) to (101). Of these, the general formula [D] corresponds to the compounds (76) to (84) and (98) to (101), the general formula [E] corresponds to the compounds (85) to (90), and the general formula [F] corresponds to the compounds (91) to (97).

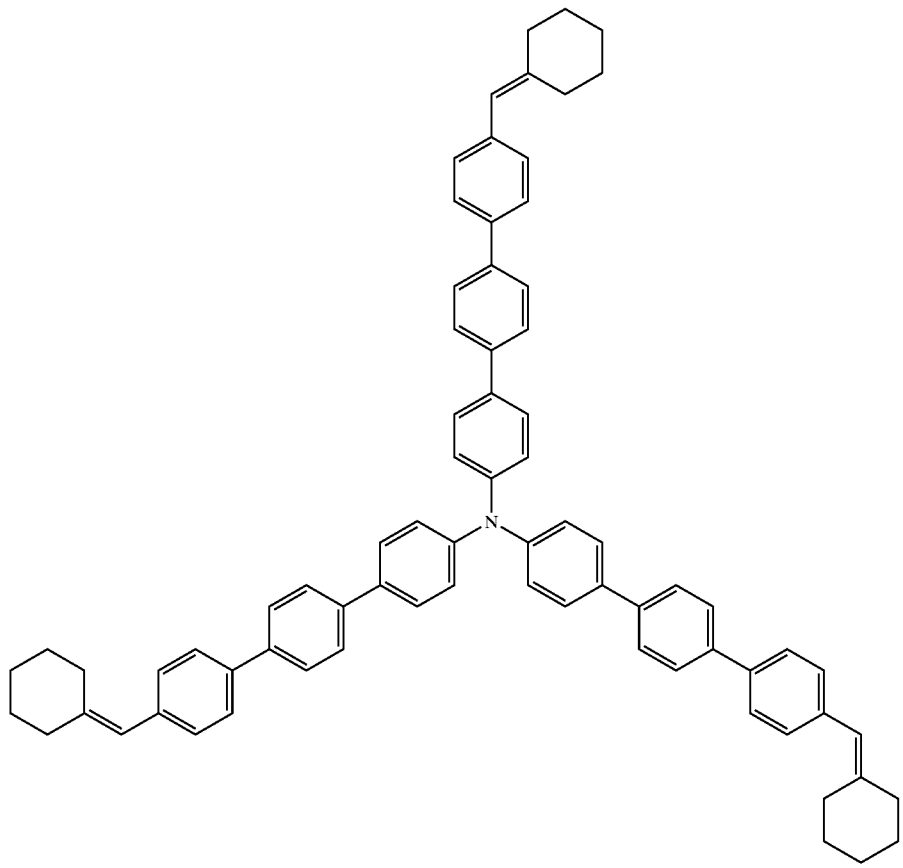

(76)

-continued
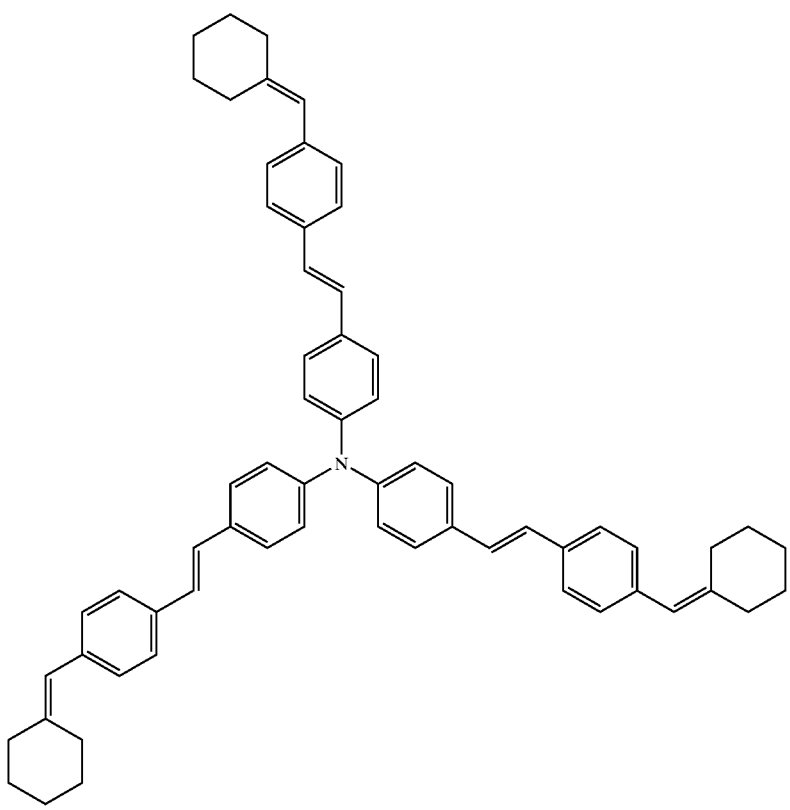
(77)
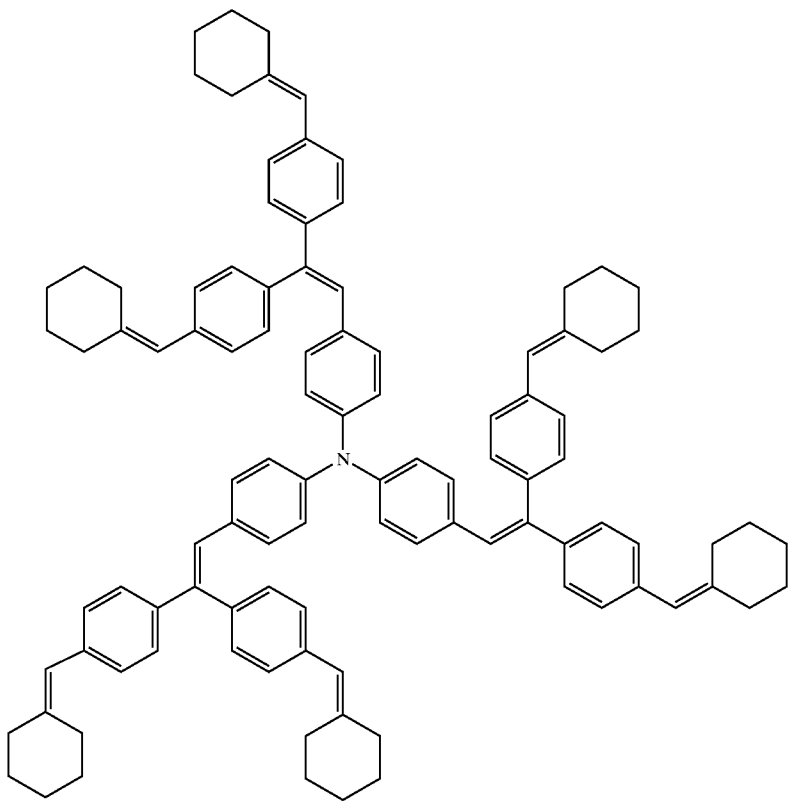
(78)

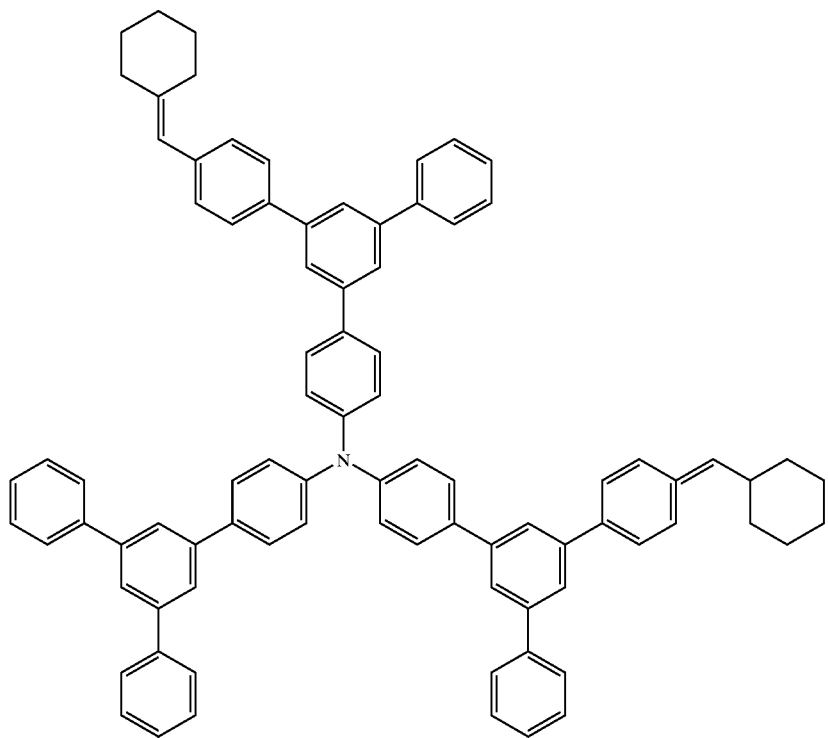
(79)
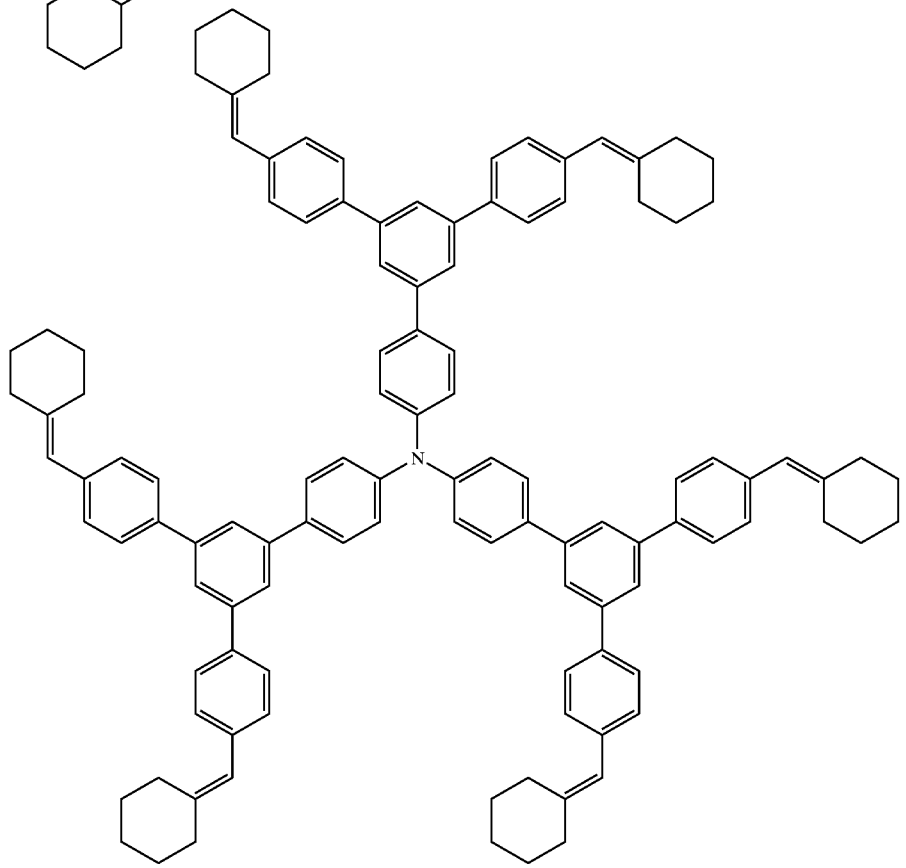
(80)

-continued
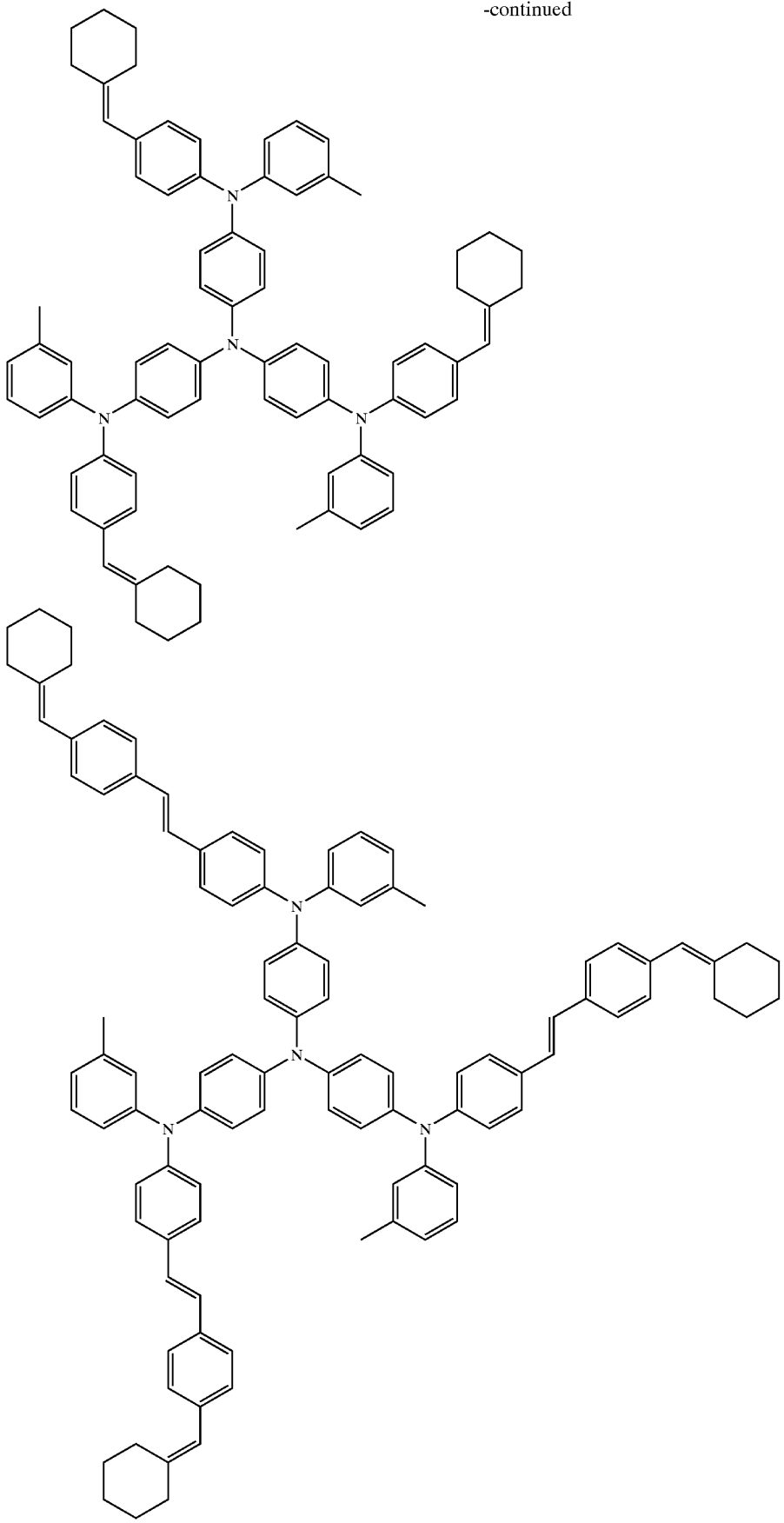
(81)
(82)

-continued
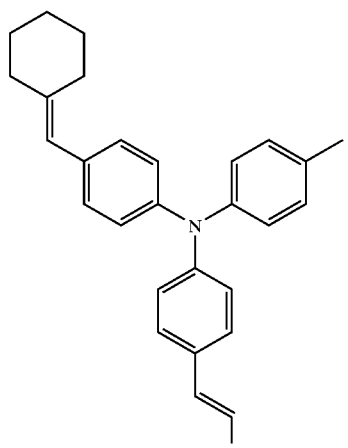
(83)
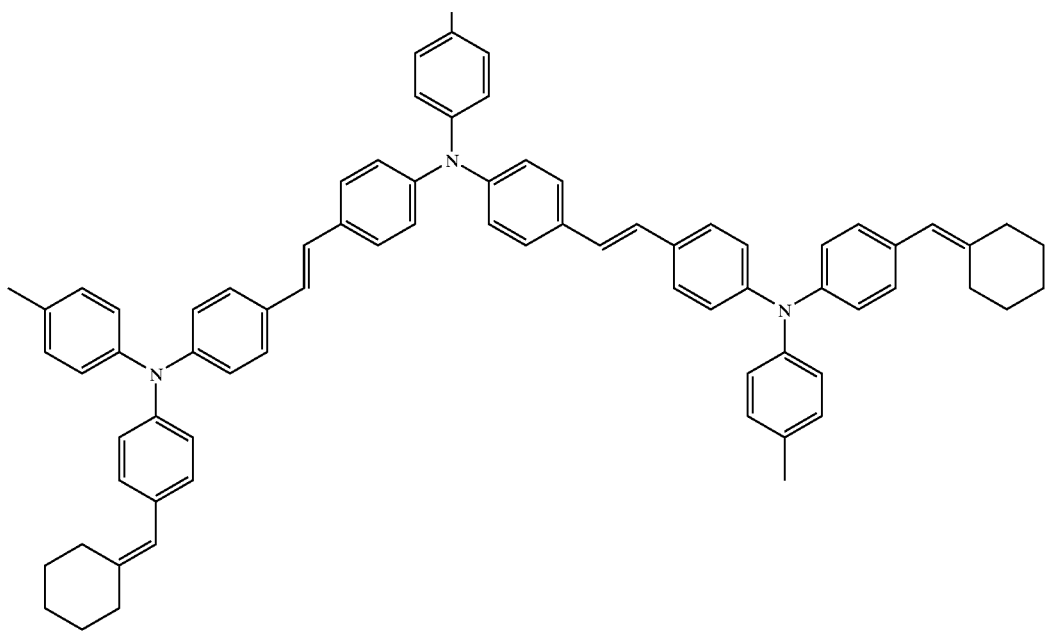
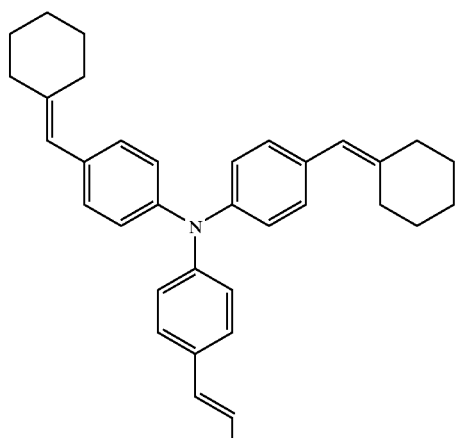
(84)

-continued
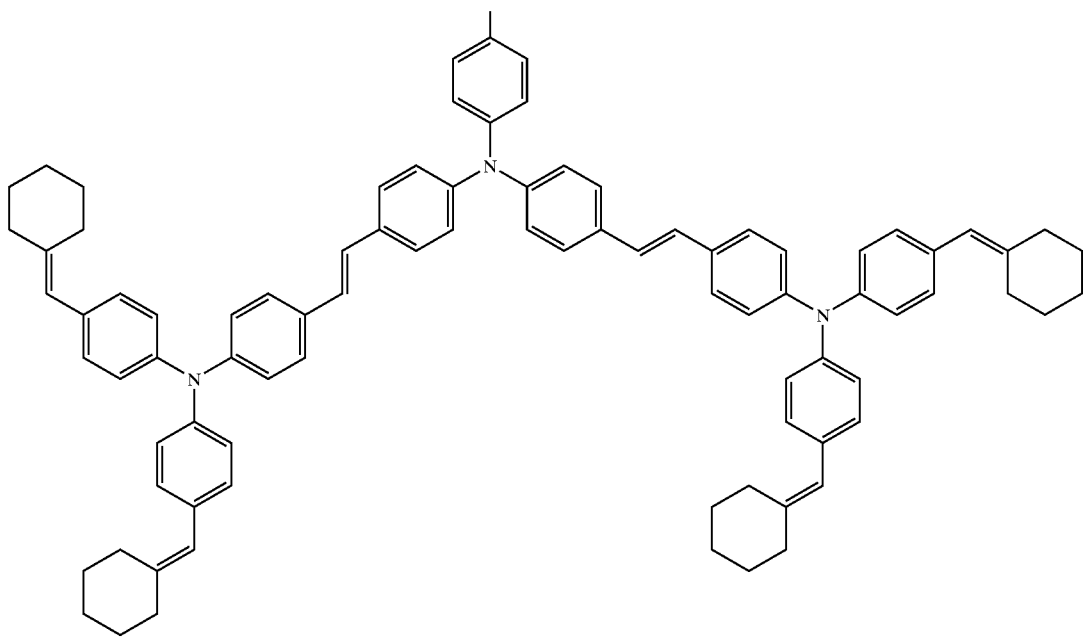
(85)
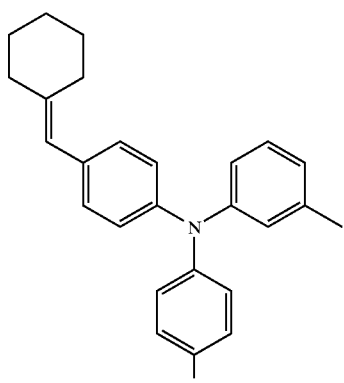
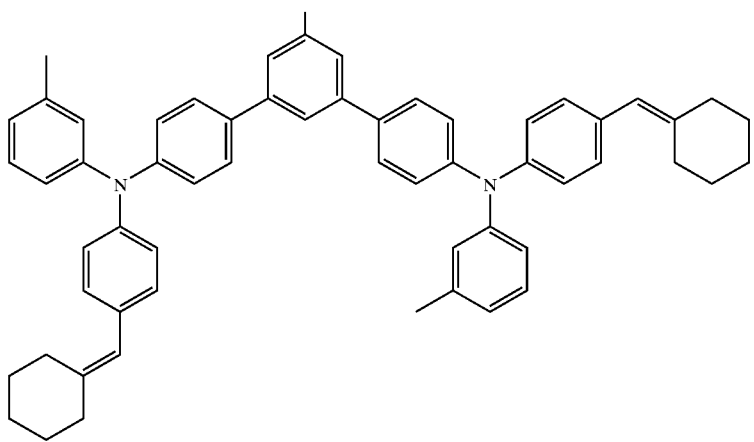

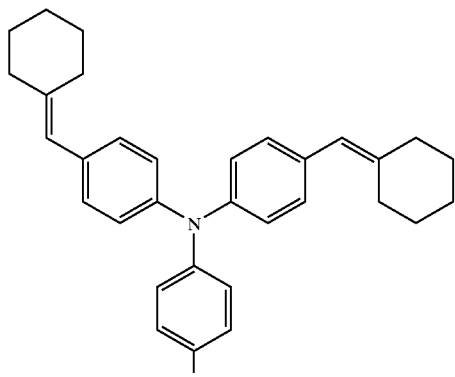
(86)
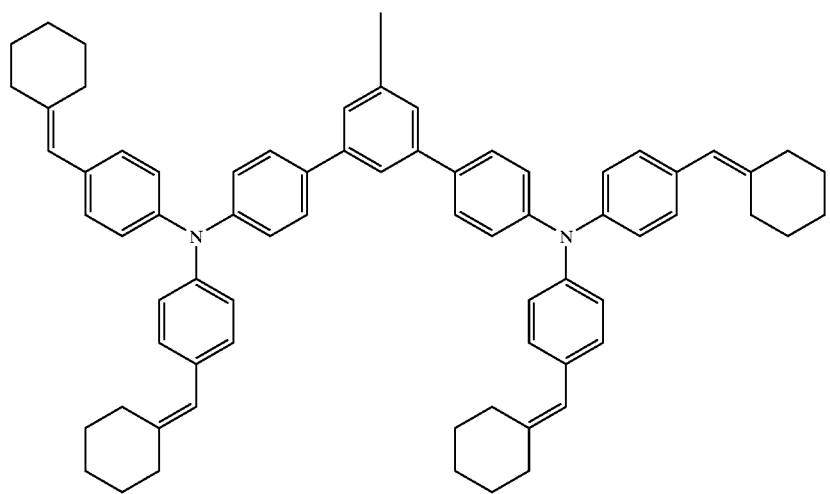
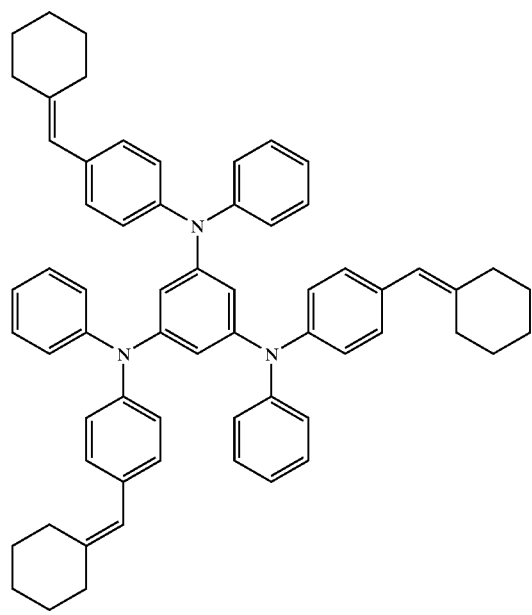
(87)

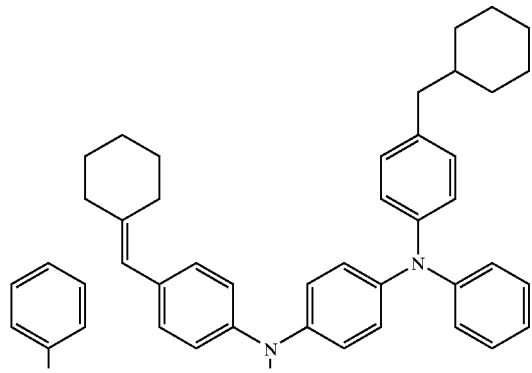
(88)
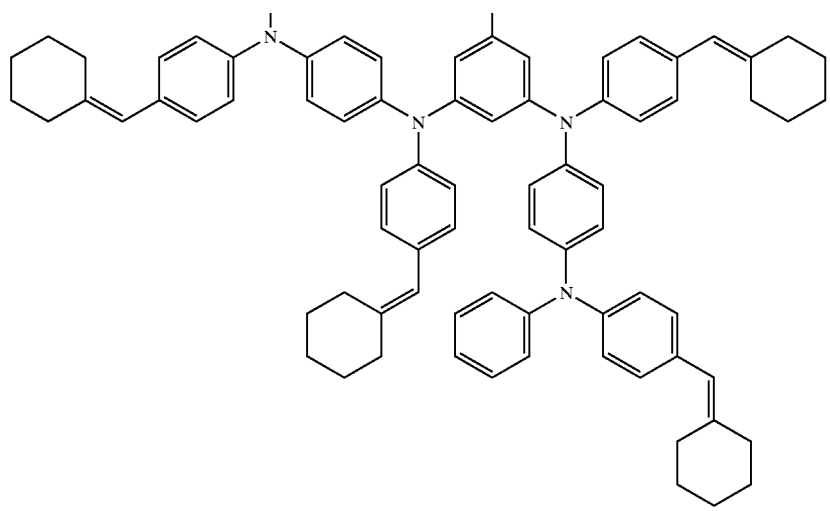
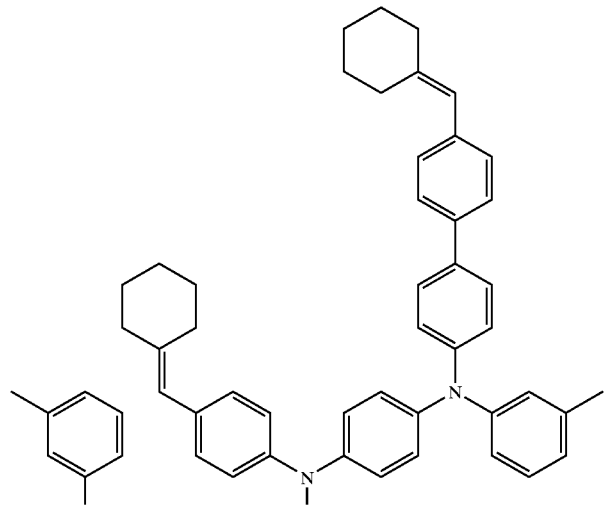
(89)

-continued
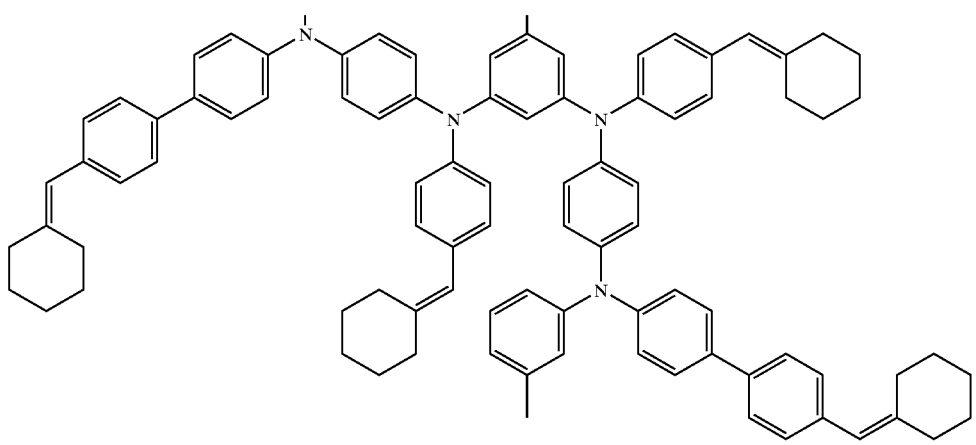
(90)
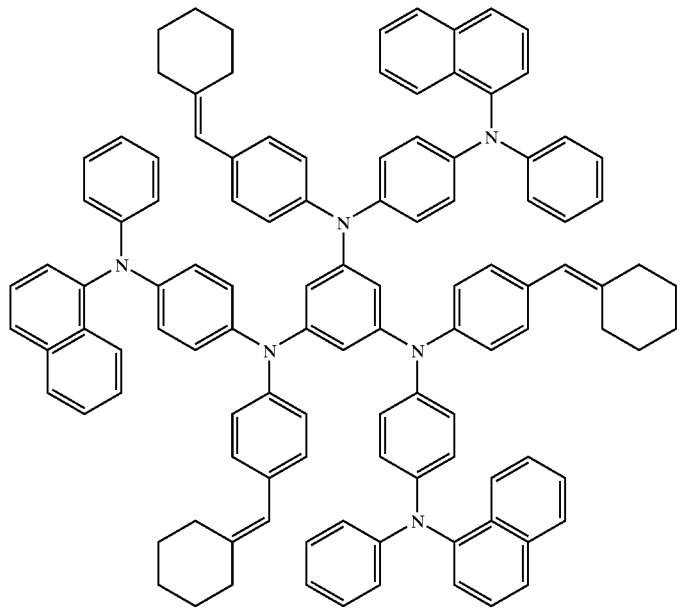
(91)
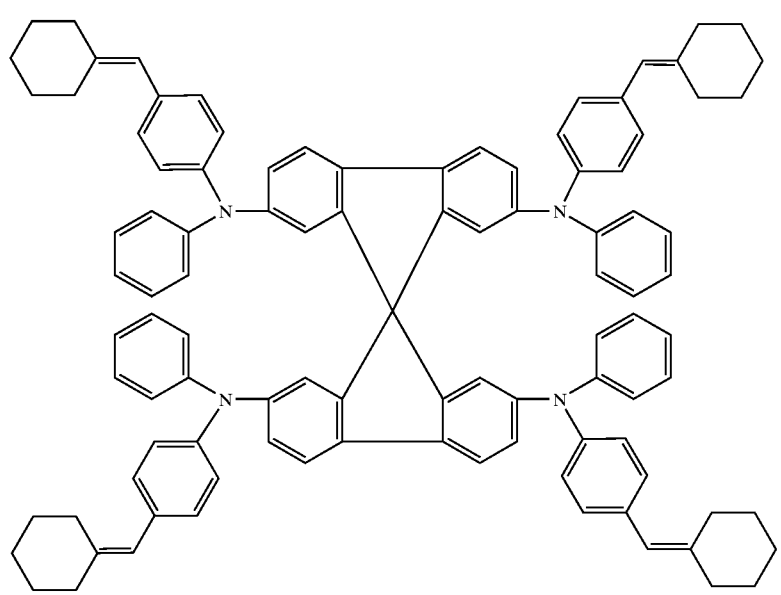

(92)
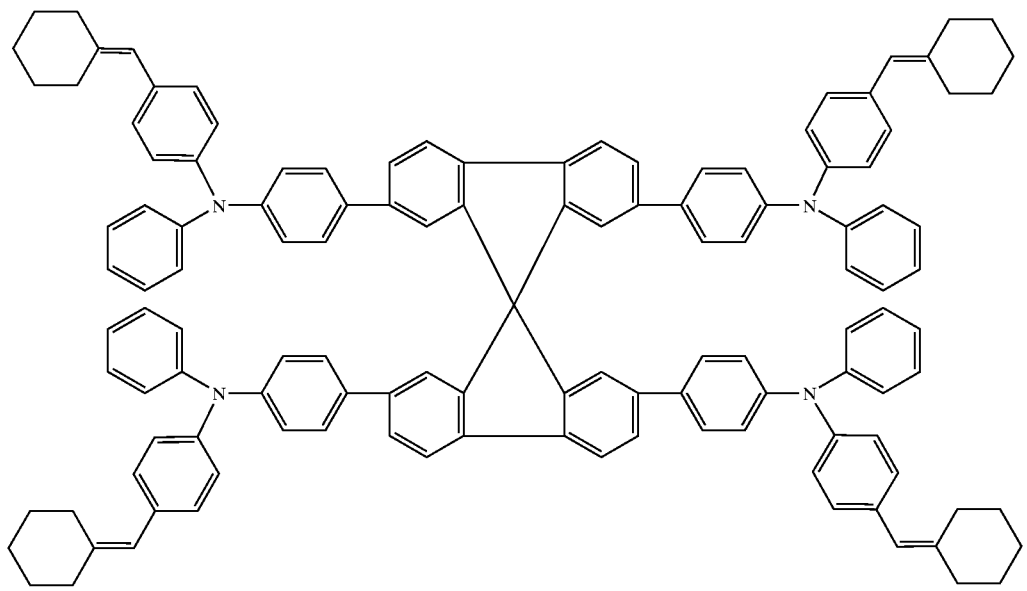
(93)
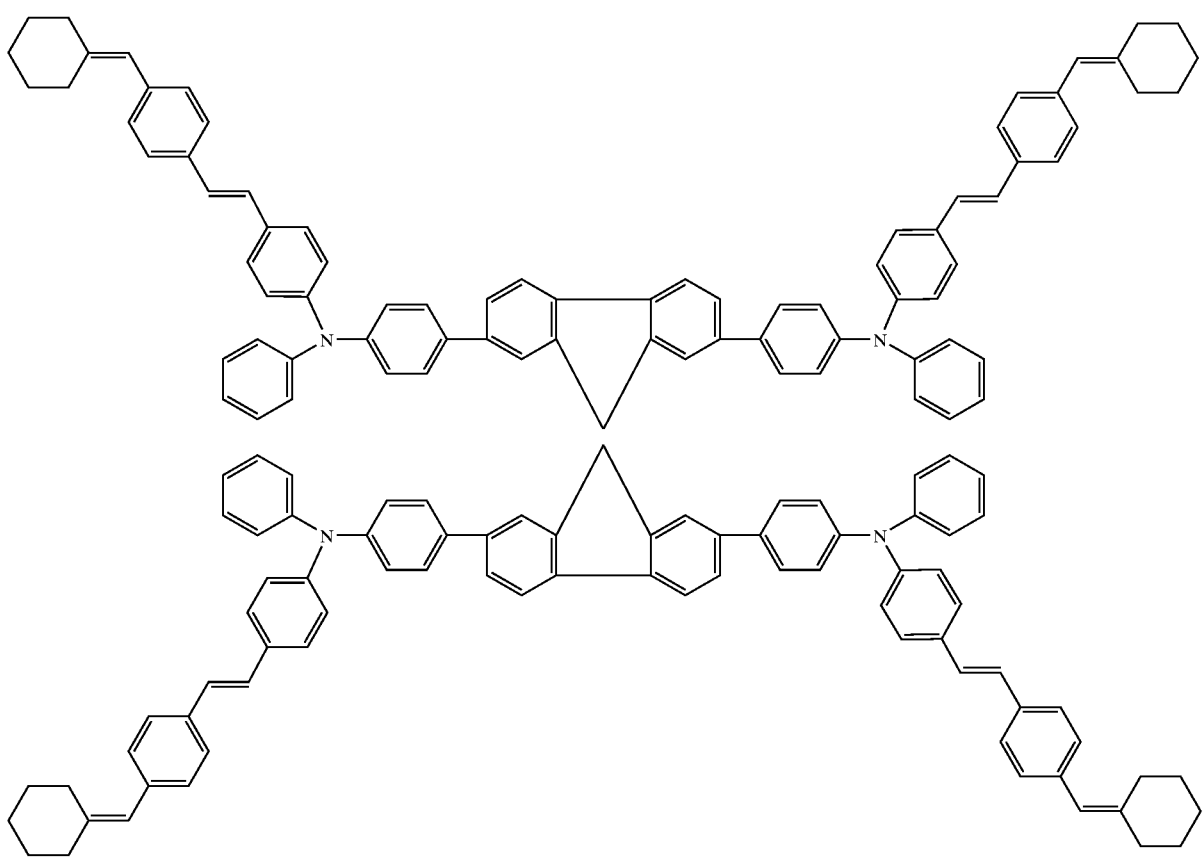

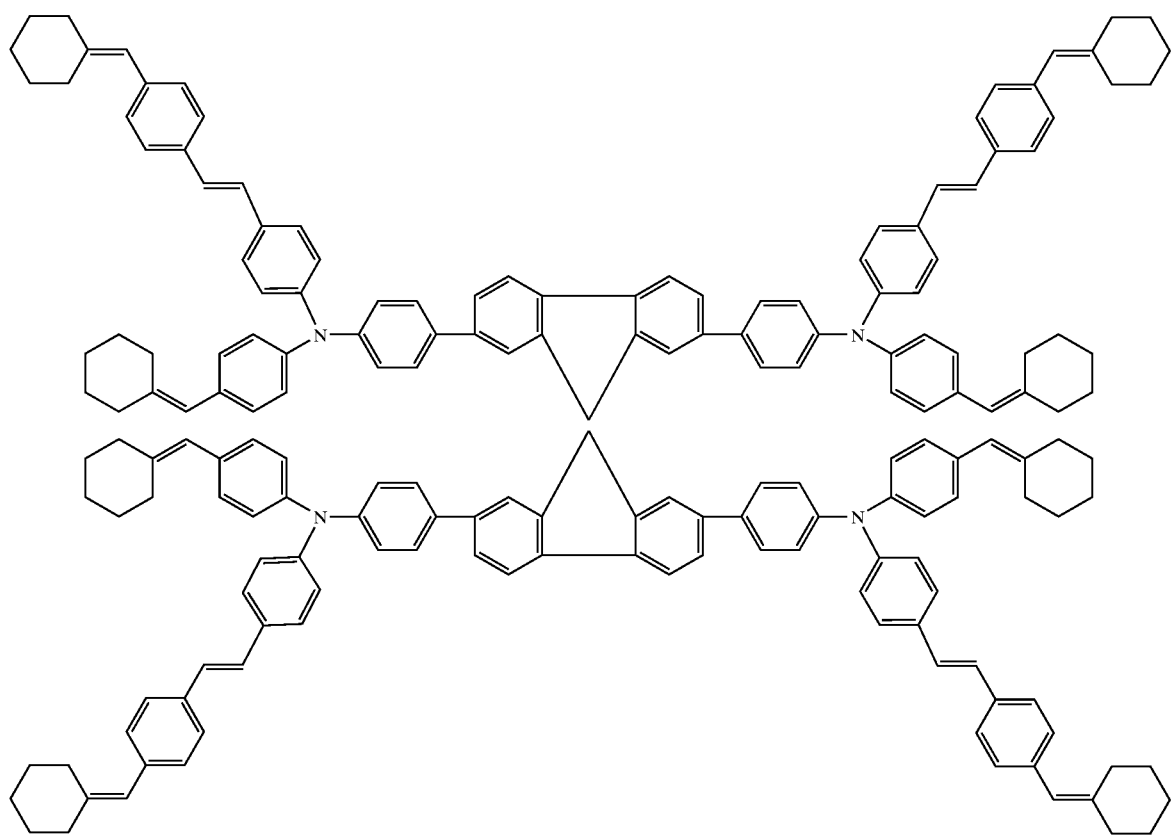
(94)
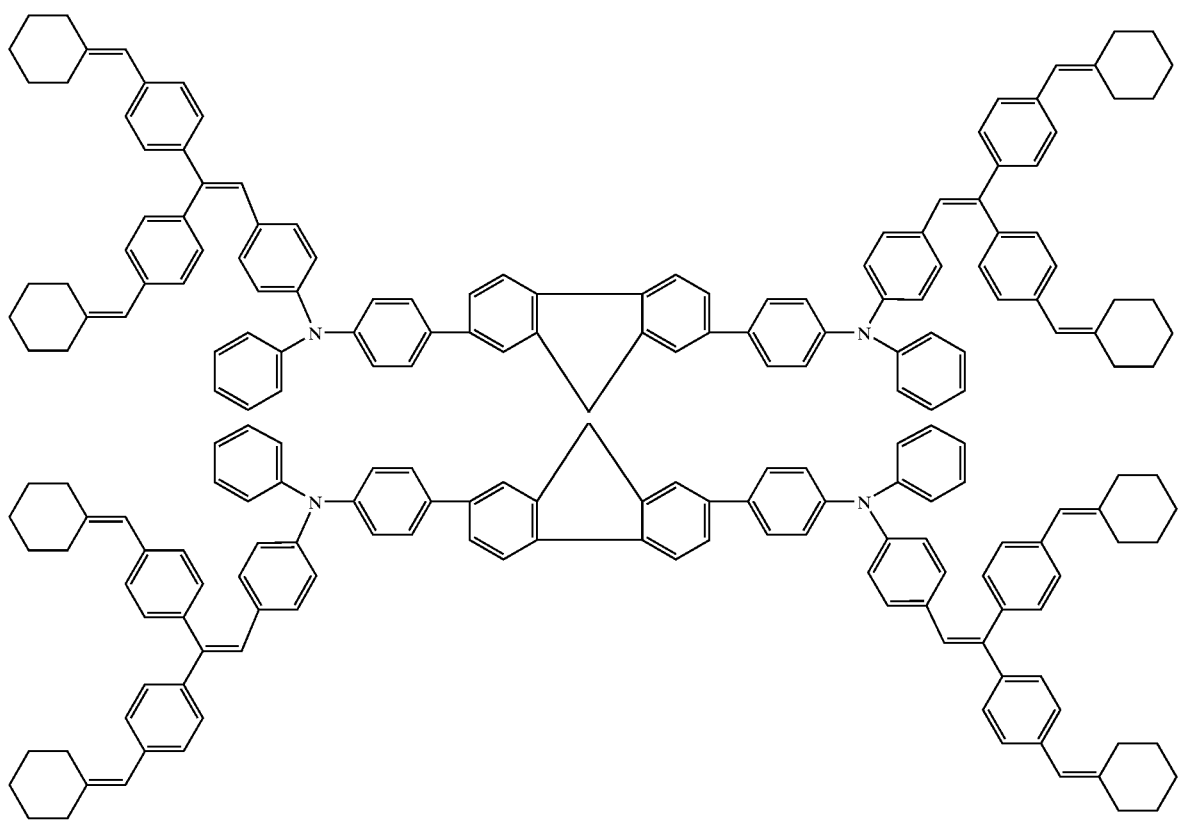
(95)

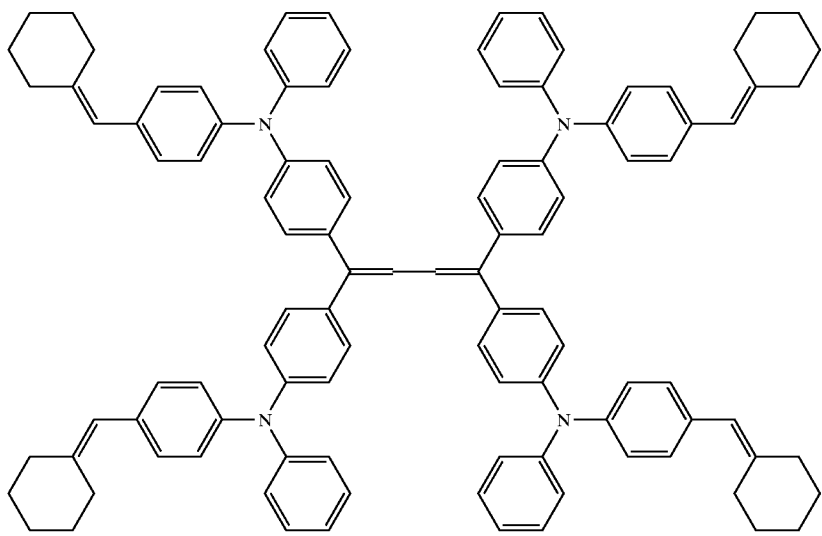
(96)
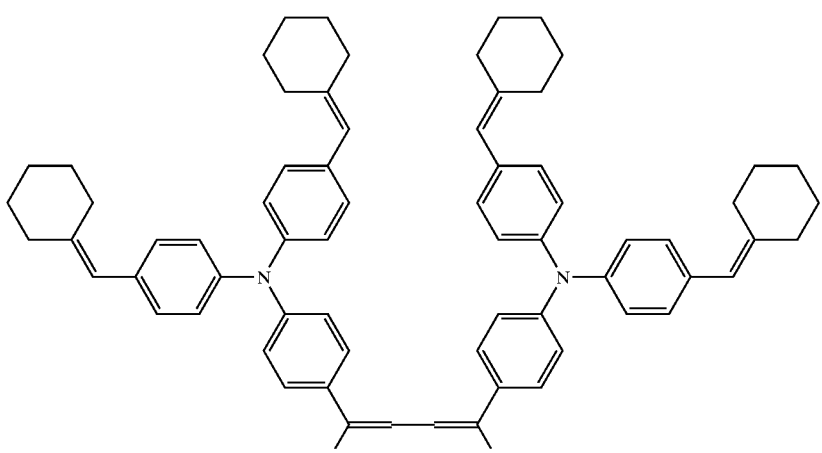
(97)
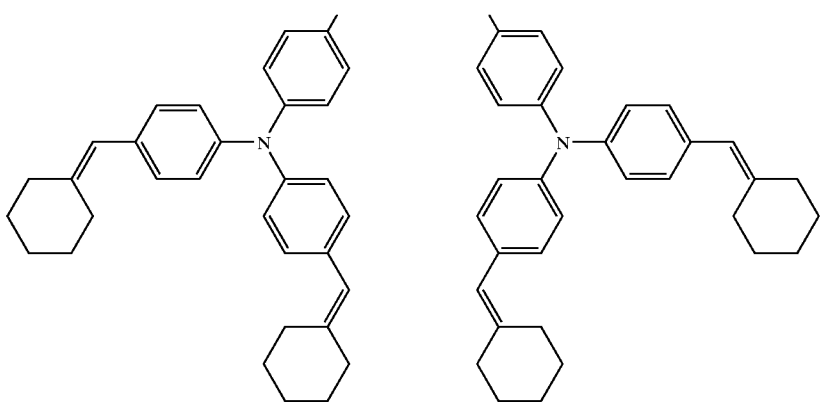

-continued
(98)
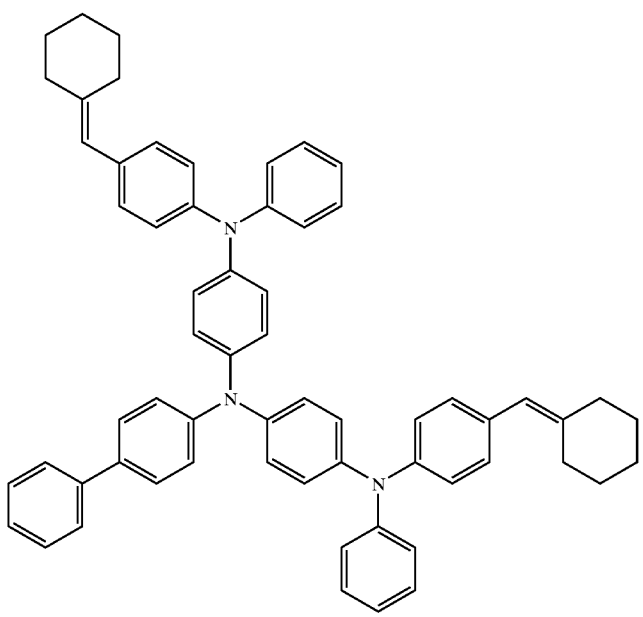
(99)
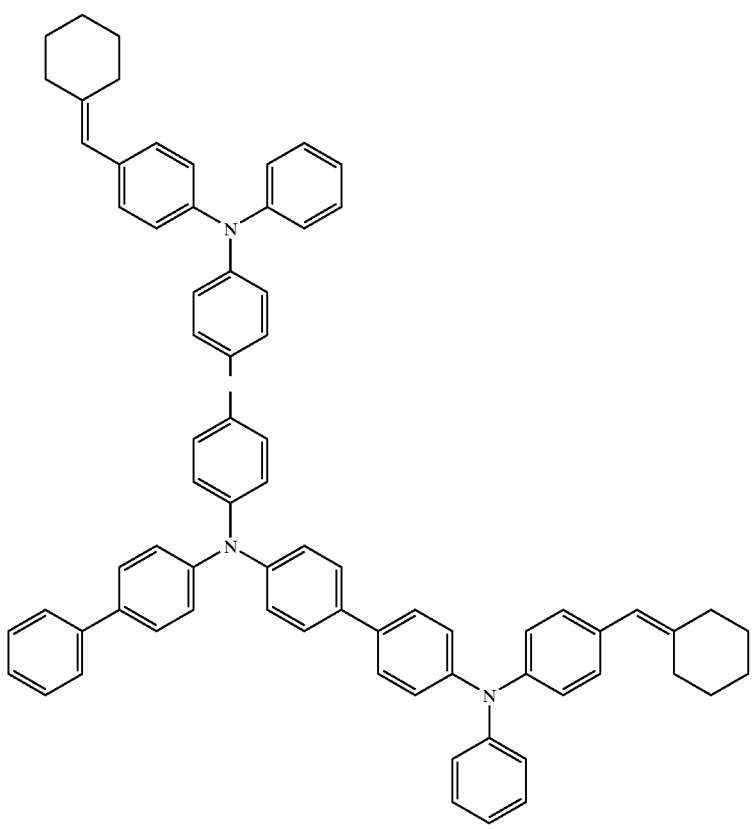

-continued

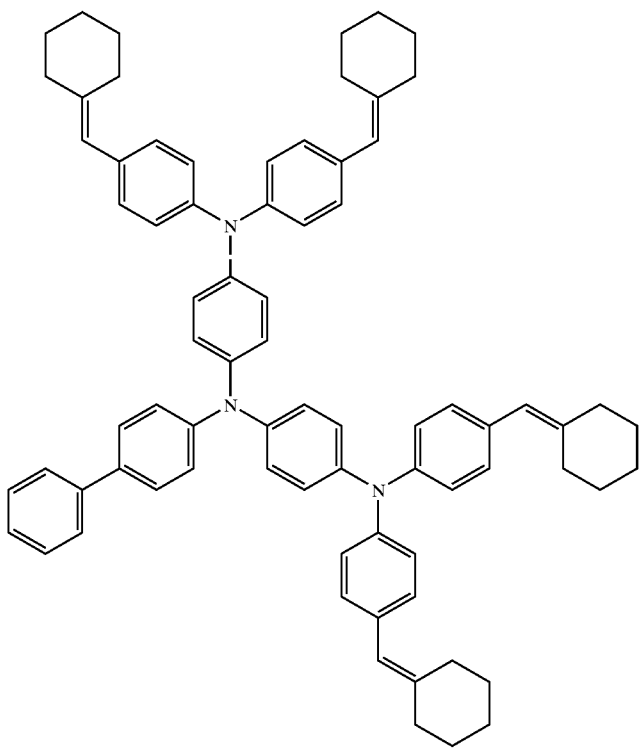

(100)

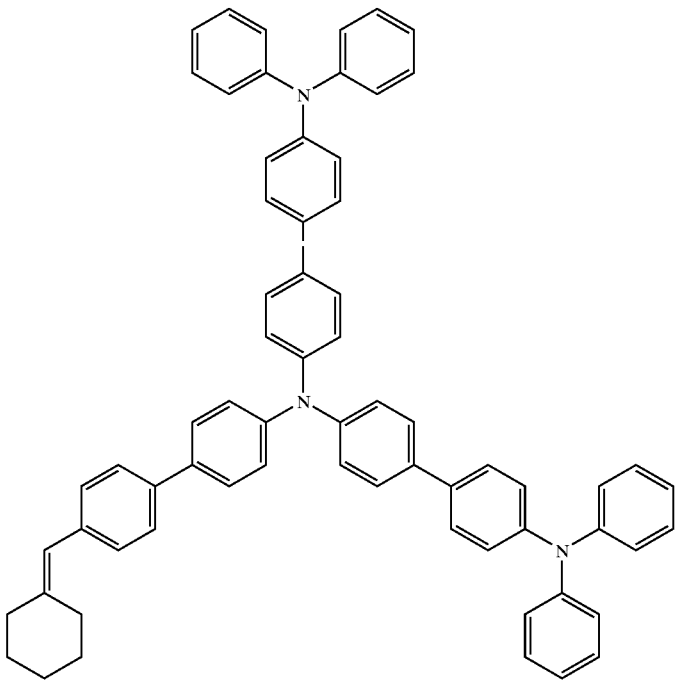

(101)

A structure of the organic electroluminescent device (organic EL device) according to the present invention will be described below. The organic EL device of the present invention comprises one or more organic thin film layers placed between an anode and a cathode. The organic thin film layer comprises a light-emitting layer.

FIGS. 1 to 4 are schematic sectional views illustrating an organic EL device according to the present invention in which similar reference numerals depicts like components and parts. In FIGS. 1 to 4, the organic EL device comprises a substrate 1, an anode 2, a hole transporting layer 3, a light-emitting layer 4, an electron transporting layer 5, and a cathode 6. The light-emitting layer 4, the electron transporting layer 5 and the cathode 6 are organic thin film layers.

Figure 2:
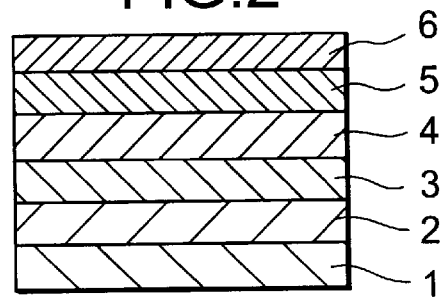
FIG. 2 is a schematic sectional view illustrating another example of an organic electroluminescent device of the present invention.
Figure 3:
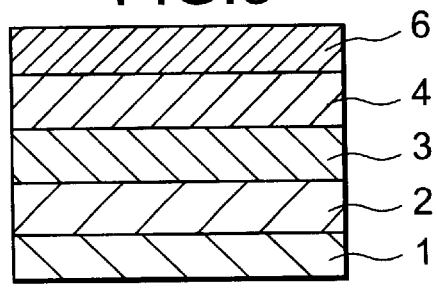
FIG. 3 is a schematic sectional view illustrating another example of an organic electroluminescent device of the present invention.
Figure 4:
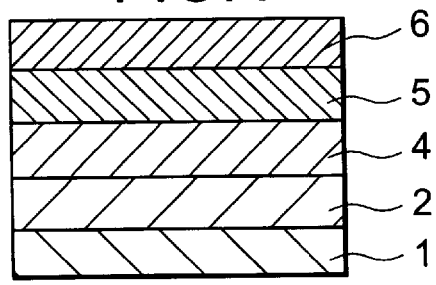
FIG. 4 is a schematic sectional view illustrating another example of an organic electroluminescent device of the present invention.

The basic configuration of the organic EL device according to the present invention is formed of the substrate 1 on which the anode 2, the light-emitting layer 4, and the cathode 6 are laminated in this order as shown in FIGS. 1 to 4. The organic EL device of the present invention may have any one of the device structures in which:

only the light-emitting layer 4 is sandwiched between the anode 2 and the cathode 6 as shown in FIG. 1;

the hole transporting layer 3 and the electron transporting layer 5 are provided between the anode 2 and the luminescent layer 4 and between the light-emitting layer 4 and the cathode 6, respectively, as shown in FIG. 2;

the hole transporting layer 3 is provided between the anode 2 and the light-emitting layer 4 but no electron transporting layer is provided between the light-emitting layer 4 and the cathode 6, as shown in FIG. 3;

the electron transporting layer 5 is provided between the light-emitting layer 4 and the cathode 6 but no hole transporting layer is provided between the anode 2 and the light-emitting layer 4, as shown in FIG. 4.

In the organic EL device of the present invention, the compounds having at least cyclohexylidenemethine group, that is, the compounds represented by the general formulae [A] through [F], are contained alone or as a mixture in at least one organic thin film layer (hole transporting layer 3, light-emitting layer 4, and electron transporting layer 5) laminated between the anode 2 and the cathode 6.

The compound in this invention can be applied to any of the above organic thin film layers, and can be added as a dopant in another hole-transporting, light-emitting or electron-transporting material.

A light-emitting material used in the present invention is not specifically limited, and any compounds typically used as a light-emitting material can be used. Examples of such compounds include low-molecular-weight light-emitting materials such as the following tris(8-quinolinol)aluminum complex (Alq$^3$) [101'], bisdiphenylvinylbiphenyl (BDPVBi) [102], 1,3-bis(p-t-butylphenyl-1,3,4-oxadiazolyl)phenyl (OXD-7) [103], N,N-bis(2,5-di-t-butylphenyl) perylenetetracarboxylic diimide (BPPC) [104], 1,4-bis[N-p-tolyl-N-4-(4-methylstyryl)phenylamino]naphthalene [105]. In addition, polymer light-emitting materials may also be used such as polyphenylene vinylene polymers. Alternatively, a mixture in which a charge transporting material is doped with a fluorescent material can also be used as alight-emitting material. For example, a layer in which a quinolinol metal complex such as the Alq$^3$ [101'] is doped with a quinacridone derivative such as 4-dicyanomethylene-2-methyl-6-(p-dimethylaminostyryl)-4H-pyran (DCM) [106] or a coumarin derivative such as 3-(2'-benzothiazole)-7-diethylaminocoumarin [108] can be used. A layer in which an electron transporting material such as bis(2-methyl-8-hydroxyquinoline)-4-phenylphenol aluminum complex [109] is doped with a condensed polycyclic aromatic compound such as perylene [110]. Furthermore, a layer in which a hole transporting material such as 4,4'-bis (m-tolylphenylamino)biphenyl (TPD) [111] is doped with rubrene [112]can also be used.

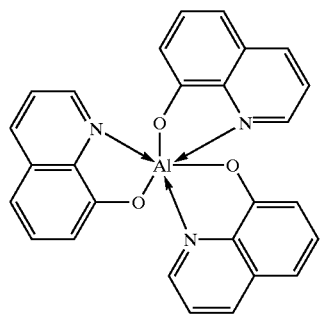

(101')

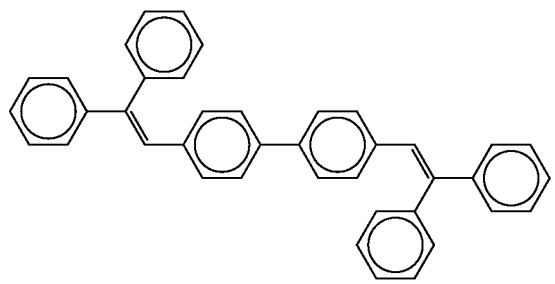

(102)

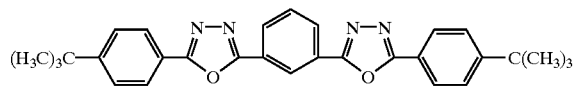

(103)

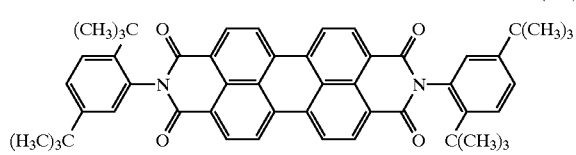

(104)

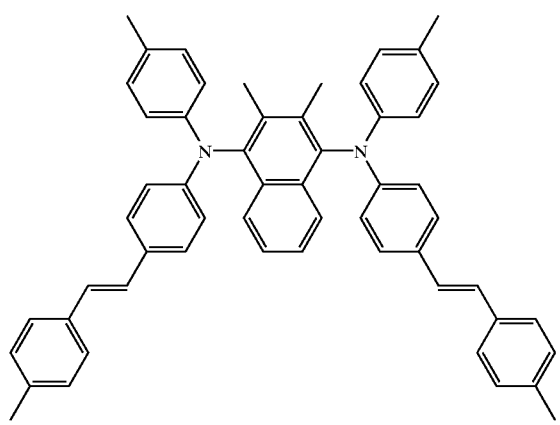

(105)

(106)
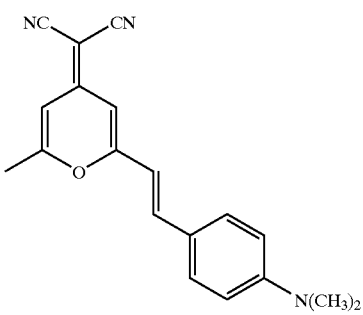

(107)
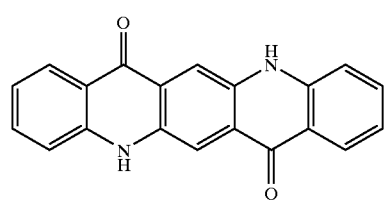

(108)
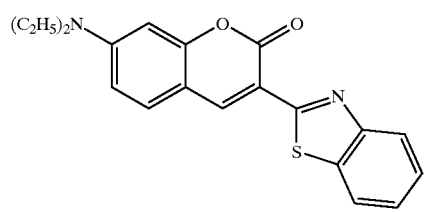

(109)
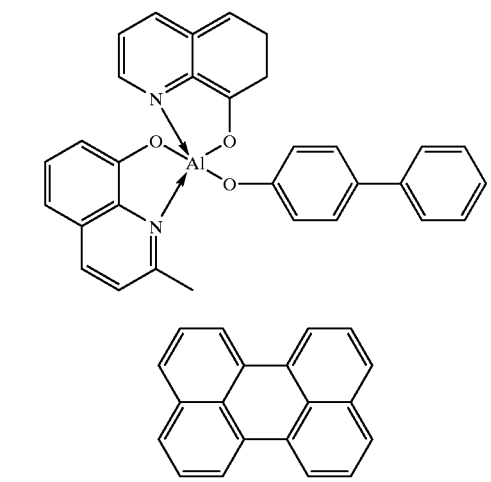

(110)
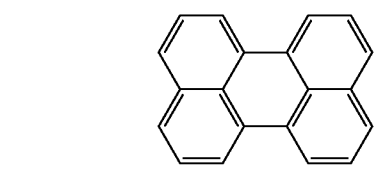

(111)

(112)
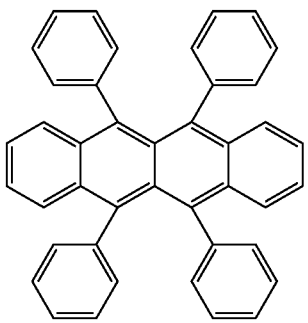

The hole transporting material used in the present invention is not specifically limited, and any compounds ordinary used as a hole transporting material can be used. Examples thereof include triphenyldiamines such as bis(di(p-tolyl)aminophenyl)-1,1-cyclohexane [113], N,N'-diphenyl-N,N'-bis (3-methylphenyl)-1,1'-biphenyl-4,4'-diamine [114], and N,N'-diphenyl-N-N-bis (1-naphthyl)-(1,1'-biphenyl)-4,4'-diamine [115], as well as star burst form molecules [116] to [118].

(113)
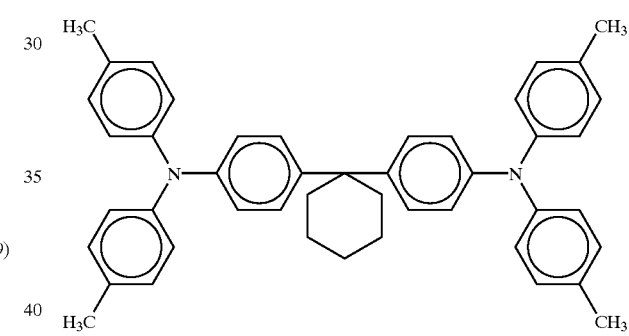

(114)
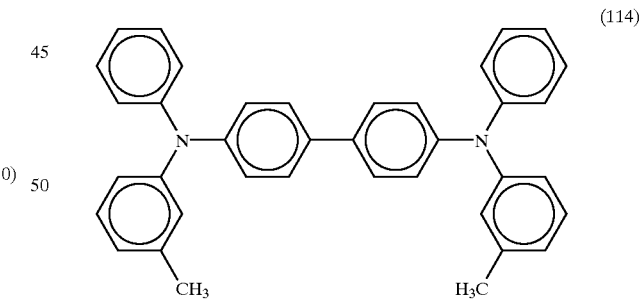

(115)
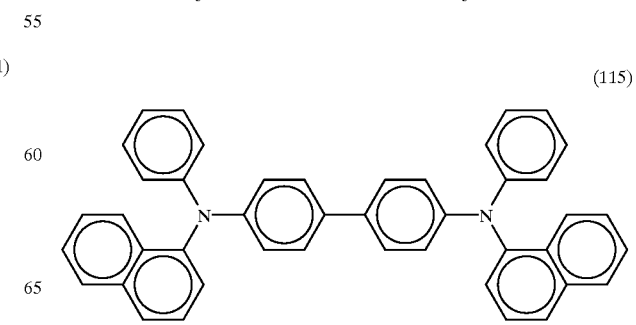

(116)
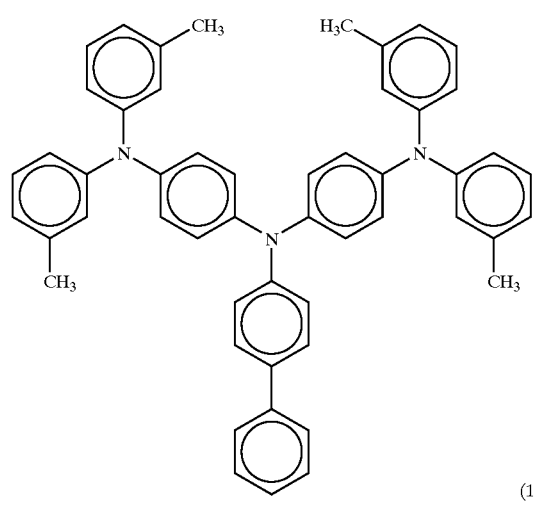

(118)
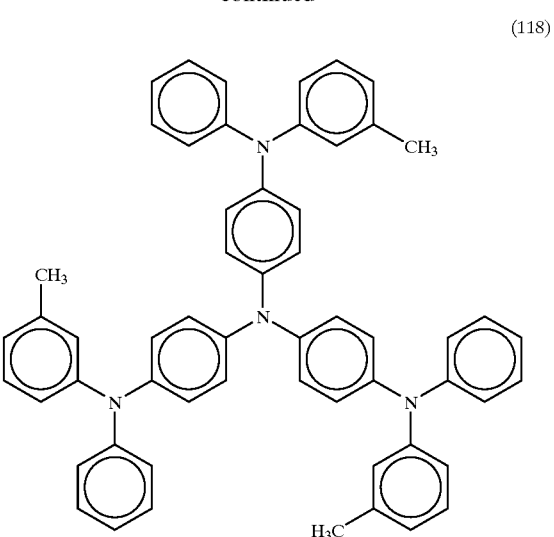

(117)
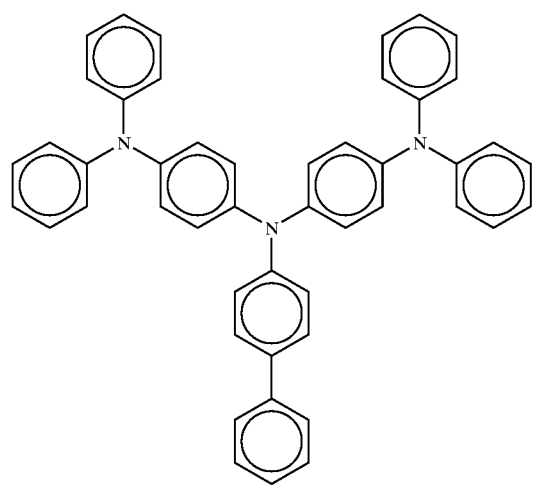

The electron transporting material used in the present invention is not specifically limited, and any compounds ordinary used as an electron transporting material may be used. Examples thereof include oxadiazole derivatives such as 2-(4-biphenylyl)-5-(4-t-butylphenyl)-1,3,4-oxadiazole [119], and bis{2-(4-t-butylphenyl)-1,3,4-oxadiazole}-m-phenylene [120], triazole derivatives [121] and [122], and quinolinol-based metal complexes [123] to [127].

(119)
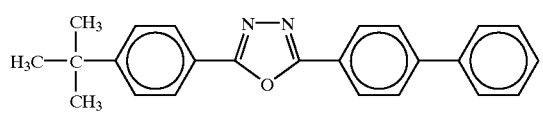

(120)
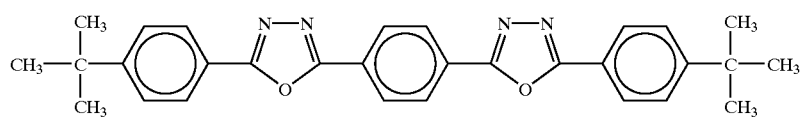

(121)
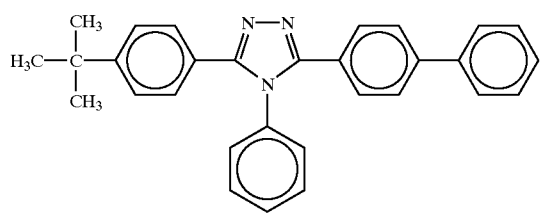

(122)
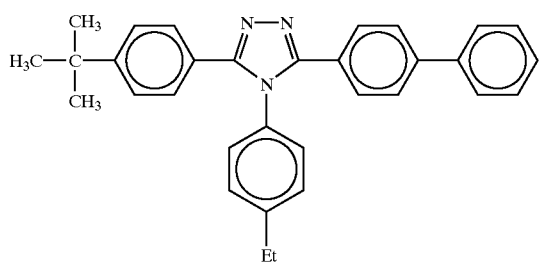

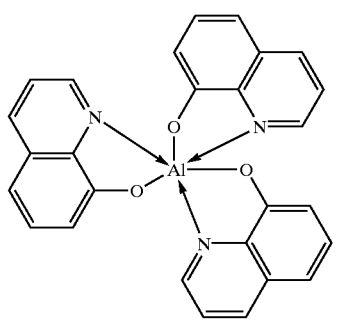

(123)

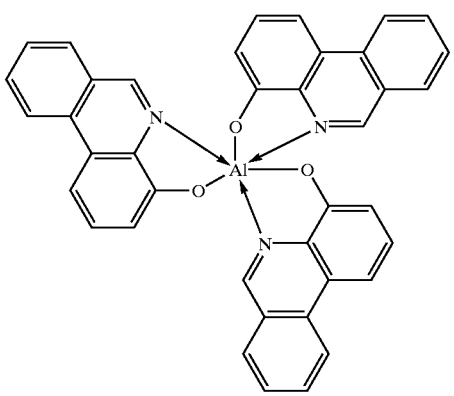

(124)

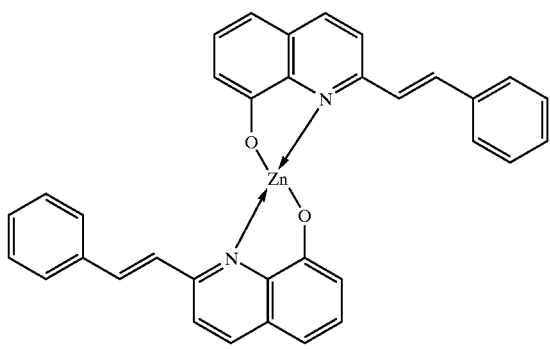

(125)

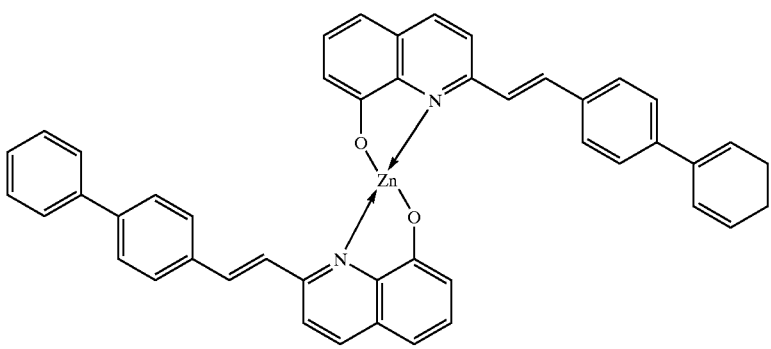

(126)

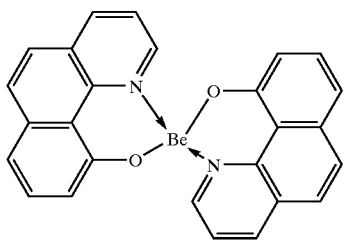

(127)

The anode 2 in the organic EL device of the present invention plays a role in injecting a hole into a hole-transporting layer or light-emitting layer, and it is effective that the anode has a work function of 4.5 eV or greater. Specific examples of the anode material for this purpose include indium tin oxide (ITO) alloy, tin oxide (NESA), gold, silver, platinum, and copper.

Further, it is preferable that the cathode 6 is made of a material having a smaller work function for the purpose of injecting an electron into an electron transporting layer or a light-emitting layer. There is no particular limitation imposed on cathode material and examples thereof include indium, aluminum, magnesium, magnesium-indium alloys, magnesium-aluminum alloys, aluminum-lithium alloys, aluminum-scandium-lithium alloys, and magnesium-silver alloys.

A method for forming each layer in the organic EL device of the present invention is not specifically limited and any one of known methods can be used. For example, the organic thin film layers in the organic EL device of the present invention can be formed by dipping, spin coating, casting, bar coating, and roll coating with a solution of the compound(s) of the present invention in a solvent. Alternatively, the organic thin film layers in the organic EL device of the present invention can be formed by vacuum deposition or molecular beam epitaxy (MBE) that should not be applied conventionally because of insufficient deposition rate or inability to deposit films when a compound expected to have a strong intermolecular interaction is used. The film thickness of each organic thin film layer is not specifically limited. However, it is preferable that the thickness is from several nm to 1 micrometer. When the film is too thin, defects such as pin holes trend to occur. When the film is too thick, on the oher hand, a high-applied voltage is requred, which tend to deteriorate the efficiency.

It is preferable that the organic thin film layer adjacent to the cathode 6 contains a metal at the interface with the cathode 6. Examples of the metal used for this purpose include, but not limited to, the metals and alloys available for the cathode 6, cesium, lithium, beryllium, magnesium, and calcium.

With the above-mentioned configuration, it is possible to provide an organic EL device capable of having improved light-emitting properties such as luminance and luminous efficiencies without limiting a process used for the film deposition. Among the organic EL devices shown in FIGS. 1 to 4, the present invention is particularly suitable for the one having the luminescent layer 4 adjacent to the anode 2.

When the luminescent layer 4 is adjacent to the anode 2, it is preferable that the anode 2 has been exposed to ultraviolet light at a wavelength of lower than 200 nm before fabrication of the organic thin film layer. This treatment would provide better luminance properties. Any conventional lamps that can emit light at a wavelength of lower than 200 nm and at an intensity of 1 mW/cm$^2$ or higher. Examples of the lamp include, but not limited to, eximer (UV) lamps, eximer lasers, and deuterium lamps. The effect of the ultraviolet light exposure can be enhanced by wet cleaning, ozone cleaning, or oxygen plasma treatment to be performed beforehand.

EXAMPLES

The present invention will hereinafter be described in detail with reference to the following examples, but it should however be borne in mind that the present invention is not limited only to the following examples unless the spirit or scope of the invention is changed.

Synthesis Examples

Synthesis Example 1

Synthesis of N-4-cyclohexylidenemethine-phenyl-N-p-tolylamine

A reaction vessel was loaded with 4-bromobenzyl bromide and 1 equivalent of triethyl phosphite. The content of the chamber was heated to 140° C. for 6 hours with stirring. Excess triethyl phosphite was removed from the mixture by vacuum distillation to yield phosphorous acid-4-bromobenzyl diethylester. One equivalent of cyclohexanone and 1.2 equivalent of sodium hydride in a mixed solvent of toluene-dimethylsulfoxide were reacted with the phosphorous acid-4-bromobenzyl diethyl ester whith heating moderately.

The resultant reaction mixture was purified according to conventional method, whereby 4-cyclohexylidenemethinephenyl bromide was obtained. The 4-cyclohexylidenemethinephenyl bromide, 1 equivalent of p-toluidine, 1 equivalent of potassium carbonate, copper powder, and nitrobenzene were placed in a three neck flask and stirred at 200° C. for 30 hours. After completion of the reaction, toluene was added and inorganic compound were removed by filtration. Toluene and nitrobenzene were removed in by vacuum distillation. The residue was isolated and purified according to the standard protocol conventional method, whereby the target N-4-cyclohexylidenemethine-phenyl-N-p-tolylamine was obtained.

Synthesis Example 2

Synthesis of N-4-cyclohexylidenemethine-phenyl-N-4-(p-tolylvinyl)phenylamine

In a similar manner to the synthesis example 1 except for the use of 4-amino-4'-methylstilbene instead of p-toluidine to obtain the target N-4-cyclohexylidenemethine-phenyl-N-4-(p-tolylvinyl)phenylamine was obtained.

Synthesis Example 3

Synthesis of N-4-[4-(cyclohexylidenemethine)phenylvinyl]phenyl-N-p-tolylamine

In a similar manner to the synthesis example 1 except for the use of 4-bromo-4'-bromomethylstilbene instead of 4-bromobenzyl bromide, the target N-4-[4-(cyclohexylidenemethine)phenylvinyl]phenyl-N-p-tolylamine was obtained.

Synthesis Example 4

Synthesis of N-4-{2,2-bis[4-(cyclohexylidenemethine)phenyl]vinyl}phenyl-N-p-tolylamine In a similar manner to the synthesis example 1 except for the use of 4-[2,2-bis(4-bromomethylphenyl)vinyl]phenyl bromide instead of 4-bromobenzyl bromide and that triethyl phosphite, cyclohexanone, and sodium hydride were each used in the amount of 2 equivalent, the target N-4-{2,2-bis[4-(cyclohexylidenemethine)phenyl]vinyl}phenyl-N-p-tolylamine was obtained.

Synthesis Example 5

Synthesis of N-4-{2,2-bis[4-(cyclohexylidenemethine)phenyl]vinyl}phenyl-N-phenylamine In a similar manner to the synthesis example 1 except for the use of aniline was used in place of p-toluidine to obtain the target N-4-{2,2-bis[4-(cyclohexylidenemethine)phenyl]vinyl}phenyl-N-phenylamine was obtained.

Synthesis Example 6

Synthesis of Compound (1)

A three neck flask was loaded with 1,4-dibromonaphthalene, 2 equivalent of N-4-cyclohexylidenemethinephenyl-N-p-tolylamine, 2 equivalent of potassium carbonate, copper powder, and nitrobenzene and stirred at 200° C. for 30 hours. After completion of the reaction, toluene was added and inorganic compounds were removed by filtration. Toluene and nitrobenzene were removed by vacuum distellation. The residue was isolated and purified according to conventional method, the target compound (1) was obtained.

Synthesis Example 7

Synthesis of Compound (2)

In a similar manner to the synthesis example 6 except for the use of N-4-{4-(cyclohexylidenemethine)phenyl—

Synthesis Example 8

Synthesis of Compound (3)

In a similar manner to the synthesis example 6 except for the use of N-4-cyclohexylidenemethine-phenyl-N-4-(p-tolylvinyl)phenylamine instead of N-4-cyclohexylidenemethinephenyl-N-p-tolylamine to obtain the target compound (3) was obtained.

Synthesis Example 9

Synthesis of Compound (4)

In a similar manner to the synthesis example 6 except for the use of N-4-{2,2-bis[4-(cyclohexylidenemethine)phenyl]vinyl}phenyl-N-p-tolylamine instead of N-4-cyclohexylidenemethinephenyl-N-p-tolylamine to obtain the target compound (4) was obtained.

Synthesis Example 10

Synthesis of Compound (5)

In a similar manner to the synthesis example 6 except for the use of N-4-{2,2-bis[4-(cyclohexylidenemethine)phenyl]vinyl}phenyl-N-phenylamine instead of N-4-cyclohexylidenemethinephenyl-N-p-tolylamine to obtain the target compound (5) was obtained.

Synthesis Example 11

Synthesis of Compound (6)

In a similar manner to the synthesis example 6 except for the use of 2,3-dimethyl-1,4-dibromonaphthalene instead of 1,4-dibromonaphthalene to obtain the target compound (6) was obtained.

Synthesis Example 12

Synthesis of Compound (7)

In a similar manner to the synthesis example 11 except for the use of N-4-{4-(cyclohexylidenemethine)phenyl—]vinyl}phenyl-N-p-tolylamine instead of N-4-cyclohexylidenemethinephenyl-N-p-tolylamine to obtain the target compound (7) was obtained.

Synthesis Example 13

Synthesis of Compound (9)

In a similar manner to the synthesis example 11 except for the use of N-4-{2,2-bis[4-(cyclohexylidenemethine)phenyl]vinyl}phenyl-N-p-tolylamine instead of N-4-cyclohexylidenemethinephenyl-N-p-tolylamine to obtain the target compound (9) was obtained.

Synthesis Example 14

Synthesis of Compound (10)

In a similar manner to the synthesis example 6 except for the use of 9,10-dibromoanthracene instead of 1,4-dibromonaphthalene to obtain the target compound (10) was obtained.

Synthesis Example 15

Synthesis of Compound (11)

In a similar manner to the synthesis example 14 except for the use of N-4-{4-(cyclohexylidenemethine)phenyl—]vinyl}phenyl-N-p-tolylamine instead of N-4-cyclohexylidenemethinephenyl-N-p-tolylamine to obtain the target compound (11) was obtained.

Synthesis Example 16

Synthesis of Compound (13)

In a similar manner to the synthesis example 14 except for the use of N-4-{2,2-bis[4-(cyclohexylidenemethine)phenyl]vinyl}phenyl-N-p-tolylamine inatead of N-4-cyclohexylidenemethinephenyl-N-p-tolylamine to obtain the target compound (13) was obtained.

Synthesis Example 17

Synthesis of Compound (14)

In a similar manner to the synthesis example 6 except for the use of 6,13-dibromopentacene instead of 1,4-dibromonaphthalene to obtain the target compound (14) was obtained.

Synthesis Example 18

Synthesis of Compound (15)

In a similar manner to the synthesis example 17 except for the use of N-4-{4-(cyclohexylidenemethine)phenyl—]phenyl}phenyl-N-p-tolylamine instead of N-4-cyclohexylidenemethinephenyl-N-p-tolylamine to obtain the target compound (15) was obtained.

Synthesis Example 19

Synthesis of Compound (17)

In a similar manner to the synthesis example 17 except for the use of N-4-{2,2-bis[4-(cyclohexylidenemethine)phenyl]vinyl}phenyl-N-p-tolylamine instead of N-4-cyclohexylidenemethinephenyl-N-p-tolylamine to obtain the target compound (17) was obtained.

Synthesis Example 20

Synthesis of Compound (18)

In a similar manner to the synthesis example 6 except for the use of 3,9-dibromoperylene instead of 1,4-dibromonaphthalene to obtain the target compound (18) was obtained.

Synthesis Example 21

Synthesis of Compound (19)

In a similar manner to the synthesis example 20 except for the use of N-4-{4-(cyclohexylidenemethine)phenyl—]vinyl}phenyl-N-p-tolylamine instead of N-4-cyclohexylidenemethinephenyl-N-p-tolylamine to obtain the target compound (19) was obtained.

Synthesis Example 22

Synthesis of Compound (21)

In a similar manner to the synthesis example 20 except for the use of N-4-{2,2-bis[4-(cyclohexylidenemethine)phenyl]vinyl}phenyl-N-p-tolylamine instead of N-4-cyclohexylidenemethinephenyl-N-p-tolylamine to obtain the target compound (21) was obtained.

Synthesis Example 23

Synthesis of Compound (22)

In a similar manner to the synthesis example 6 except for the use of dibromobenzo[a]perylene instead of 1,4-dibromonaphthalene to obtain the target compound (22) was obtained.

Synthesis Example 24

Synthesis of Compound (23)

In a similar manner to the synthesis example 22 except for the use of N-4-{4-(cyclohexylidenemethine)phenyl—]vinyl}phenyl-N-p-tolylamine instead of N-4-cyclohexylidenemethinephenyl-N-p-tolylamine to obtain the target compound (23) was obtained.

Synthesis Example 25

Synthesis of Compound (25)

In a similar manner to the synthesis example 22 except for the use of N-4-{2,2-bis[4-(cyclohexylidenemethine)phenyl]vinyl}phenyl-N-p-tolylamine instead of N-4-cyclohexylidenemethinephenyl-N-p-tolylamine to obtain the target compound (25) was obtained.

Synthesis Example 26

Synthesis of Compound (26)

The synthesis example 6 was repeated except that 8,16-dibromodibenzo[a,j]perylene was used in place of 1,4-dibromonaphthalene to obtain the target compound (26).

Synthesis Example 27

Synthesis of Compound (27)

In a similar manner to the synthesis example 26 except for the use of N-4-{4-(cyclohexylidenemethine)phenyl—]vinyl}phenyl-N-p-tolylamine instead of N-4-cyclohexylidenemethinephenyl-N-p-tolylamine to obtain the target compound (27) was obtained.

Synthesis Example 28

Synthesis of Compound (29)

In a similar manner to the synthesis example 26 except for the use of N-4-{2,2-bis[4-(cyclohexylidenemethine)phenyl]vinyl}phenyl-N-p-tolylamine instead of N-4-cyclohexylidenemethinephenyl-N-p-tolylamine to obtain the target compound (29) was obtained.

Synthesis Example 29

Synthesis of Compound (30)

In a similar manner to the synthesis example 6 except for the use of 7,14-dibromobisanthrene instead of 1,4-dibromonaphthalene to obtain the target compound (30) was obtained.

Synthesis Example 30

Synthesis of Compound (31)

In a similar manner to the synthesis example 29 except for the use of N-4-{4-(cyclohexylidenemethine)phenyl—]vinyl}phenyl-N-p-tolylamine instead of N-4-cyclohexylidenemethinephenyl-N-p-tolylamine to obtain the target compound (30) was obtained.

Synthesis Example 31

Synthesis of Compound (33)

In a similar manner to the synthesis example 29 except for the use of N-4-{2,2-bis[4-(cyclohexylidenemethine)phenyl]vinyl}phenyl-N-p-tolylamine instead of N-4-cyclohexylidenemethinephenyl-N-p-tolylamine to obtain the target compound (33) was obtained.

Synthesis Example 32

Synthesis of Compound (34)

In a similar manner to the synthesis example 6 except for the use of 10,10'-dibromo-9,9'-bianthryl instead of 1,4-dibromonaphthalene to obtain the target compound (34) was obtained.

Synthesis Example 33

Synthesis of Compound (35)

In a similar manner to the synthesis example 32 except for the use of N-4-{4-(cyclohexylidenemethine)phenyl—]vinyl}phenyl-N-p-tolylamine instead of N-4-cyclohexylidenemethinephenyl-N-p-tolylamine to obtain the target compound (35) was obtained.

Synthesis Example 34

Synthesis of Compound (37)

In a similar manner to the synthesis example 32 except for the use of N-4-{2,2-bis[4-(cyclohexylidenemethine)phenyl]vinyl}phenyl-N-p-tolylamine instead of N-4-cyclohexylidenemethinephenyl-N-p-tolylamine to obtain the target compound (37) was obtained.

Synthesis Example 35

Synthesis of Compound (38)

In a similar manner to the synthesis example 6 except for the use of 9,10-bis(4-bromo-1-naphthyl)anthracene instead of 1,4-dibromonaphthalene to obtain the target compound (38) was obtained.

Synthesis Example 36

Synthesis of Compound (39)

In a similar manner to the synthesis example 35 except for the use of N-4-{4-(cyclohexylidenemethine)phenyl—]vinyl}phenyl-N-p-tolylamine instead of N-4-cyclohexylidenemethinephenyl-N-p-tolylamine to obtain the target compound (39) was obtained.

Synthesis Example 37

Synthesis of Compound (41)

In a similar manner to the synthesis example 37 except for the use of N-4-{2,2-bis[4-(cyclohexylidenemethine)phenyl]vinyl}phenyl-N-p-tolylamine instead of N-4-cyclohexylidenemethinephenyl-N-p-tolylamine to obtain the target compound (41) was obtained.

Synthesis Example 38

Synthesis of Compound (47)

A reaction vessel was loaded with 4-[2,2-bis(4-bromomethylphenyl)vinyl]phenyl bromide and 2 equivalent of triethyl phosphite. The content of the mixture was heated to 140° C. for 6 hours with stirring. Excess triethyl phosphite was removed from the mixture by vacuum distillation to yield a reaction intermediate. Two equivalent weights of cyclohexanone and 2.4 of sodium hydride in a mixed solvent of toluene-dimethylsulfoxide were reacted with the intermediate with heating moderately. The resultant reaction mixture was purified according to conventional method, whereby 4-[2,2-bis(4-cyclohexylidenemethinephenyl)vinyl] phenyl bromide was obtained.

This 4-[2,2-bis(4-cyclohexylidenemethinephenyl)vinyl] phenyl bromide was added gradually to dry tetrahydrofuran and 1 equivalent weight of magnesium ribbon with heating moderately. After the exothermic reaction was stopped, the mixture was refluxed for 5 hours. A small amount of bis(diphenylphosphinopropane)nickel dichloride and 1 equivalent of 4-[2,2-bis(4-cyclohexylidenemethinephenyl) vinyl]phenyl bromide were added to the mixture. The mixture was refluxed for 9 hours with stirring. After completion of the reaction, the mixture was isolated and purified according to conventional method, whereby the target compound (47) was obtained.

Synthesis Example 39

Synthesis of Compound (45)

1,1,4,4-tetrakis(4-methylphenyl)butadiene and 4 equivalent weights of N-bromosuccinimide in cyclohexane were refluxed for 30 hours with stirring. The resultant reaction solution was diluted with toluene, washed with water, and dried. It was purified according to conventional method, and 1,1,4,4-tetrakis(4-bromomethylphenyl)butadiene was obtained. The compound was placed in a reaction vessel along with 5 equivalent of triethyl phosphite and heated to 140° C. for 9 hours with stirring.

Excess triethyl phosphite was removed from the mixture by vacuum distillation to yield a reaction intermediate. Four equivalent of cyclohexanone and 5 equivalent of sodium hydride in dimethyl sulfoxide were reacted with the intermediate with heating moderately. The resultant reaction mixture was purified according conventional method, whereby the target compound (45) was obtained.

Synthesis Example 40

Synthesis of Compound (56)

4-[2,2-bis (4-cyclohexylidenemethinephenyl)vinyl] phenyl bromide was added gradually with heating moderately to dry tetrahydrofuran and 1 equivalent weight of magnesium ribbon. After the exothermic reaction was stopped, the mixture was refluxed for 5 hours. A small amount of bis(diphenylphosphinopropane)nickel dichloride and 0.5 equivalent weights of 9,10-dibromoanthracene were added. The mixture was refluxed for 30 hours with stirring. After completion of the reaction, the mixture was isolated and purified according to conventional method, whereby the target compound (56) was obtained.

Synthesis Example 41

Synthesis of Compound (77)

A reaction vessel was loaded with 4-bromo-4'-bromomethylstilbene and 1 equivalent of triethyl phosphite. The mixture was heated to 140° C. for 6 hours with stirring. Excess triethyl phosphite was removed from the mixture by vacuum distillation to yield a reaction intermediate, i.e., phosphite ester. One equivalent of cyclohexanone and 1.2 equivalent of sodium hydride in a mixed solvent of toluene-dimethylsulfoxide were reacted with the intermediate with heating moderately. The resultant reaction mixture was purified according to conventional method, whereby 4-(4-cyclohexylidenemethine styryl)phenyl bromide was obtained. This was introduced into a reaction vessel along with copper powder, copper chloride, and ammonium and reacted at 200° C. for 40 hours. The resultant reaction product was purified according to conventional method to obtain the target compound (77) was obtained.

Synthesis Example 42

Synthesis of Compound (78)

A reaction vessel was loaded with 4-[2,2-bis(4-bromomethylphenyl)vinyl]phenyl bromide and 2 equivalent of triethyl phosphite. The mixture was heated to 140° C. for 6 hours with stirring. Excess triethyl phosphite was removed from the mixture by vacuum distillation to yield a reaction intermediate, i.e., phosphite ester. Two equivalent weights of cyclohexanone and 2.4 equivalent weights of sodium hydride in a mixed solvent of toluene-dimethylsulfoxide were reacted with the intermediate with heating moderately. The resultant reaction mixture was purified according to conventional method. It was introduced into a reaction vessel along with copper powder, copper chloride, and ammonium and reacted at 200° C. for 40 hours. The resultant reaction product was purified according to conventional method, whereby to obtain the target compound (78) was obtained.

Synthesis Example 43

Synthesis of Compound (81)

A reaction vessel was loaded with alpha-chloro-4-bromotoluene and 1 equivalent of triethyl phosphite. The mixture was heated to 140° C. for 6 hours with stirring. Excess triethyl phosphite was removed from the mixture by vacuum distillation to yield a reaction intermediate, i.e., phosphite ester. One equivalent weight of cyclohexanone and 1.2 equivalent of sodium hydride in a mixed solvent of toluene-dimethylsulfoxide were reacted with the intermediate with heating moderately. The resultant reaction mixture was purified according to conventional method, whereby 4-cyclohexylidenemethinephenyl bromide was obtained. It was introduced into a reaction vessel along with copper powder, potassium carbonate, 3-methylaniline, and nitrobenzene and reacted at 200° C. for 40 hours. The resultant reaction product was purified according to conventional method to obtain N-4-cyclohexylidenemethinephenyl-N-3-methylphenylamine. It was reacted at 200° C. for 40 hours along with tris(4-bromophenyl)amine, copper powder, potassium carbonate, and nitrobenzene. The resultant reaction product was purified according to conventional method, whereby the target compound (81) was obtained.

Synthesis Example 44

Synthesis of Compound (82)

In a similar manner to the synthesis example 43 except for the use of 4-bromo-4'-bromomethylstilbene instead of alpha-chloro-4-bromotoluene to obtain the target compound (82) was obtained.

Synthesis Example 45

Synthesis of Compound (84)

A reaction vessel was loaded with tris(4-chloromethylphenyl)amine and 3 equivalent of triethyl phosphite. The mixture was heated to 140° C. for 6 hours with stirring. Excess triethyl phosphite was removed from the mixture by vacuum distillation to yield a reaction intermediate, i.e., phosphite ester. Three equivalent of N-bis (4-cyclohexylidene methylphenyl)-N-4-formylphenylamine and 3.6 equivalent of sodium hydride in a mixed solvent of toluene-dimethylsulfoxide were reacted with the intermediate with heating moderately. The resultant reaction mixture was purified according to conventional method, whereby the target compound (84) was obtained.

Synthesis Example 46

Synthesis of Compound (87)

N-4-cyclohexylidenemethinephenyl-N-phenylamine was reacted with 1,3,5-tribromobenzene along with copper powder, potassium carbonate, and nitrobenzene at 200° C. for 40 hours. The resultant reaction mixture was purified according to conventional method, whereby the target compound (87) was obtained.

Synthesis Example 47

Synthesis of Compound (91)

2,2',7,7'-tetrabromo-9,9'-spirobifluorene and N-4-cyclohexylidenemethinephenyl-N-phenylamine were refluxed for 40 hours along with palladium acetate, 2,2'-bis (diphenylphosphino)-1,1'-binaphthyl, sodium-t-butoxide, and xylene. The resultant reaction mixture was purified according to conventional method, whereby the target compound (91) was obtained.

Synthesis Example 48

Synthesis of Compound (92)

2,2',7,7'-tetrakis(4-bromophenyl)-9,9'-spirobifluorene and N-4-cyclohexylidenemethinephenyl-N-phenylamine were refluxed for 40 hours along with palladium acetate, 2,2'-bis(diphenylphosphino)-1,1'-binaphthyl, sodium-t-butoxide, and xylene. The resultant reaction mixture was purified according to conventional method, whereby the target compound (92) was obtained.

Synthesis Example 49

Synthesis of Compound (98)

N-4-biphenylyl-N,N-bis(4-bromophenyl)amine and N-4-cyclohexylidenemethinephenyl-N-phenylamine were refluxed for 40 hours along with palladium acetate, 2,2'-bis (diphenylphosphino)-1,1'-binaphthyl, sodium-t-butoxide, and xylene. The resultant reaction mixture was purified according to conventional method, whereby the target compound (98) was obtained.

Synthesis Example 50

Synthesis of Compound (99)

N-4-biphenylyl-N,N-bis(4'-bromo-4-biphenylyl)amine and N-4-cyclohexylidenemethinephenyl-N-phenylamine were refluxed for 40 hours along with palladium acetate, 2,2'-bis(diphenylphosphino)-1,1'-binaphthyl, sodium-t-butoxide, and xylene. The resultant reaction mixture was purified according to conventional method, whereby the target compound (99) was obtained.

In the following Examples 1 to 189, an organic thin film layer for the organic EL devices of the present invention were formed by using the compounds synthesized as described above, in which an organic thin film was made of these compounds alone, or as a mixture with a hole transporting material or with an electron transporting material.

Example 1

An organic EL device having the structure shown in FIG. 1 was made. On a glass substrate, a film of ITO was formed by sputtering with a sheet resistance of 20 Ω/□, which was used as an anode. On the anode, 40 nm thick light-emitting layer was formed by vacuum deposition of Compound (1). Next, 200 nm thick cathode was formed by vacuum deposition of magnesium-silver alloy. The organic EL device was thus made. When a dc voltage of 5 V was applied to this device, light emission of 90 cd/m$^2$ was obtained.

Example 2

An organic EL device of Example 2 of the present invention was fabricated similarly to Example 1 except that the compound (2) was used as the light emitting material. When a dc voltage of 5 V was applied to this organic EL device, light emission of 110 cd/m$^2$ was obtained.

Example 3

An organic EL device of Example 3 of the present invention was fabricated similarly to Example 1 except that the compound (3) was used as the light emitting material. When a dc voltage of 5 V was applied to this organic EL device, light emission of 100 cd/m$^2$ was obtained.

Example 4

An organic EL device of Example 4 of the present invention was fabricated similarly to Example 1 except that the compound (4) was used as the light emitting material. When a dc voltage of 5 V was applied to this organic EL device, light emission of 140 cd/m$^2$ was obtained.

Example 5

An organic EL device of Example 5 of the present invention was fabricated similarly to Example 1 except that the compound (5) was used as the light emitting material. When a dc voltage of 5 V was applied to this organic EL device, light emission of 5 V was applied to this device, and luminescence of 120 cd/m$^2$ was obtained.

Example 6

An organic EL device of Example 6 of the present invention was fabricated similarly to Example 1 except that the compound (6) was used as the light emitting material. When a dc voltage of 5 V was applied to this organic EL device, light emission of 5 V was applied to this device, and luminescence of 80 cd/m$^2$ was obtained.

Example 7

An organic EL device of Example 7 of the present invention was fabricated similarly to Example 1 except that the compound (7) was used as the light emitting material. When a dc voltage of 5 V was applied to this organic EL device, light emission of 5 V was applied to this device, and luminescence of 130 cd/m$^2$ was obtained.

Example 8

An organic EL device of Example 8 of the present invention was fabricated similarly to Example 1 except that the compound (9) was used as the light emitting material. When a dc voltage of 5 V was applied to this organic EL device, light emission of 140 cd/m² was obtained.

Example 9

An organic EL device of Example 9 of the present invention was fabricated similarly to Example 1 except that the compound (10) was used as the light emitting material. When a dc voltage of 5 V was applied to this organic EL device, light emission of 110 cd/m² was obtained.

Example 10

An organic EL device of Example 10 of the present invention was fabricated similarly to Example 1 except that the compound (11) was used as the light emitting material. When a dc voltage of 5 V was applied to this organic EL device, light emission of 160 cd/m² was obtained.

Example 11

An organic EL device of Example 11 of the present invention was fabricated similarly to Example 1 except that the compound (13) was used as the light emitting material. When a dc voltage of 5 V was applied to this organic EL device, light emission of 200 cd/m² was obtained.

Example 12

An organic EL device of Example 12 of the present invention was fabricated similarly to Example 1 except that the compound (14) was used as the light emitting material. When a dc voltage of 5 V was applied to this organic EL device, light emission of 100 cd/m² was obtained.

Example 13

An organic EL device of Example 13 of the present invention was fabricated similarly to Example 1 except that the compound (15) was used as the light emitting material. When a dc voltage of 5 V was applied to this organic EL device, light emission of 140 cd/m² was obtained.

Example 14

An organic EL device of Example 14 of the present invention was fabricated similarly to Example 1 except that the compound (17) was used as the light emitting material. When a dc voltage of 5 V was applied to this organic EL device, light emission of 150 cd/m² was obtained.

Example 15

An organic EL device of Example 15 of the present invention was fabricated similarly to Example 1 except that the compound (18) was used as the light emitting material. When a dc voltage of 5 V was applied to this organic EL device, light emission of 90 cd/m² was obtained.

Example 16

An organic EL device of Example 16 of the present invention was fabricated similarly to Example 1 except that the compound (19) was used as the light emitting material. When a dc voltage of 5 V was applied to this organic EL device, light emission of 120 cd/m² was obtained.

Example 17

An organic EL device of Example 17 of the present invention was fabricated similarly to Example 1 except that the compound (21) was used as the light emitting material. When a dc voltage of 5 V was applied to this organic EL device, light emission of 130 cd/m² was obtained.

Example 18

An organic EL device of Example 18 of the present invention was fabricated similarly to Example 1 except that the compound (22) was used as the light emitting material. When a dc voltage of 5 V was applied to this organic EL device, light emission of 80 cd/m² was obtained.

Example 19

An organic EL device of Example 19 of the present invention was fabricated similarly to Example 1 except that the compound (23) was used as the light emitting material. When a dc voltage of 5 V was applied to this organic EL device, light emission of 100 cd/m² was obtained.

Example 20

An organic EL device of Example 20 of the present invention was fabricated similarly to Example 1 except that the compound (25) was used as the light emitting material. When a dc voltage of 5 V was applied to this organic EL device, light emission of 120 cd/m² was obtained.

Example 21

An organic EL device of Example 21 of the present invention was fabricated similarly to Example 1 except that the compound (26) was used as the light emitting material. When a dc voltage of 5 V was applied to this organic EL device, light emission of 100 cd/m² was obtained.

Example 22

An organic EL device of Example 22 of the present invention was fabricated similarly to Example 1 except that the compound (27) was used as the light emitting material. When a dc voltage of 5 V was applied to this organic EL device, light emission of 110 cd/m² was obtained.

Example 23

An organic EL device of Example 23 of the present invention was fabricated similarly to Example 1 except that the compound (29) was used as the light emitting material. When a dc voltage of 5 V was applied to this organic EL device, light emission of 130 cd/m² was obtained.

Example 24

An organic EL device of Example 24 of the present invention was fabricated similarly to Example 1 except that the compound (30) was used as the light emitting material. When a dc voltage of 5 V was applied to this organic EL device, light emission of 80 cd/m² was obtained.

Example 25

An organic EL device of Example 25 of the present invention was fabricated similarly to Example 1 except that the compound (31) was used as the light emitting material. When a dc voltage of 5 V was applied to this organic EL device, light emission of 100 cd/m² was obtained.

Example 26

An organic EL device of Example 26 of the present invention was fabricated similarly to Example 1 except that the compound (33) was used as the light emitting material. When a dc voltage of 5 V was applied to this organic EL device, light emission of 130 cd/m$^2$ was obtained.

Example 27

An organic EL device of Example 27 of the present invention was fabricated similarly to Example 1 except that the compound (34) was used as the light emitting material 7. When a dc voltage of 5 V was applied to this organic EL device, light emission of 110 cd/m$^2$ was obtained.

Example 28

An organic EL device of Example 28 of the present invention was fabricated similarly to Example 1 except that the compound (35) was used as the light emitting material 8. When a dc voltage of 5 V was applied to this organic EL device, light emission of 130 cd/m$^2$ was obtained.

Example 29

An organic EL device of Example 29 of the present invention was fabricated similarly to Example 1 except that the compound (37) was used as the light emitting material When a dc voltage of 5 V was applied to this organic EL device, light emission of 140 cd/m$^2$ was obtained.

Example 30

An organic EL device of Example 30 of the present invention was fabricated similarly to Example 1 except that the compound (38) was used as the light emitting material. When a dc voltage of 5 V was applied to this organic EL device, light emission of 100 cd/m$^2$ was obtained.

Example 31

An organic EL device of Example 23 of the present invention was fabricated similarly to Example 1 except that the compound (39) was used as the light emitting material. When a dc voltage of 5 V was applied to this organic EL device, light emission of 140 cd/m$^2$ was obtained.

Example 32

An organic EL device of Example 23 of the present invention was fabricated similarly to Example 1 except that the compound (41) was used as the light emitting material. When a dc voltage of 5 V was applied to this organic EL device, light emission of 150 cd/m$^2$ was obtained.

Example 33

On a glass substrate, a film of ITO was formed by sputtering with a sheet resistance of 20 Ω/□, which was used as an anode. On the anode, 40 nm thick light-emitting layer was formed by spin-coating method using chloroform solution of the compound (9). Next, 200 nm thick cathode was formed by vacuum deposition of magnesium-silver alloy. The organic EL device, When a dc voltage of 5 V was applied to this organic EL device, light emission of 90 cd/m$^2$ was obtained.

Example 34

An organic EL device having the structure shown in FIG. 2 was made. On a glass substrate, a film of ITO was formed by sputtering with a sheet resistance of 20 Ω/□, which was used as an anode. On the anode, 50 nm thick hole transporting layer was formed by vacuum deposition of N,N'-diphenyl-N,N'-bis(3-methylphenyl)-[1,1'-biphenyl]-4,4'-diamine [114] Next, 40 nm thick light-emitting layer was formed by vacuum deposition of Compound (1).

Subsequently, 50 nm thick electron transporting layer was formed by vacuum deposition of 2-(4-biphenylyl)-5-(4-t-butylphenyl)-1,3,4-oxadiazole [119]. Next, 200 nm thick cathode was formed by vacuum deposition of magnesium-silver alloy. The organic EL device was thus made. When a dc voltage of 10 V was applied to this organic EL device, light emission of 3,050 cd/m$^2$ was obtained.

Example 35

An organic EL device of Example 35 of the present invention was fabricated similarly to Example 34 except that the compound (2) was used as the light emitting material. When a dc voltage of 10 V was applied to this organic EL device, light emission of 3,870 cd/m$^2$ was obtained.

Example 36

An organic EL device of Example 36 of the present invention was fabricated similarly to Example 34 except that the compound (3) was used as the light emitting material. When a dc voltage of 10 V was applied to this organic EL device, light emission of 3,760 cd/m$^2$ was obtained.

Example 37

An organic EL device of Example 37 of the present invention was fabricated similarly to Example 34 except that the compound (4) was used as the light emitting material 7. When a dc voltage of 10 V was applied to this organic EL device, light emission of 4,620 cd/m$^2$ was obtained.

Example 38

An organic EL device of Example 38 of the present invention was fabricated similarly to Example 34 except that the compound (5) was used as the light emitting material. When a dc voltage of 10 V was applied to this organic EL device, light emission of 4,250 cd/m$^2$ was obtained.

Example 39

An organic EL device of Example 39 of the present invention was fabricated similarly to Example 34 except that the compound (6) was used as the light emitting material. When a dc voltage of 10 V was applied to this organic EL device, light emission of 3,120 cd/m$^2$ was obtained.

Example 40

An organic EL device of Example 40 of the present invention was fabricated similarly to Example 34 except that the compound (7) was used as the light emitting material. When a dc voltage of 10 V was applied to this organic EL device, light emission of 4,040 cd/m$^2$ was obtained.

Example 41

An organic EL device of Example 41 of the present invention was fabricated similarly to Example 34 except that the compound (9) was used as the light emitting material. When a dc voltage of 10 V was applied to this organic EL device, light emission of 4,890 cd/m$^2$ was obtained.

Example 42

An organic EL device of Example 42 of the present invention was fabricated similarly to Example 34 except that the compound (10) was used as the light emitting material. When a dc voltage of 10 V was applied to this organic EL device, light emission of 3,810 cd/m$^2$ was obtained.

Example 43

An organic EL device of Example 43 of the present invention was fabricated similarly to Example 34 except that the compound (11) was used as the light emitting material. When a dc voltage of 10 V was applied to this organic EL device, light emission of 4,430 cd/m$^2$ was obtained.

Example 44

An organic EL device of Example 44 of the present invention was fabricated similarly to Example 34 except that the compound (13) was used as the light emitting material. When a dc voltage of 10 V was applied to this organic EL device, light emission of 5,710 cd/m$^2$ was obtained.

Example 45

An organic EL device of Example 45 of the present invention was fabricated similarly to Example 34 except that the compound (14) was used as the light emitting material. When a dc voltage of 10 V was applied to this organic EL device, light emission of 3,140 cd/m$^2$ was obtained.

Example 46

An organic EL device of Example 46 of the present invention was fabricated similarly to Example 34 except that the compound (15) was used as the light emitting material. When a dc voltage of 10 V was applied to this organic EL device, light emission of 4,020 cd/m$^2$ was obtained.

Example 47

An organic EL device of Example 47 of the present invention was fabricated similarly to Example 34 except that the compound (17) was used as the light emitting material. When a dc voltage of 10 V was applied to this organic EL device, light emission of 4,360 cd/m$^2$ was obtained.

Example 48

An organic EL device of Example 48 of the present invention was fabricated similarly to Example 48 except that the compound (18) was used as the light emitting material. When a dc voltage of 10 V was applied to this organic EL device, light emission of 3,470 cd/m$^2$ was obtained.

Example 49

An organic EL device of Example 49 of the present invention was fabricated similarly to Example 34 except that the compound (19) was used as the light emitting material. When a dc voltage of 10 V was applied to this organic EL device, light emission of 4,270 cd/m$^2$ was obtained.

Example 50

An organic EL device of Example 50 of the present invention was fabricated similarly to Example 34 except that the compound (21) was used as the light emitting material. When a dc voltage of 10 V was applied to this organic EL device, light emission of 5,230 cd/m$^2$ was obtained.

Example 51

An organic EL device of Example 51 of the present invention was fabricated similarly to Example 34 except that the compound (22) was used as the light emitting material. When a dc voltage of 10 V was applied to this organic EL device, light emission of 2,960 cd/m$^2$ was obtained.

Example 52

An organic EL device of Example 52 of the present invention was fabricated similarly to Example 34 except that the compound (23) was used as the light emitting material. When a dc voltage of 10 V was applied to this organic EL device, light emission of 3,630 cd/m$^2$ was obtained.

Example 53

An organic EL device of Example 53 of the present invention was fabricated similarly to Example 34 except that the compound (25) was used as the light emitting material. When a dc voltage of 10 V was applied to this organic EL device, light emission of 4,370 cd/m$^2$ was obtained.

Example 54

An organic EL device of Example 54 of the present invention was fabricated similarly to Example 34 except that the compound (26) was used as the light emitting material. When a dc voltage of 10 V was applied to this organic EL device, light emission of 3,150 cd/m$^2$ was obtained.

Example 55

An organic EL device of Example 55 of the present invention was fabricated similarly to Example 34 except that the compound (27) was used as the light emitting material. When a dc voltage of 10 V was applied to this organic EL device, light emission of 4,110 cd/m$^2$ was obtained.

Example 56

An organic EL device of Example 56 of the present invention was fabricated similarly to Example 34 except that the compound (29) was used as the light emitting material. When a dc voltage of 10 V was applied to this organic EL device, light emission of 4,740 cd/m$^2$ was obtained.

Example 57

An organic EL device of Example 57 of the present invention was fabricated similarly to Example 34 except that the compound (30) was used as the light emitting material. When a dc voltage of 10 V was applied to this organic EL device, light emission of 2,860 cd/m$^2$ was obtained.

Example 58

An organic EL device of Example 58 of the present invention was fabricated similarly to Example 34 except that the compound (31) was used as the light emitting material. When a dc voltage of 10 V was applied to this organic EL device, light emission of 3,320 cd/m$^2$ was obtained.

Example 59

An organic EL device of Example 59 of the present invention was fabricated similarly to Example 34 except that the compound (33) was used as the light emitting material. When a dc voltage of 10 V was applied to this organic EL device, light emission of 4,210 cd/m$^2$ was obtained.

Example 60

An organic EL device of Example 60 of the present invention was fabricated similarly to Example 34 except that the compound (34) was used as the light emitting material. When a dc voltage of 10 V was applied to this organic EL device, light emission of 3,370 cd/m² was obtained.

Example 61

An organic EL device of Example 61 of the present invention was fabricated similarly to Example 34 except that the compound (35) was used as the light emitting material. When a dc voltage of 10 V was applied to this organic EL device, light emission of 4,250 cd/m² was obtained.

Example 62

An organic EL device of Example 62 of the present invention was fabricated similarly to Example 34 except that the compound (37) was used as the light emitting material. When a dc voltage of 10 V was applied to this organic EL device, light emission of 5,410 cd/m² was obtained.

Example 63

An organic EL device of Example 63 of the present invention was fabricated similarly to Example 34 except that the compound (38) was used as the light emitting material. When a dc voltage of 10 V was applied to this organic EL device, light emission of 3,290 cd/m² was obtained.

Example 64

An organic EL device of Example 64 of the present invention was fabricated similarly to Example 34 except that the compound (39) was used as the light emitting material. When a dc voltage of 10 V was applied to this organic EL device, light emission of 4,030 cd/m² was obtained.

Example 65

An organic EL device of Example 65 of the present invention was fabricated similarly to Example 34 except that the compound (41) was used as the light emitting material. When a dc voltage of 10 V was applied to this organic EL device, light emission of 4,970 cd/m² was obtained.

Example 66

An organic EL device of Example 66 of the present invention was fabricated similarly to Example 34 except that N,N'-diphenyl-N-N-bis(1-naphthyl)-1,1'-biphenyl)-4,4'-diamine [115] was used for the hole transporting layer and bis{2-(4-t-butylphenyl)-1,3,4-oxadiazole}-m-phenylene [120] was used for the electron transporting. When a dc voltage of 10 V was applied to this organic EL device, light emission of 3,130 cd/m² was obtained.

Example 67

An organic EL device of Example 67 of the present invention was fabricated similarly to Example 34 except that the compound [116], the compound (4), and the compound [123] were used for the hole transporting layer, the light-emitting layer, and the electron transporting layer, respectively, to make an organic EL device. When a dc voltage of 10 V was applied to this organic EL device, light emission of 3,930 cd/m² was obtained.

Example 68

An organic EL device of Example 68 of the present invention was fabricated similarly to Example 34 except that the compound [117], the compound (21), and the compound [124] were used for the hole transporting layer, the light-emitting layer, and the electron transporting layer, respectively, to make an organic EL device. When a dc voltage of 10 V was applied to this organic EL device, light emission of 4,260 cd/m² was obtained.

Example 69

An organic EL device having the structure shown in FIG. 2 was made. On a glass substrate, a film of ITO was formed by sputtering with a sheet resistance of 20 Ω/□, which was used as an anode. On the anode, 50 nm thick hole transporting layer was formed by vacuum co-deposited of the compound [115] and the compound (18) in a weight ratio of 1:10.

Subsequently, 2-(4-biphenylyl)-5-(4-t-butylphenyl)-1,3,4-oxadiazole [119] was vacuum deposited thereon as an electron transporting layer of 20 nm. A magnesium-silver alloy was subjected to vacuum deposition to form a film of 200 nm in thickness as a cathode. The organic EL device was thus made. When a dc voltage of 10 V was applied to this organic EL device, light emission of 3,700 cd/m² was obtained.

Example 70

An organic EL device of Example 70 of the present invention was fabricated similarly to Example 69 except that the compound (23) was used in place of the compound (18). When a dc voltage of 10 V was applied to this organic EL device, light emission of 3,690 cd/m² was obtained.

Example 71

An organic EL device of Example 71 of the present invention was fabricated similarly to Example 69 except that the compound (37) was used in place of the compound (18). When a dc voltage of 10 V was applied to this organic EL device, light emission of 5,010 cd/m² was obtained.

Example 72

An organic EL device having the structure shown in FIG. 4 was made. On a glass substrate, a film of ITO was formed by sputtering with a sheet resistance of 20 Ω/□, which was used as an anode. On the anode, 50 nm thick light-emitting layer was formed by vacuum co-deposited of N,N'-diphenyl-N-N-bis(1-naphthyl)-1,1'-biphenyl)-4,4'-diamine [115] and the compound (22) in a weight ratio of 1:10.

Subsequently, 50 nm thick electron transporting layer was formed by vacuum deposition of the compound [121]. Next, 200 nm thick cathode was formed by vacuum deposition of magnesium-silver alloy. The organic EL device was thus made. When a dc voltage of 10 V was applied to this organic EL device, light emission of 2,910 cd/m² was obtained.

Example 73

An organic EL device of Example 73 of the present invention was fabricated similarly to Example 72 except that the compound (27) was used in place of the compound (22). When a dc voltage of 10 V was applied to this organic EL device, light emission of 3,680 cd/m² was obtained.

Example 74

An organic EL device of Example 74 of the present invention was fabricated similarly to Example 72 except that the compound (37) was used in place of the compound (22). When a dc voltage of 10 V was applied to this organic EL device, light emission of 4,020 cd/m² was obtained.

Example 75

An organic EL device of Example 75 of the present invention was fabricated similarly to Example 72 except that the compound (41) was used in place of the compound (22). When a dc voltage of 10 V was applied to this organic EL device, light emission of 3,030 cd/m$^2$ was obtained.

Example 76

An organic EL device of Example 76 of the present invention was fabricated similarly to Example 72 except that the compound (18) was vacuum deposited as a light-emitting layer of 40 nm in thickness, thereby making an organic EL device. When a dc voltage of 10 V was applied to this organic EL device, light emission of 3,100 cd/m$^2$ was obtained.

Example 77

An organic EL device of Example 77 of the present invention was fabricated similarly to Example 72 except that the compound (7) was vacuum deposited as a light-emitting layer of 40 nm in thickness, thereby making an organic EL device. When a dc voltage of 10 V was applied to this organic EL device, light emission of 3,680 cd/m$^2$ was obtained.

Example 78

An organic EL device of Example 78 of the present invention was fabricated similarly to Example 72 except that the compound (21) was vacuum deposited as a light-emitting layer of 40 nm in thickness, thereby making an organic EL device. When a dc voltage of 10 V was applied to this organic EL device, light emission of 4,340 cd/m$^2$ was obtained.

Example 79

On a glass substrate, a film of ITO was formed by sputtering with a sheet resistance of 20 Ω/□, which was used as an anode. On the anode, 40 nm thick light-emitting layer was formed by spin-coating method using a chloroform solution containing mixture of the compound (12) and N,N'-diphenyl-N-N-bis(1-naphthyl)-1,1'-biphenyl)-4,4'-diamine [115] at a mole ratio of 1:10. Next, 50 nm thick electron transporting layer was formed by vacuum deposition of The compound [122]. Next, 200 nm thick cathode was formed by vacuum deposition of magnesium-silver alloy. The organic EL device was thus made. When a dc voltage of 10 V was applied to this organic EL device, light emission of 1,870 cd/m$^2$ was obtained.

Example 80

An organic EL device having the structure shown in FIG. 3 was made. On a glass substrate, a film of ITO was formed by sputtering with a sheet resistance of 20 Ω/□, which was used as an anode. On the anode, 50 nm thick hole transporting layer was formed by vacuum deposition of N,N'-diphenyl-N-N-bis(1-naphthyl)-1,1'-biphenyl)-4,4'-diamine [115]. Next, 50 nm thick light-emitting layer was formed by vacuum co-deposition of the compound [123] and the compound (10) in a weight ratio of 20:1. Next, 200 nm thick cathode was formed by vacuum deposition of magnesium-silver alloy. The organic EL device was thus made. When a dc voltage of 10 V was applied to this organic EL device, light emission of 3,070 cd/m$^2$ was obtained.

Example 81

An organic EL device of Example 81 of the present invention was fabricated similarly to Example 80 except that 50 nm thick light-emitting layer was formed by vacuum co-deposition of the compound [123] and the compound (19) in a weight ratio of 20:1. When a dc voltage of 10 V was applied to this organic EL device, light emission of 3,490 cd/m$^2$ was obtained.

Example 82

An organic EL device of Example 82 of the present invention was fabricated similarly to Example 81 except that the compound (33) was used in place of the compound (19). When a do voltage of 10 V was applied to this organic EL device, light emission of 3,740 cd/m$^2$ was obtained.

Example 83

An organic EL device of Example 83 of the present invention was fabricated similarly to Example 81 except that the compound (14) was used in place of the compound (19). When a dc voltage of 10 V was applied to this organic EL device, light emission of 2,870 cd/m$^2$ was obtained.

Example 84

An organic EL device of Example 84 of the present invention was fabricated similarly to Example 81 except that the compound (35) was used in place of the compound (19). When a dc voltage of 10 V was applied to this organic EL device, light emission of 3,550 cd/m$^2$ was obtained.

Example 85

An organic EL device of Example 85 of the present invention was fabricated similarly to Example 81 was repeated except that the compound (29) was used in place of the compound (19). When a dc voltage of 10 V was applied to this organic EL device, light emission of 3,890 cd/m$^2$ was obtained.

Example 86

An organic EL device of Example 81 of the present invention was fabricated similarly to Example 42 was repeated except that 50 nm thick light-emitting layer was formed by vacuum co-deposition of N,N'-diphenyl-N,N'-bis(3-methylphenyl)-[1,1'-biphenyl]-4,4'-diamine [114] was used for the hole transporting layer and that the compound [125] and the compound (41) were vacuum co-deposited at a ratio by weight of 20:1. When a dc voltage of 10 V was applied to this organic EL device, light emission of 3,990 cd/m$^2$ was obtained.

Example 87

An organic EL device of Example 87 of the present invention was fabricated similarly to Example 35 except that the compound (6) and the compound [125] were used for the hole transporting layer and the light-emitting layer, respectively, to make an organic EL device. When a dc voltage of 10 V was applied to this organic EL device, light emission of 1,120 cd/m$^2$ was obtained.

Example 88

An organic EL device of Example 88 of the present invention was fabricated similarly to Example 87 except that the compound (11) was used as a hole transporting material to make an organic EL device. When a dc voltage of 10 V was applied to this organic EL device, light emission of 1,550 cd/m$^2$ was obtained.

Example 89

An organic EL device of Example 89 of the present invention was fabricated similarly to Example 87 except that the compound (41) was used as a hole transporting material. A direct voltage of 10 V was applied to this device, and luminescence of 1,930 cd/m² was obtained.

Example 90

An organic EL device of Example 90 of the present invention was fabricated similarly to Example 34 except that N,N'-diphenyl-N-N-bis(1-naphthyl)-1,1'-biphenyl)-4,4'-diamine [115], the compound [125], and the compound (38) were used for the hole transporting layer, the light-emitting layer, and the electron transporting layer, respectively, to make an organic EL device. A direct voltage of 10 V was applied to this device, and luminescence of 800 cd/m² was obtained.

Example 91

An organic EL device of Example 91 of the present invention was fabricated similarly to Example 90 except that the compound (7) was used for the electron transporting layer. A direct voltage of 10 V was applied to this device, and luminescence of 940 cd/m² was obtained.

Example 92

An organic EL device of Example 92 of the present invention was fabricated similarly to Example 90 except that the compound (13) was used for the electron transporting layer. A direct voltage of 10 V was applied to this device, and luminescence of 960 cd/m² was obtained.

Example 93

On a glass substrate, a film of ITO was formed by sputtering with a sheet resistance of 20 Ω/□, which was used as an anode. The ITO substrate was washed with an alkali solution, and then with isopropyl alcohol. The washed ITO substrate was placed in a Xe₂ ultraviolet irradiator. It ITO was exporsed to ultraviolet light at 172 nm for 3 minutes. On the anode, 50 nm thick hole transporting layer was formed by vacuum deposition of N,N'-diphenyl-N,N'-bis(3-methylphenyl)-[1,1'-biphenyl]-4,4'-diamine [114]. Then, 40 nm thick light-emitting layer was formed by vacuum deposition of the compound (1).

Subsequently, 20 nm thick electron transporting layer was formed by vacuum deposition of 2-(4-biphenylyl)-5-(4-t-butylphenyl)-1,3,4-oxadiazole [119]. Next, 200 nm thick cathode was formed by vacuum deposition of magnesium-silver alloy. The organic EL device was thus made. When a dc voltage of 10 V was applied to this organic EL device, light emission of 5,630 cd/m² was obtained.

Example 94

On a glass substrate, a film of ITO was formed by sputtering with a sheet resistance of 20 Ω/□, which was used as an anode. The ITO substrate was washed with an alkali solution, and then with isopropyl alcohol. The washed ITO substrate was placed in a Xe₂ ultraviolet irradiator. It ITO was exporsed to ultraviolet ray was irradiated on the substrate at 172 nm for 3 minutes. On the anode, 50 nm thick light-emitting layer was formed by vacuum deposition of N,N'-diphenyl-N-N-bis(1-naphthyl)-1,1'-biphenyl)-4,4'-diamine [115] and the compound (37) were co-deposited thereon at a ratio by weight of 1:10.

Subsequently, 50 nm thick light-emitting layer was formed by vacuum deposition of the compound [121] was vacuum deposited as an electron transporting layer of 50 nm in thickness. Next, 200 nm thick cathode was formed by vacuum deposition of magnesium-silver alloy. When a dc voltage of 10 V was applied to this organic EL device, light emission of 4,960 cd/m² was obtained.

Example 95

On a glass substrate, a film of ITO was formed by sputtering with a sheet resistance of 20 Ω/□ which was used as an anode. The ITO substrate was washed with an alkali solution, and then with isopropyl alcohol. The washed ITO substrate was plated in a Xe₂ ultraviolet irradiator. Ultraviolet ray was irradiated on the substrate at 172 nm for 3 minutes. On the anode, 50 nm thick hole transporting layer was formed by vacuum deposition of The compound (21) was vacuum deposited thereon as a light-emitting layer of 50 nm in thickness.

Subsequently, 50 nm thick light-emitting layer was formed by vacuum deposition of the compound [121] was vacuum deposited as an electron transporting layer of 50 nm in thickness. A magnesium-silver alloy was subjected to vacuum deposition to form a film of 200 nm in thickness as a cathode. The organic EL device was thus made. Next, 200 nm thick cathode was formed by vacuum deposition of magnesium-silver alloy. When a dc voltage of 10 V was applied to this organic EL device, light emission of 5,330 cd/m² was obtained.

Example 96

On a glass substrate, a film of ITO was formed by sputtering with a sheet resistance of 20 Ω/□, which was used as an anode. On the anode, 50 nm thick hole transporting layer was formed by vacuum deposition of N,N'-diphenyl-N-N-bis(1-naphthyl)-1,1'-biphenyl)-4,4'-diamine [115] was vacuum deposited thereon as a hole transporting layer. Next, 50 nm thick light-emitting layer was formed by vacuum co-deposition of the compound [115] and the compound (2) were co-deposited thereon at a ratio by weight of 1:10. Next, 2-(4-biphenylyl)-5-(4-t-butylphenyl)-1,3,4-oxadiazole [119] was vacuum deposited as an electron transporting layer of 20 nm in thickness. The compound [119] and cesium were co-deposited thereon at a ratio by weight of 10:1. Next, 200 nm thick cathode was formed by vacuum deposition of magnesium-silver alloy. The organic EL device was thus made. When a dc voltage of 10 V was applied to this organic EL device, light emission of 3,890 cd/m² was obtained.

Example 97

On a glass substrate, a film of ITO was formed by sputtering with a sheet resistance of 20 Ω/□, which was used as an anode. On the anode, 50 nm thick hole transporting layer was formed by vacuum deposition of N,N'-diphenyl-N-N-bis(1-naphthyl)-1,1'-biphenyl)-4,4'-diamine [115] was deposited thereon as a hole transporting layer of 50 nm in thickness. The compound (37) was vacuum deposited as a light-emitting layer. Next, 50 nm thick light-emitting layer was formed by vacuum co-deposition of the compound (37) and cesium were co-deposited thereon in a weghit ratio of 10:1. Next, 200 nm thick cathode was formed by vacuum deposition of magnesium-silver alloy. The organic EL device was thus made. When a dc voltage of 10 V was applied to this organic EL device, light emission of 4,750 cd/m² was obtained.

Example 98

On a glass substrate, a film of ITO was formed by sputtering with a sheet resistance of 20 Ω/□, which was used as an anode. The ITO substrate was washed with an alkali solution, and then with isopropyl alcohol. The washed ITO substrate was plated in a $Xe_2$ ultraviolet irradiator. Ultraviolet ray was irradiated on the substrate at 172 nm for 3 minutes. On the anode, 50 nm thick hole transporting layer was formed by vacuum deposition of the compound (19) was vacuum deposited thereon as a light-emitting layer. The compound (19) and cesium were co-deposited thereon at a ratio by weight of 10:1. Subsequently, Next, 200 nm thick cathode was formed by vacuum deposition of magnesium-silver alloy. The organic EL device was thus made. When a dc voltage of 10 V was applied to this organic EL device, light emission of 2,030 $cd/m^2$ was obtained.

In the following Examples 99 to 127, light-emitting layers for organic EL devices were formed by using the compounds (47), (45), and (56), in which a light-emitting layer was made of these compounds alone, or as a mixture with a hole transporting material or with an electron transporting material.

Example 99

On a glass substrate, a film of ITO was formed by sputtering with a sheet resistance of 20 $\Omega/\square$, which was used as an anode. On the anode, 40 nm thick hole transporting layer was formed by vacuum deposition of the compound (47) was vacuum deposited thereon as a light-emitting layer. Next, 200 nm thick cathode was formed by vacuum deposition of magnesium-silver alloy. The organic EL device was thus made. When a dc voltage of 10 V was applied to this organic EL device, light emission of 90 $cd/m^2$ was obtained.

Example 100

An organic EL device of Example 100 of the present invention was fabricated similarly to Example 99 except that the compound (45) was used as the light emitting material. When a dc voltage of 10 V was applied to this organic EL device, light emission of 80 $cd/m^2$ was obtained.

Example 101

An organic EL device of Example 100 of the present invention was fabricated similarly to Example 99 except that the compound (56) was used as the light emitting material. When a dc voltage of 10 V was applied to this organic EL device, light emission of 100 $cd/m^2$ was obtained.

Example 102

On a glass substrate, a film of ITO was formed by sputtering with a sheet resistance of 20 $\Omega/\square$, which was used as an anode. On the anode, 40 nm thick light-emitting layer was formed by spin-coating of the chloroform solution of compound (56). Next, 200 nm thick cathode was formed by vacuum deposition of magnesium-silver alloy. The organic EL device was thus made. When a dc voltage of 10 V was applied to this organic EL device, light emission of 60 $cd/m^2$ was obtained.

Example 103

On a glass substrate, a film of ITO was formed by sputtering with a sheet resistance of 20 $\Omega/\square$, which was used as an anode. On the anode, 40 nm thick hole transporting layer was formed by vacuum deposition of N,N'-diphenyl-N,N'-bis(3-methylphenyl)-[1,1'-biphenyl]-4,4'-diamine [114] was vacuum deposited thereon as a hole transmitting layer. Next, the compound (47) was vacuum deposited thereon as a light-emitting layer. Subsequently, 20 nm thick light-emitting layer was formed by vacuum deposition of the 2-(4-biphenylyl)-5-(4-t-butylphenyl)-1,3,4-oxadiazole [119] was vacuum deposited thereon as an electron transporting layer. Next, 200 nm thick cathode was formed by vacuum deposition of magnesium-silver alloy. The organic EL device was thus made. When a dc voltage of 10 V was applied to this organic EL device, light emission of 3,060 $cd/m^2$ was obtained.

Example 104

An organic EL device of Example 104 of the present invention was fabricated similarly to Example 103 except that the compound (45) was used as the light emitting material. When a dc voltage of 10 V was applied to this organic EL device, light emission of 2,570 $cd/m^2$ was obtained.

Example 105

An organic EL device of Example 105 of the present invention was fabricated similarly to Example 103 except that the compound (56) was used as the light emitting material. When a dc voltage of 10 V was applied to this organic EL device, light emission of 3,960 $cd/m^2$ was obtained.

Example 106

An organic EL device of Example 106 of the present invention was fabricated, similarly to Example 103 except that N,N'-diphenyl-N-N-bis(1-naphthyl)-1,1'-biphenyl)-4,4'-diamine [115] was used for the hole transporting layer and bis{2-(4-t-butylphenyl)-1,3,4-oxadiazole}-m-phenylene [120] was used for the electron transporting layer. When a dc voltage of 10 V was applied to this organic EL device, light emission of 3,330 $cd/m^2$ was obtained.

Example 107

An organic EL device of Example 107 of the present invention was fabricated similarly to Example 103 except that the compound [116], the compound (47), and the compound [123] were used for the hole transporting layer, the light-emitting layer, and the electron transporting layer, respectively, to make an organic EL device. When a dc voltage of 10 V was applied to this organic EL device, light emission of 3,730 $cd/m^2$ was obtained.

Example 108

An organic EL device of Example 108 of the present invention was fabricated similarly to Example 103 except that the compound [117], the compound (56), and the compound [124] were used for the hole transporting layer, the light-emitting layer, and the electron transporting layer, respectively, to make an organic EL device. When a dc voltage of 10 V was applied to this organic EL device, light emission of 4,260 $cd/m^2$ was obtained.

Example 109

On a glass substrate, a film of ITO was formed by sputtering with a sheet resistance of 20 $\Omega/\square$, which was used as an anode. On the anode, 40 nm thick hole transporting layer was formed by vacuum deposition of the compound [115] was vacuum deposited thereon as a hole transmitting layer. Next, 50 nm thick light-emitting layer was formed by vacuum co-deposition of the compound

[115] and the compound (47) were co-deposited thereon at a ratio by weight of 1:10. Subsequently, 20 nm thick electron transporting layer was formed by vacuum deposition of 2-(4-biphenylyl)-5-(4-t-butylphenyl)-1,3,4-oxadiazole [117] was vacuum deposited thereon as an electron transporting layer. Next, 200 nm thick cathode was formed by vacuum deposition of magnesium-silver alloy. The organic EL device was thus made. When a dc voltage of 10 V was applied to this organic EL device, light emission of 3,280 cd/m$^2$ was obtained.

Example 110

An organic EL device of Example 110 of the present invention was fabricated similarly to Example 109 except that the compound (56) was used in place of the compound (47). When a dc voltage of 10 V was applied to this organic EL device, light emission of 3,920 cd/m$^2$ was obtained.

Example 111

On a glass substrate, a film of ITO was formed by sputtering with a sheet resistance of 20 Ω/□, which was used as an anode. On the anode, 50 nm thick light-emitting layer was formed by vacuum deposition of N,N'-diphenyl-N-N-bis(1-naphthyl)-1,1'-biphenyl)-4,4'-diamine [115] and the compound (47) were co-deposited thereon at a ratio by weight of 1:10. Subsequently, 50 nm thick electron transporting layer was formed by vacuum deposition of the compound [121] was vacuum deposited thereon as an electron transporting layer. Next, 200 nm thick cathode was formed by vacuum deposition of magnesium-silver alloy. The organic EL device was thus made. When a dc voltage of 10 V was applied to this organic EL device, light emission of 3,550 cd/m$^2$ was obtained.

Example 112

An organic EL device of Example 112 of the present invention was fabricated similarly to Example 111 except that the compound (56) was used in place of the compound (47). When a dc voltage of 10 V was applied to this organic EL device, light emission of 3,600 cd/m$^2$ was obtained.

Example 113

On a glass substrate, a film of ITO was formed by sputtering with a sheet resistance of 20 Ω/□, which was used as an anode. On the anode, 40 nm thick light-emitting layer was formed by vacuum deposition spin-coating of a chloroform solution containing the compound (12) and N,N'-diphenyl-N-N-bis(1-naphthyl)-1,1'-biphenyl)-4,4'-diamine [115] at a ratio by mole of 1:10 was spin-coated on the anode as a light-emitting layer. The compound [122] was then vacuum deposited thereon as an electron transporting layer of 50 nm in thickness. Next, 200 nm thick cathode was formed by vacuum deposition of magnesium-silver alloy. The organic EL device was thus made. When a dc voltage of 10 V was applied to this organic EL device, light emission of 1,470 cd/m$^2$ was obtained.

Example 114

On a glass substrate, a film of ITO was formed by sputtering with a sheet resistance of 20 Ω/□, which was used as an anode. On the anode, 50 nm thick light-emitting layer was formed by vacuum deposition of N,N'-diphenyl-N-N-bis(1-naphthyl)-1,1'-biphenyl)-4,4'-diamine [115] was vacuum deposited thereon as a hole transporting layer. Next, 50 nm thick light-emitting layer was formed by vacuum deposition of the compound [123] and the compound (45) in a ratio weight ratio of 20:1. Next, 200 nm thick cathode was formed by vacuum deposition of magnesium-silver alloy. The organic EL device was thus made. When a dc voltage of 10 V was applied to this organic EL device, light emission of 2,030 cd/m$^2$ was obtained.

Example 115

An organic EL device of Example 115 of the present invention was fabricated similarly to Example 114 except that the compound [123] and the compound (47) were vacuum co-deposited in a ratio weight of 20:1 as a light-emitting layer of 50 nm in thickness, thereby making an organic EL device. When a dc voltage of 10 V was applied to this organic EL device, light emission of 2,120 cd/m$^2$ was obtained.

Example 116

An organic EL device of Example 116 of the present invention was fabricated similarly to Example 114 except that the compound (56) was used in place of the compound (47) to make an organic EL device. When a dc voltage of 10 V was applied to this organic EL device, light emission of 2,150 cd/m$^2$ was obtained.

Example 117

An organic EL device of Example 117 of the present invention was fabricated similarly to Example 114 except that the compound (47) and the compound [125] were used for the hole transporting layer and the light-emitting layer, respectively, to make an organic EL device. When a dc voltage of 10 V was applied to this organic EL device, light emission of 1,120 cd/m$^2$ was obtained.

Example 118

An organic EL device of Example 118 of the present invention was fabricated similarly to Example 114 except that the compound (56) was used as a hole transporting material. When a dc voltage of 10 V was applied to this organic EL device, light emission of 970 cd/m$^2$ was obtained.

Example 119

An organic EL device of Example 103 of the present invention was fabricated similarly to Example 114 except that N,N'-diphenyl-N-N-bis(1-naphthyl)-1,1'-biphenyl)-4,4'-diamine [115], the compound [125], and the compound (56) were used for the hole transporting layer, the light-emitting layer, and the electron transporting layer, respectively, to make an organic EL device. When a dc voltage of 10 V was applied to this organic EL device, light emission of 800 cd/m$^2$ was obtained.

Example 120

An organic EL device of Example 120 of the present invention was fabricated similarly to Example 119 except that the compound (47) was used for the electron transporting layer. When a dc voltage of 10 V was applied to this organic EL device, light emission of 920 cd/m$^2$ was obtained.

Example 121

An organic EL device of Example 121 of the present invention was fabricated similarly to Example 119 except that the compound (45) was used for the electron transporting layer. When a dc voltage of 10 V was applied to this organic EL device, light emission of 870 cd/m² was obtained.

Example 122

On a glass substrate, a film of ITO was formed by sputtering with a sheet resistance of 20 Ω/□, which was used as an anode. The ITO substrate was washed with an alkali solution, and then with isopropyl alcohol. The washed ITO substrate was plated in a Xe₂ ultraviolet irradiator. Ultraviolet ray was irradiated on the substrate at 172 nm for 3 minutes. Next, 50 nm thick light-emitting layer was formed by vacuum deposition of N,N'-diphenyl-N,N'-bis(3-methylphenyl)-[1,1'-biphenyl]-4,4'-diamine [114] was vacuum deposited thereon as a hole transporting layer.

Then, the compound (47) was vacuum deposited thereon as a light-emitting layer of 40 nm in thickness. Subsequently, 2-(4-biphenylyl)-5-(4-t-butylphenyl)-1,3,4-oxadiazole [119] was vacuum deposited as an electron transporting layer of 20 nm in thickness. Next, 200 nm thick cathode was formed by vacuum deposition of magnesium-silver alloy. The organic EL device was thus made. When a dc voltage of 10 V was applied to this organic EL device, light emission of 3, 620 cd/m² was obtained.

Example 123

On a glass substrate, a film of ITO was formed by sputtering with a sheet resistance of 20 Ω/□, which was used as an anode. The ITO substrate was washed with an alkali solution, and then with isopropyl alcohol. The washed ITO substrate was placed in a Xe2 ultraviolet irradiator. The ITO was exposed to ultraviolet light at 172 nm for 3 minutes.

On the anode, 50 nm thick light-emitting layer was formed by vacuum deposition of N,N'-diphenyl-N-N-bis(1-naphthyl)-1,1'-biphenyl-4,4'-diamine [115] and the compound (47) were co-deposited thereon at a ratio by weight of 1:10. Subsequently, 50 nm thick electron transporting layer was formed by vacuum deposition of the compound [121] was vacuum deposited as an electron transporting layer. Next, 200 nm thick cathode was formed by vacuum deposition of magnesium-silver alloy. The organic EL device was thus made. When a dc voltage of 10 V was applied to this organic EL device, light emission of 3,870 cd/m² was obtained.

Example 124

On a glass substrate, a film of ITO was formed by sputtering with a sheet resistance of 20 Ω/□, which was used as an anode. The ITO substrate was washed with an alkali solution, and then with isopropyl alcohol. The washed ITO substrate was placed in a Xe2 ultraviolet irradiator. The ITO was exposed to ultraviolet light at 172 nm for 3 minutes.

On the anode, 50 nm thick light-emitting layer was formed by vacuum deposition of the compound (47) was vacuum deposited thereon as a light-emitting layer. Subsequently, 50 nm thick electron transporting layer was formed by vacuum deposition of the compound [121] was vacuum deposited as an electron transporting layer. Next, 200 nm thick cathode was formed by vacuum deposition of magnesium-silver alloy. The organic EL device was thus made. When a dc voltage of 10 V was applied to this organic EL device, light emission of 3,730 cd/m² was obtained.

Example 125

On a glass substrate, a film of ITO was formed by sputtering with a sheet resistance of 20 Ω/□, which was used as an anode. On the anode, 50 nm thick hole-transporting layer was formed by vacuum deposition of the compound [115] Next, 50 nm thick light-emitting layer was formed by vacuum co-deposition of the compound [115] and the compound (47) in a weight ratio of 1:10. Next, 2-(4-biphenylyl)-5-(4-t-butylphenyl)-1,3,4-oxadiazole [119] was vacuum deposited as an electron transporting layer of 20 nm in thickness. Next, 5 nm thick thin film layer was formed by vacuum co-deposition of the compound [119] and cesium in a ratio by weight ratio of 10:1. Next, 200 nm thick cathode was formed by vacuum deposition of magnesium-silver alloy. The organic EL device was thus made. When a dc voltage of 10 V was applied to this organic EL device, light emission of 3,890 cd/m² was obtained.

Example 126

On a glass substrate, a film of ITO was formed by sputtering with a sheet resistance of 20 Ω/□, which was used as an anode. On the anode, 50 nm thick hole transporting layer was formed by vacuum deposition of N,N'-diphenyl-N-N-bis(1-naphthyl)-1,1'-biphenyl)-4,4'-diamine [115]. Next, 50 nm thick light-emitting layer was formed by vacuum deposition of the compound (47). Then, the compound (47) and cesium were co-deposited thereon in a weight ratio of 10:1 to form a thin film of 5 nm in thickness. Next, 200 nm thick cathode was formed by vacuum deposition of magnesium-silver alloy. The organic EL device was thus made. When a dc voltage of 10 V was applied to this organic EL device, light emission of 3,530 cd/m² was obtained.

Example 127

On a glass substrate, a film of ITO was formed by sputtering with a sheet resistance of 20 Ω/□, which was used as an anode. The ITO substrate was washed with an alkali solution, and then with isopropyl alcohol. The washed ITO substrate was placed in a Xe2 ultraviolet irradiator. The ITO was exposed to ultraviolet light at 172 nm for 3 minutes.

The compound (47) was vacuum deposited thereon as a light-emitting layer of 50 nm in thickness. The compound (47) and cesium were co-deposited thereon at a ratio by weight of 10:1 to form a thin film of 5 nm in thickness. Subsequently, Next, 200 nm thick cathode was formed by vacuum deposition of magnesium-silver alloy. The organic EL device was thus made. When a dc voltage of 10 V was applied to this organic EL device, light emission of 2,230 cd/m² was obtained.

Example 128

An organic EL device having the structure shown in FIG. 2 was made. On a glass substrate, a film of ITO was formed by sputtering with a sheet resistance of 20 Ω/□, which was used as an anode. On the anode, 20 nm thick hole-transporting layer was formed by vacuum deposition of the compound (77). The compound [101] was vacuum deposited thereon as a light-emitting layer of 50 nm in thickness. The compound [119] was then vacuum deposited thereon as an electron transporting layer of 20 nm in thickness. Next, 200 nm thick cathode was formed by vacuum deposition of magnesium-silver alloy. The organic EL device was thus made. When a dc voltage of 10 V was applied to this organic EL device, light emission of 7,280 cd/m² was obtained.

Example 129

An organic EL device of Example 129 of the present invention was fabricated similarly to Example 128 except that the compound (78) was used in place of the compound (77). When a dc voltage of 10 V was applied to this organic EL device, light emission of 8,030 cd/m² was obtained.

Example 130

An organic EL device of Example 130 of the present invention was fabricated similarly to Example 128 except that the compound (81) was used in place of the compound (77). When a dc voltage of 10 V was applied to this organic EL device, light emission of 8,320 cd/m² was obtained.

Example 131

An organic EL device of Example 131 of the present invention was fabricated similarly to Example 128 except that the compound (82) was used in place of the compound (77). When a dc voltage of 10 V was applied to this organic EL device, light emission of 8,810 cd/m² was obtained.

Example 132

An organic EL device of Example 132 of the present invention was fabricated similarly to Example 128 except that the compound (84) was used in place of the compound (77). When a dc voltage of 10 V was applied to this organic EL device, light emission of 9,090 cd/m² was obtained.

Example 133

An organic EL device of Example 133 of the present invention was fabricated similarly to Example 128 except that the compound (87) was used in place of the compound (77). When a dc voltage of 10 V was applied to this organic EL device, light emission of 8,630 cd/m² was obtained.

Example 134

An organic EL device of Example 134 of the present invention was fabricated similarly to Example 128 except that the compound (91) was used in place of the compound (77). When a dc voltage of 10 V was applied to this organic EL device, light emission of 9,010 cd/m² was obtained.

Example 135

An organic EL device of Example 135 of the present invention was fabricated similarly to Example 128 except that the compound (92) was used in place of the compound (77). When a dc voltage of 10 V was applied to this organic EL device, light emission of 9,390 cd/m² was obtained.

Example 136

An organic EL device of Example 136 of the present invention was fabricated similarly to Example 128 except that the compound [105] was used as the light emitting material. When a dc voltage of 10 V was applied to this organic EL device, light emission of 7,080 cd/m² was obtained.

Example 137

An organic EL device of Example 137 of the present invention was fabricated similarly to Example 131 except that the compound [105] was used as the light emitting material. When a dc voltage of 10 V was applied to this organic EL device, light emission of 8,020 cd/m² was obtained.

Example 138

An organic EL device of Example 138 of the present invention was fabricated similarly to Example 133 except that the compound [105] was used as the light emitting material. When a dc voltage of 10 V was applied to this organic EL device, light emission of 7,570 cd/m² was obtained.

Example 139

An organic EL device of Example 139 of the present invention was fabricated similarly to Example 135 except that the compound [105] was used as the light emitting material. When a dc voltage of 10 V was applied to this organic EL device, light emission of 8,650 cd/m² was obtained.

Example 140

An organic EL device of Example 140 of the present invention was fabricated similarly to Example 128 except that the compound (78) and the compound [115] were co-deposited in a weight ratio of 1:1 to form a thin film of 50 nm in thickness as a hole transporting layer, providing an organic EL device. When a dc voltage of 10 V was applied to this organic EL device, light emission of 7,300 cd/m² was obtained.

Example 141

An organic EL device of Example 141 of the present invention was fabricated similarly to Example 128 except that the compound (82) and the compound [115] were co-deposited in a weight ratio of 1:1 to form a thin film of 50 nm in thickness as a hole transporting layer, providing an organic EL device. When a dc voltage of 10 V was applied to this organic EL device, light emission of 8,710 cd/m² was obtained.

Example 142

An organic EL device of Example 142 of the present invention was fabricated similarly to Example 139 except that the compound (87) and the compound [115] were co-deposited in a weight ratio of 1:1 to form a thin film of 50 nm in thickness as a hole transporting layer, providing an organic EL device. When a dc voltage of 10 V was applied to this organic EL device, light emission of 7,500 cd/m² was obtained.

Example 143

An organic EL device of Example 142 of the present invention was fabricated similarly to Example 139 except that the compound (91) and the compound [115] were co-deposited in a weight ratio of 1:1 to form a thin film of 50 nm in thickness as a hole transporting layer, providing an organic EL device. When a dc voltage of 10 V was applied to this organic EL device, light emission of 8, 600 cd/m² was obtained.

Example 144

On a glass substrate, a film of ITO was formed by sputtering with a sheet resistance of 20 Ω/□, which was used as an anode. On the anode, 40 nm thick hole-transporting layer was formed by spin-coating of the chloroform solution of compound (84). Next, 50 nm thick light emitting layer was formed by vacuum deposition of the compound [101]. The compound [119] was then vacuum deposited as an electron transporting layer of 20 nm in thickness. Finally, Next, 200 nm thick cathode was formed by vacuum deposition of magnesium-silver alloy. The organic EL device was thus made. When a dc voltage of 10 V was applied to this organic EL device, light emission of 2,310 cd/m² was obtained.

Example 145

An organic EL device having the structure shown in FIG. 3 was made. On a glass substrate, a film of ITO was formed by sputtering with a sheet resistance of 20 Ω/□, which was used as an anode. On the anode, 50 nm thick hole transporting layer was formed by vacuum deposition of the compound (77). The compound [101] was vacuum deposited as a light-emitting layer of 50 nm in thickness. 200 nm thick cathode was formed by vacuum deposition of magnesium-silver alloy. The organic EL device was thus made. When a dc voltage of 10 V was applied to this organic EL device, light emission of 8,040 cd/m² was obtained.

Example 146

An organic EL device of Example 146 of the present invention was fabricated similarly to Example 145 except that the compound (84) was used in place of the compound (77). When a dc voltage of 10 V was applied to this organic EL device, light emission of 8,630 cd/m² was obtained.

Example 147

An organic EL device of Example 147 of the present invention was fabricated similarly to Example 145 except that the compound (92) was used in place of the compound (77). When a dc voltage of 10 V was applied to this organic EL device, light emission of 8,740 cd/m² was obtained.

Example 148

An organic EL device having the structure shown in FIG. 2 was made. On a glass substrate, a film of ITO was formed by sputtering with a sheet resistance of 20 Ω/□, which was used as an anode. On the anode, 40 nm thick light-emitting layer was formed by vacuum deposition of the compound (78). 200 nm thick cathode was formed by vacuum deposition of magnesium-silver alloy. The organic EL device was thus made. When a dc voltage of 10 V was applied to this organic EL device, light emission of 210 cd/m² was obtained.

Example 149

An organic EL device of Example 149 of the present invention was fabricated similarly to Example 148 except that the compound (84) was used as the light emitting material. When a dc voltage of 10 V was applied to this organic EL device, light emission of 190 cd/m² was obtained.

Example 150

An organic EL device of Example 150 of the present invention was fabricated similarly to Example 148 except that the compound (92) was used as the light emitting material. When a dc voltage of 10 V was applied to this organic EL device, light emission of 140 cd/m² was obtained.

Example 151

An organic EL device having the structure shown in FIG. 4 was made. On a glass substrate, a film of ITO was formed by sputtering with a sheet resistance of 20 Ω/□, which was used as an anode. On the anode, 50 nm thick light-emitting layer was formed by vacuum deposition of the compound (77). Subsequently, the compound (77) was vacuum deposited thereon as an electron transporting layer of 50 nm. 200 nm thick cathode was formed by vacuum deposition of magnesium-silver alloy. The organic EL device was thus made. When a dc voltage of 10 V was applied to this organic EL device, light emission of 1,030 cd/m² was obtained.

Example 152

An organic EL device of Example 152 of the present invention was fabricated similarly to Example 151 except that the compound (84) was used as the light emitting material. When a dc voltage of 10 V was applied to this organic EL device, light emission of 1,240 cd/m² was obtained.

Example 153

An organic EL device of Example 153 of the present invention was fabricated similarly to Example 151 except that the compound (92) was used as the light emitting material. When a dc voltage of 10 V was applied to this organic EL device, light emission of 1,160 cd/m² was obtained.

Example 154

An organic EL device of Example 154 of the present invention was fabricated similarly to Example 151 except that the compound (78) and the compound [105] were co-deposited in a weight ratio of 1:1 to form a thin film of 50 nm in thickness as a light-emitting layer, providing an organic EL device. When a dc voltage of 10 V was applied to this organic EL device, light emission of 1,320 cd/m² was obtained.

Example 155

An organic EL device of Example 155 of the present invention was fabricated similarly to Example 151 except that the compound (82) and the compound [105] were co-deposited in a ratio by weight of 1:1 to form a thin film of 50 nm in thickness as a light-emitting layer, providing an organic EL device. When a dc voltage of 10 V was applied to this organic EL device, light emission of 1,290 cd/m² was obtained.

Example 156

An organic EL device of Example 156 of the present invention was fabricated similarly to Example 151 except that the compound (93) and the compound [105] were co-deposited at a ratio by weight of 1:1 to form a thin film of 50 nm in thickness as a light-emitting layer, providing an organic EL device. When a dc voltage of 10 V was applied to this organic EL device, light emission of 1,310 cd/m² was obtained.

Example 157

An organic EL device of Example 158 of the present invention was fabricated similarly to Example 128 except that the compound [116], the compound (84), and the compound [122] were used for the hole transporting layer, the light-emitting layer, and the electron transporting layer, respectively, to make an organic EL device. When a dc voltage of 10 V was applied to this organic EL device, light emission of 3,510 cd/m² was obtained.

Example 158

On a glass substrate, a film of ITO was formed by sputtering with a sheet resistance of 20 Ω/□, which was used as an anode. The ITO substrate was washed with an alkali solution, and then with isopropyl alcohol. The washed ITO substrate was placed in a Xe2 ultraviolet irradiator. The ITO was exposed to ultraviolet light at 172 nm for 3 minutes. The compound (78) was vacuum deposited on the substrate as a hole transporting layer of 50 nm in thickness. Then, the compound [105] was vacuum deposited thereon as a light-emitting layer of 40 nm in thickness. The compound [119] was vacuum deposited as an electron transporting layer of 20 nm in thickness. 200 nm thick cathode was formed by vacuum deposition of magnesium-silver alloy. The organic EL device was thus made. When a dc voltage of 10 V was applied to this organic EL device, light emission of 8,890 cd/m$^2$ was obtained.

Example 159

An organic EL device of Example 159 of the present invention was fabricated similarly to Example 158 except that the compound (82) was used in place of the compound (78) to make an organic EL device. When a dc voltage of 10 V was applied to this organic EL device, light emission of 9,210 cd/m$^2$ was obtained.

Example 160

An organic EL device of Example 160 of the present invention was fabricated similarly to Example 158 except that the compound (91) was used in place of the compound (78) to make an organic EL device. When a dc voltage of 10 V was applied to this organic EL device, light emission of 9,150 cd/m$^2$ was obtained.

Example 161

On a glass substrate, a film of ITO was formed by sputtering with a sheet resistance of 20 Ω/□, which was used as an anode. The ITO substrate was washed with an alkali solution, and then with isopropyl alcohol. The washed ITO substrate was placed in a Xe2 ultraviolet irradiator. The ITO was exposed to ultraviolet light at 172 nm for 3 minutes. The compound (78) was vacuum deposited thereon as a light-emitting layer of 50 nm in thickness. The compound [122] was vacuum deposited as an electron transporting layer of 50 nm in thickness. 200 nm thick cathode was formed by vacuum deposition of magnesium-silver alloy. The organic EL device was thus made. When a dc voltage of 10 V was applied to this organic EL device, light emission of 3,170 cd/m$^2$ was obtained.

Example 162

An organic EL device of Example 162 of the present invention was fabricated similarly to Example 161 except that the compound (82) was used in place of the compound (78) to make an organic EL device. When a dc voltage of 10 V was applied to this organic EL device, light emission of 3,210 cd/m$^2$ was obtained.

Example 163

An organic EL device of Example 159 of the present invention was fabricated similarly to Example 161 except that the compound (92) was used in place of the compound (78) to make an organic EL device. When a dc voltage of 10 V was applied to this organic EL device, light emission of 3,150 cd/m$^2$ was obtained.

Example 164

On a glass substrate, a film of ITO was formed by sputtering with a sheet resistance of 20 Ω/□, which was used as an anode. On the anode, 50 nm thick hole transporting layer was formed by vacuum deposition of the compound (77). The compound [105] was vacuum deposited thereon as a light-emitting layer of 50 nm in thickness. Then, the compound [119] was vacuum deposited as an electron transporting layer of 20 nm in thickness. The compound [119] and cesium were co-deposited in a wight retio of 10:1 to form a thin film of 5 nm in thickness. 200 nm thick cathode was formed by vacuum deposition of magnesium-silver alloy. The organic EL device was thus made. When a dc voltage of 10 V was applied to this organic EL device, light emission of 8,930 cd/m$^2$ was obtained.

Example 165

An organic EL device of Example 165 of the present invention was fabricated similarly to Example 164 except that the compound (81) was used in place of the compound (77). When a dc voltage of 10 V was applied to this organic EL device, light emission of 8,930 cd/m$^2$ was obtained.

Example 166

An organic EL device of Example 166 of the present invention was fabricated similarly to Example 164 except that the compound (81) was used in place of the compound (77). When a dc voltage of 10 V was applied to this organic EL device, light emission of 9,150 cd/m$^2$ was obtained.

Example 167

On a glass substrate, a film of ITO was formed by sputtering with a sheet resistance of 20 Ω/□, which was used as an anode. The ITO substrate was washed with an alkali solution, and then with isopropyl alcohol. The washed ITO substrate was placed in a Xe2 ultraviolet irradiator. The ITO was exposed to ultraviolet light at 172 nm for 3 minutes. The compound (78) was vacuum deposited thereon as a light-emitting layer of 50 nm in thickness. The compound (78) and cesium were co-deposited in a wight retio of 10:1 to form a thin film of 5 nm in thickness. 200 nm thick cathode was formed by vacuum deposition of magnesium-silver alloy. The organic EL device was thus made. When a dc voltage of 10 V was applied to this organic EL device, light emission of 1,750 cd/m$^2$ was obtained.

Example 168

An organic EL device of Example 168 of the present invention was fabricated similarly to Example 167 except that the compound (84) was used in place of the compound (78). When a dc voltage of 10 V was applied to this organic EL device, light emission of 1,120 cd/m$^2$ was obtained.

Example 169

An organic EL device of Example 169 of the present invention was fabricated similarly to Example 167 except that the compound (92) was used in place of the compound (78). When a dc voltage of 10 V was applied to this organic EL device, light emission of 1,090 cd/m$^2$ was obtained.

Example 170

An organic EL device of Example 170 of the present invention was fabricated similarly to Example 128 except that the compound (98) was used in place of the compound (77) to make an organic EL device. When a dc voltage of 10 V was applied to this organic EL device, light emission of 8,430 cd/m$^2$ was obtained.

Example 171

An organic EL device of Example 171 of the present invention was fabricated similarly to Example 128 except that the compound (99) was used in place of the compound (77) to make an organic EL device. When a dc voltage of 10 V was applied to this organic EL device, light emission of 8,610 cd/m² was obtained.

Example 172

An organic EL device of Example 172 of the present invention was fabricated similarly to Example 136 except that the compound (98) was used in place of the compound (77) to make an organic EL device. When a dc voltage of 10 V was applied to this organic EL device, light emission of 7,900 cd/m² was obtained.

Example 173

An organic EL device of Example 173 of the present invention was fabricated similarly to Example 136 except that the compound (99) was used in place of the compound (77) to make an organic EL device. When a dc voltage of 10 V was applied to this organic EL device, light emission of 8,010 cd/m² was obtained.

Example 174

An organic EL device of Example 174 of the present invention was fabricated similarly to Example 140 except that the compound (98) was used in place of the compound (78). When a dc voltage of 10 V was applied to this organic EL device, light emission of 7,250 cd/m² was obtained.

Example 175

An organic EL device of Example 175 of the present invention was fabricated similarly to Example 140 except that the compound (99) was used in place of the compound (78). When a dc voltage of 10 V was applied to this organic EL device, light emission of 7,370 cd/m² was obtained.

Example 176

An organic EL device of Example 176 of the present invention was fabricated similarly to Example 145 except that the compound (98) was used in place of the compound (77) to make an organic EL device. When a dc voltage of 10 V was applied to this organic EL device, light emission of 7,920 cd/m² was obtained.

Example 177

An organic EL device of Example 177 of the present invention was fabricated similarly to Example 145 except that the compound (99) was used in place of the compound (77). When a dc voltage of 10 V was applied to this organic EL device, light emission of 8,040 cd/m² was obtained.

Example 178

An organic EL device of Example 178 of the present invention was fabricated similarly to Example 148 except that the compound (98) was used in place of the compound (77). A direct voltage of 5 V was applied to this device, and luminescence of 120 cd/m² was obtained.

Example 179

An organic EL device of Example 179 of the present invention was fabricated similarly to Example 148 except that the compound (99) was used in place of the compound (77). A direct voltage of 5 V was applied to this device, and luminescence of 130 cd/m² was obtained.

Example 180

An organic EL device of Example 180 of the present invention was fabricated similarly to Example 151 except that the compound (98) was used in place of the compound (77) to make an organic EL device. A direct voltage of 9 V was applied to this device, and luminescence of 880 cd/m² was obtained.

Example 181

An organic EL device of Example 181 of the present invention was fabricated similarly to Example 151 except that the compound (99) was used in place of the compound (77) to make an organic EL device. A direct voltage of 9 V was applied to this device, and luminescence of 940 cd/m² was obtained.

Example 182

An organic EL device of Example 182 of the present invention was fabricated similarly to Example 158 except that the compound (98) was used in place of the compound (78). When a dc voltage of 10 V was applied to this organic EL device, light emission of 8,820 cd/m² was obtained.

Example 183

An organic EL device of Example 183 of the present invention was fabricated similarly to Example 158 except that the compound (99) was used in place of the compound (78) to make an organic EL device. When a dc voltage of 10 V was applied to this organic EL device, light emission of 8,960 cd/m² was obtained.

Example 184

An organic EL device of Example 184 of the present invention was fabricated similarly to Example 161 except that the compound (98) was used in place of the compound (78). When a dc voltage of 10 V was applied to this organic EL device, light emission of 3,070 cd/m² was obtained.

Example 185

An organic EL device of Example 185 of the present invention was fabricated similarly to Example 161 except that the compound (99) was used in place of the compound (78) to make an organic EL device. When a dc voltage of 10 V was applied to this organic EL device, light emission of 3,200 cd/m² was obtained.

Example 186

An organic EL device of Example 186 of the present invention was fabricated similarly to Example 164 except that the compound (98) was used in place of the compound (77). When a dc voltage of 10 V was applied to this organic EL device, light emission of 8,660 cd/m² was obtained.

Example 187

An organic EL device of Example 187 of the present invention was fabricated similarly to Example 164 except that the compound (99) was used in place of the compound (77). When a dc voltage of 10 V was applied to this organic EL device, light emission of 8,750 cd/m² was obtained.

Example 188

An organic EL device of Example 188 of the present invention was fabricated similarly to Example 167 except that the compound (98) was used in place of the compound (78). When a dc voltage of 10 V was applied to this organic EL device, light emission of 1,550 cd/m² was obtained.

Example 189

An organic EL device of Example 189 of the present invention was fabricated similarly to Example 167 except that the compound (99) was used in place of the compound (78). When a dc voltage of 10 V was applied to this organic EL device, light emission of 1,620 cd/m² was obtained.

As apparent from the above Examples 1 to 189, an organic EL device using the compounds of the present invention has good light-emitting properties such as high luminance, and there is no limitations on the film deposition method, when such compounds are used in at least one of the organic thin film layers of the device.

What is claimed is:

1. An organic electroluminescent device comprising:
   an anode;
   a cathode; and
   one or more organic thin film layers including a light-emitting layer sandwiched between said anode and said cathode,
   wherein at least one of said organic thin film layers contains, either singly or as a mixture, a compound represented by the following general formula [A]:

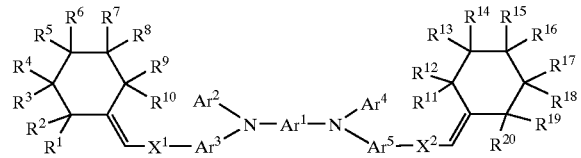

[A]

wherein $Ar^1$ represents a substituted or unsubstituted aromatic hydrocarbon group having 5 to 42 carbon atoms, or a substituted or unsubstituted aromatic heterocyclic group having 4 to 42 carbon atoms;

each of $Ar^2$ to $Ar^5$ independently represents a substituted or unsubstituted aromatic hydrocarbon group having 6 to 20 carbon atoms, or a substituted or unsubstituted aromatic heterocyclic group having 6 to 20 carbon atoms;

each of $X^1$ and $X^2$ independently represents a divalent linking group; and each of $R^1$ to $R^{20}$ independently represents a hydrogen atom, a halogen atom, a substituted or unsubstituted amino group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, or a substituted or unsubstituted alkoxycarbonyl group; any two of $R^1$ to $R^{10}$ and $R^{11}$ to $R^{20}$ may form a ring; $Ar^2$ and $Ar^3$ or $Ar^4$ and $Ar^5$ may be bonded to each other to form a ring.

2. The organic electroluminescent device as claimed in claim 1, wherein at least one of the linking groups represented by $X^1$ and $X^2$ is a substituted or unsubstituted styryl group.

3. The organic electroluminescent device as claimed in claim 1, wherein said organic thin film layers further comprise an electron transporting layer containing the compound (s) represented by the general formula [A] either singly or as a mixture.

4. The organic electroluminescent device as claimed in claim 1, wherein said organic thin film layers further comprise an hole transporting layer containing the compound(s) represented by the general formula [A] either singly or as a mixture.

5. An organic electroluminescent device comprising:
   an anode;
   a cathode; and
   one or more organic thin film layers including a light-emitting layer sandwiched between said anode and said cathode,
   wherein at least one of said organic thin film layers contains, either singly or as a mixture, a compound represented by the following general formula [B]:

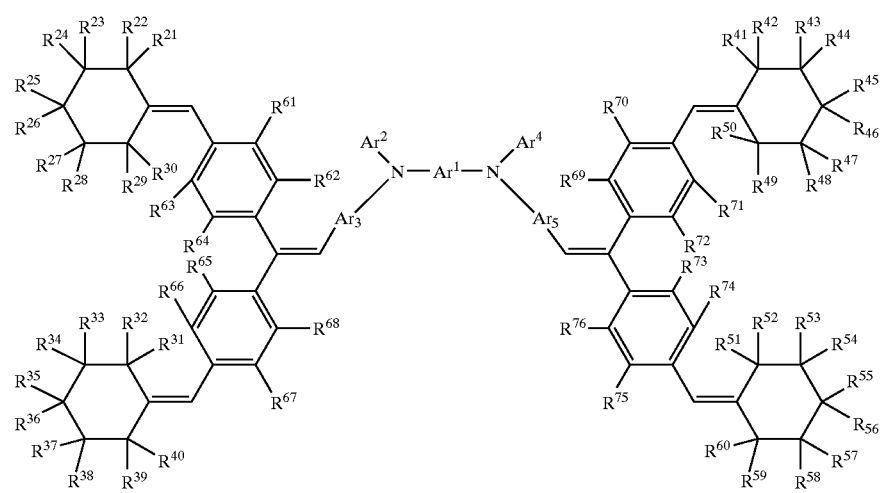

[B]

wherein

Ar$^1$ represents a substituted or unsubstituted aromatic hydrocarbon group having 5 to 42 carbon atoms, or a substituted or unsubstituted aromatic heterocyclic group having 4 to 42 carbon atoms;

each of Ar$^2$ to Ar$^5$ independently represents a substituted or unsubstituted aromatic hydrocarbon group having 6 to 20 carbon atoms, or a substituted or unsubstituted aromatic heterocyclic group having 6 to 20 carbon atoms; and

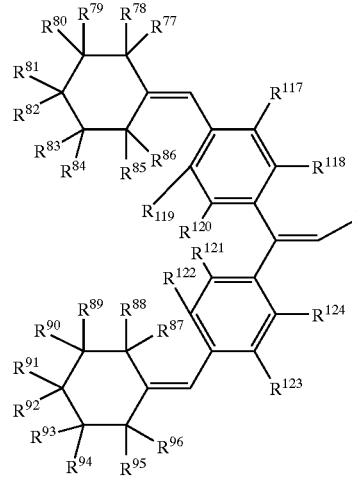

each of R$^{21}$ to R$^{76}$ independently represents a hydrogen atom, a halogen atom, a substituted or unsubstituted amino group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, or a substituted or unsubstituted alkoxycarbonyl group; any two of R$^{21}$ to R$^{30}$, R$^{31}$ to R$^{40}$, R$^{41}$ to R$^{50}$, R$^{51}$ to R$^{60}$, and R$^{61}$ to R$^{76}$ may form a ring; and that Ar$^2$ and Ar$^3$ or Ar$^4$ and Ar$^5$ may be bonded to each other to form a ring.

6. The organic electroluminescent device as claimed in claim 5, wherein said organic thin film layers further comprise an electron transporting layer containing the compound (s) represented by the general formula [B] either singly or as a mixture.

7. The organic electroluminescent device as claimed in claim 5, wherein said organic thin film layers further comprise an hole transporting layer containing the compound(s) represented by the general formula [B] either singly or as a mixture.

8. An organic electroluminescent device comprising:

an anode;

a cathode; and one or more organic thin film layers including a light-emitting layer sandwiched between said anode and said cathode, wherein at least one of said organic thin film layers contains, either singly or as a mixture a compound represented by the following general formula [C]:

[Chemical Formula C]

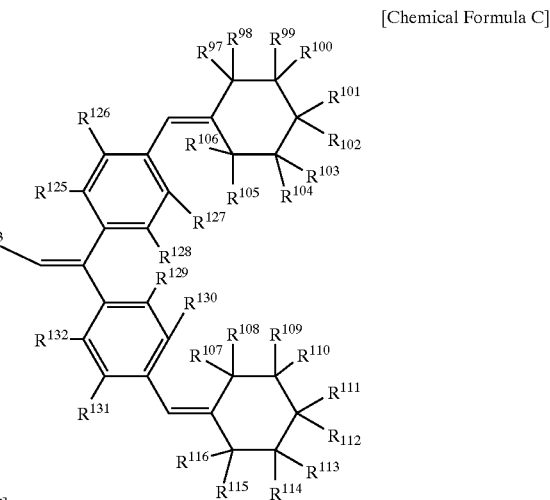

[C]

wherein each of R$^{77}$ to R$^{116}$ independently represents a hydrogen atom, a halogen atom, a substituted or unsubstituted amino group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, or a substituted or unsubstituted alkoxycarbonyl group; any two of R$^{77}$ to R$^{86}$, R$^{87}$ to R$^{96}$, R$^{97}$ to R$^{106}$ and R$^{107}$ to R$^{116}$ may form a ring;

each of R$^{117}$ to R$^{132}$ independently represents a hydrogen atom, a halogen atom, a hydroxyl group, a substituted or unsubstituted amino group, intro group, cyano group, a substituted or unsubstituted alkyl group, a substituted or unsubstituted alkenyl group, a substituted or unsubstituted styryl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, a substituted or unsubstituted alkoxycarbonyl group, or carboxyl group; any two of R$^{117}$ to R$^{132}$ may form a ring; and X$^3$ represents a divalent linking group.

9. The organic electroluminescent device as claimed in claim 8, wherein said organic thin film layers further comprise an electron transporting layer containing the compound (s) represented by the general formula [C] either singly or as a mixture.

10. The organic electroluminescent device as claimed in claim 8, wherein said organic thin film layers further comprise an hole transporting layer containing the compound(s) represented by the general formula [C] either singly or as a mixture.

11. An organic electroluminescent device comprising:
an anode;
a cathode; and
one or more organic thin film layers including a light-emitting layer sandwiched between said anode and said cathode,
wherein at least one of said organic thin film layers contains, either singly or as a mixture, a compound represented by the following general formula [D]:

[Chemical Formula D]

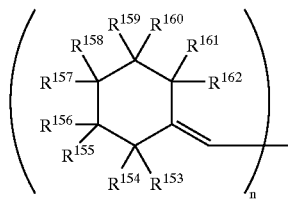
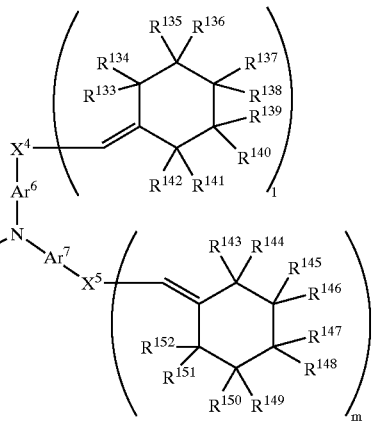

[D]

wherein
each of $Ar^6$ to $Ar^8$ independently represents a substituted or unsubstituted aromatic hydrocarbon group having 5 to 42 carbon atoms, or a substituted or unsubstituted aromatic heterocyclic group having 4 to 42 carbon atoms; $Ar^6$ to $Ar^8$ may be bonded to each other to form a ring;
each of $X^4$ and $X^6$ independently represents a divalent linking group;
each of $R^{133}$ to $R^{162}$ independently represents a hydrogen atom, a halogen atom, a substituted or unsubstituted alkyl group, a substituted or unsubstituted alkenyl group, or a substituted or unsubstituted alkoxy group; any two of $R^{133}$ to $R^{142}$, $R^{143}$ to $R^{152}$ and $R^{153}$ to $R^{162}$ may form a ring;
l, m and n are each independently 0 or 1; and
l plus m plus n is an integer between 1 and 3, both inclusive.

12. The organic electroluminescent device as claimed in claim 11, wherein said organic thin film layers further comprise an electron transporting layer containing the compound(s) represented by the general formula [D] either singly or as a mixture.

13. The organic electroluminescent device as claimed in claim 11, wherein said organic thin film layers further comprise an hole transporting layer containing the compound(s) represented by the general formula [D] either singly or as a mixture.

14. An organic electroluminescent device comprising:
an anode;
a cathode; and
one or more organic thin film layers including a light-emitting layer sandwiched between said anode and said cathode,
wherein at least one of said organic thin film layers contains, either singly or as a mixture, a compound represented by the following general formula [E]:

[Chemical Formula E]

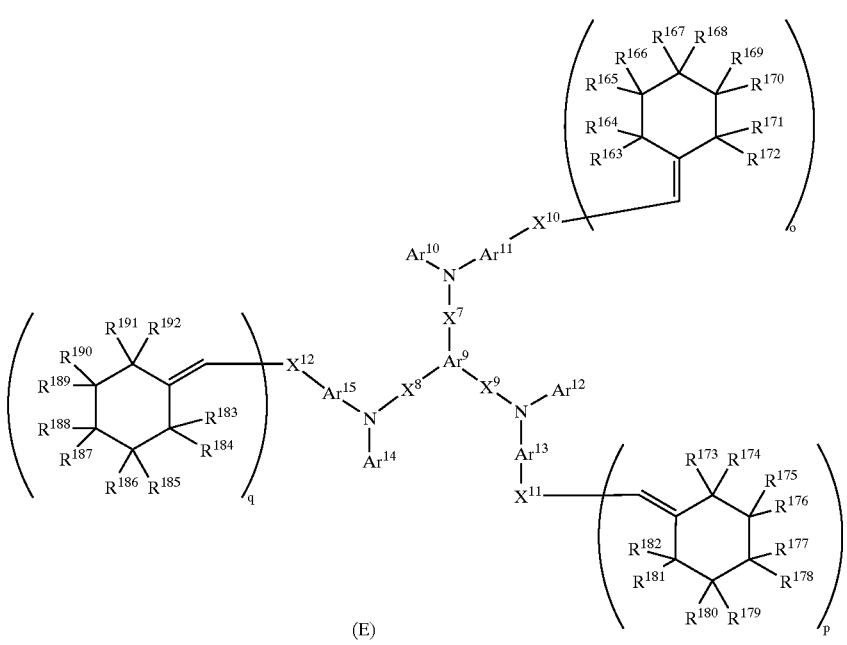

(E)

wherein each of $Ar^9$ to $Ar^{15}$ independently represents a substituted or unsubstituted aromatic hydrocarbon group having 5 to 42 carbon atoms, or a substituted or unsubstituted aromatic heterocyclic group having 4 to 42 carbon atoms; $Ar^{10}$ and $Ar^{11}$, $Ar^{12}$ and $Ar^{13}$, and $Ar^{14}$ and $Ar^{15}$ maybe bonded to each other to form a ring;

each of $X^7$ and $X^{12}$ independently represents a divalent linking group;

each of $R^{163}$ to $R^{192}$ independently represents a hydrogen atom, a halogen atom, a substituted or unsubstituted alkyl group, a substituted or unsubstituted alkenyl group, or a substituted or unsubstituted alkoxy group; any two of $R^{163}$ to $R^{172}$, $R^{173}$ to $R^{182}$ and $R^{183}$ to $R^{192}$ may form a ring;

o, p and q are each independently 0 or 1; and o plus p plus q is an integer between 1 and 3, both inclusive.

15. The organic electroluminescent device as claimed in claim 14, wherein said organic thin film layers further comprise an electron transporting layer containing the compound(s) represented by the general formula [E] either singly or as a mixture.

16. The organic electroluminescent device as claimed in claim 14, wherein said organic thin film layers further comprise an hole transporting layer containing the compound(s) represented by the general formula [E] either singly or as a mixture.

17. An organic electroluminescent device comprising:

an anode;

a cathode; and one or more organic thin film layers including a light-emitting layer sandwiched between said anode and said cathode, wherein at least one of said organic thin film layers contains, either singly or as a mixture, a compound represented by the following general formula [F]:

[Chemical Formula F]

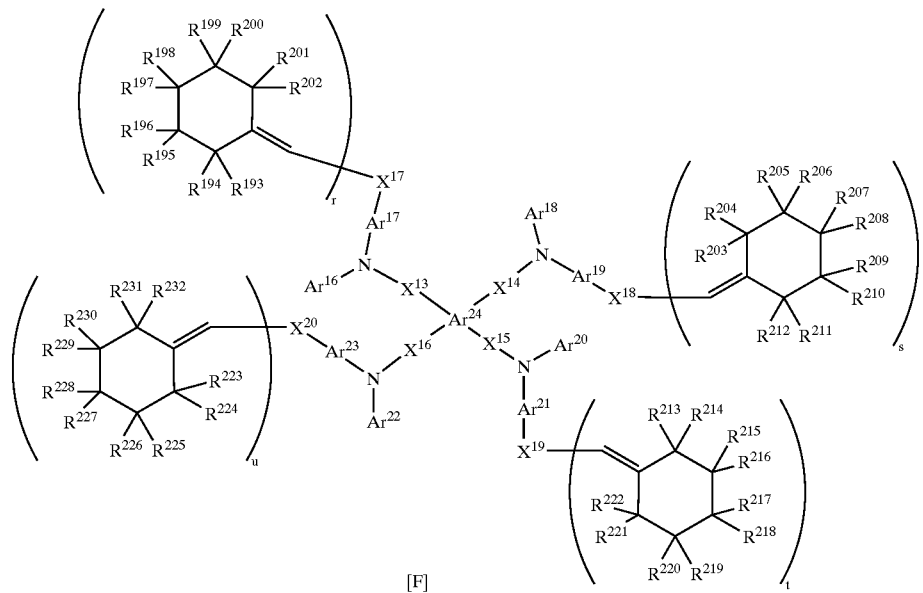

[F]

wherein each of $Ar^{16}$ to $Ar^{24}$ independently represents a substituted or unsubstituted aromatic hydrocarbon group having 5 to 42 carbon atoms, or a substituted or unsubstituted aromatic heterocyclic group having 4 to 42 carbon atoms; $Ar^{16}$ and $Ar^{17}$, $Ar^{18}$ and $Ar^{19}$, $Ar^{20}$ and $Ar^{21}$, and $Ar^{22}$ and $Ar^{23}$ may be bonded to each other to form a ring;

each of $X^{13}$ and $X^{20}$ independently represents a divalent linking group;

each of $R^{193}$ to $R^{232}$ independently represents a hydrogen atom, a halogen atom, a substituted or unsubstituted alkyl group, a substituted or unsubstituted alkenyl group, or a substituted or unsubstituted alkoxy group; any two of $R^{193}$ to $R^{202}$, $R^{203}$ to $R^{212}$, $R^{213}$ to $R^{222}$ and $R^{223}$ to $R^{232}$ may form a ring;

r, s, t and u are each independently 0 or 1; and r plus s plus t plus u is an integer between 1 and 4, both inclusive.

18. The organic electroluminescent device as claimed in claim 17, wherein said organic thin film layers further comprise an electron transporting layer containing the compound(s) represented by the general formula [F] either singly or as a mixture.

19. The organic electroluminescent device as claimed in claim 17, wherein said organic thin film layers further comprise an hole transporting layer containing the compound(s) represented by the general formula [F] either singly or as a mixture.

\* \* \* \* \*

UNITED STATES PATENT AND TRADEMARK OFFICE
CERTIFICATE OF CORRECTION

PATENT NO. : 6,746,784 B2
DATED : June 8, 2004
INVENTOR(S) : Satoru Toguchi et al.

It is certified that error appears in the above-identified patent and that said Letters Patent is hereby corrected as shown below:

<u>Column 150,</u>
Line 50, delete the word "intro" and insert the word -- nitro --.

<u>Column 153,</u>
Line 31, delete the word "maybe" and insert -- may be --.

Signed and Sealed this

Twenty-seventh Day of July, 2004

JON W. DUDAS
*Acting Director of the United States Patent and Trademark Office*